(12) United States Patent
Sakano et al.

(10) Patent No.: US 10,306,166 B2
(45) Date of Patent: *May 28, 2019

(54) SOLID-STATE IMAGING DEVICE, MANUFACTURING METHOD THEREOF, CAMERA, AND ELECTRONIC DEVICE

(71) Applicant: Sony Corporation, Tokyo (JP)

(72) Inventors: Yorito Sakano, Kanagawa (JP); Takashi Abe, Kanagawa (JP); Keiji Mabuchi, Kanagawa (JP); Ryoji Suzuki, Kanagawa (JP); Hiroyuki Mori, Kanagawa (JP); Yoshiharu Kudoh, Kanagawa (JP); Fumihiko Koga, Kanagawa (JP); Takeshi Yanagita, Tokyo (JP); Kazunobu Ota, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/585,503

(22) Filed: May 3, 2017

(65) Prior Publication Data

US 2017/0237916 A1    Aug. 17, 2017

Related U.S. Application Data

(60) Continuation of application No. 14/492,335, filed on Sep. 22, 2014, now Pat. No. 9,661,194, which is a (Continued)

(30) Foreign Application Priority Data

Oct. 30, 2009   (JP) .................................. 2009-250318
Nov. 17, 2009   (JP) .................................. 2009-262223

(51) Int. Cl.
*H04N 5/217*   (2011.01)
*H01L 27/146*   (2006.01)
(Continued)

(52) U.S. Cl.
CPC ....... *H04N 5/361* (2013.01); *H01L 27/14609* (2013.01); *H01L 27/14612* (2013.01);
(Continued)

(58) Field of Classification Search
CPC ............ H01L 27/146; H01L 27/14609; H01L 27/14612; H01L 27/14614;
(Continued)

(56) References Cited

U.S. PATENT DOCUMENTS 6,107,655 A * 8/2000 Guidash ............ H01L 27/14603
257/233
2008/0218608 A1 * 9/2008 Rossi ................ H01L 27/14609
348/243

* cited by examiner

*Primary Examiner* — Lin Ye
*Assistant Examiner* — Chriss S Yoder, III
(74) *Attorney, Agent, or Firm* — Sheridan Ross P.C.

(57) ABSTRACT

A solid-state imaging device is provided, which includes a photodiode having a first conductivity type semiconductor area that is dividedly formed for each pixel; a first conductivity type transfer gate electrode formed on the semiconductor substrate via a gate insulating layer in an area neighboring the photodiode, and transmitting signal charges generated and accumulated in the photodiode; a signal reading unit reading a voltage which corresponds to the signal charge or the signal charge; and an inversion layer induction electrode formed on the semiconductor substrate via the gate insulating layer in an area covering a portion or the whole of the photodiode, and composed of a conductor or a semiconductor having a work function. An inversion layer is induced, which is formed by accumulating a second conductivity type carrier on a surface of the inversion layer induction electrode side of the semiconductor area through the inversion layer induction electrode.

20 Claims, 61 Drawing Sheets

Related U.S. Application Data division of application No. 12/910,068, filed on Oct. 22, 2010, now Pat. No. 8,872,953.

(51) Int. Cl.
  *H04N 5/361* (2011.01)
  *H04N 5/3745* (2011.01)
  *H04N 5/374* (2011.01)
  *H04N 5/378* (2011.01)

(52) U.S. Cl.
  CPC .. *H01L 27/14614* (2013.01); *H01L 27/14623* (2013.01); *H01L 27/14636* (2013.01); *H01L 27/14641* (2013.01); *H01L 27/14643* (2013.01); *H01L 27/14689* (2013.01); *H04N 5/2176* (2013.01); *H04N 5/374* (2013.01); *H04N 5/378* (2013.01); *H04N 5/37457* (2013.01)

(58) Field of Classification Search
  CPC ......... H01L 27/14616; H01L 27/14623; H01L 27/14643; H04N 5/2176; H04N 5/361
  See application file for complete search history.

SOLID-STATE IMAGING DEVICE, MANUFACTURING METHOD THEREOF, CAMERA, AND ELECTRONIC DEVICE

CROSS-REFERENCE TO RELATED APPLICATIONS

This application is a continuation of U.S. patent application Ser. No. 14/492,335, filed Sep. 22, 2014, now U.S. Pat. No. 9,661,194, which is a division of U.S. patent application Ser. No. 12/910,068, filed Oct. 22, 2010, now U.S. Pat. No. 8,872,953, which claims priority to Japanese Patent Application Serial Nos. JP 2009-250318 and JP 2009-262223, filed in the Japan Patent Office on Oct. 30, 2009 and Nov. 17, 2009, respectively, the entire disclosures of which are hereby incorporated herein by reference.

BACKGROUND OF THE INVENTION

1. Field of the Invention

The present invention relates to a solid-state imaging device, a manufacturing method thereof, and a camera. In particular, the present invention relates to a solid-state imaging device in which pixels having photodiodes are arranged on a light sensing surface in the form of a matrix, a manufacturing method thereof, and a camera provided with the corresponding solid-state imaging device.

Also, the present invention relates to a solid-state imaging device and an electronic device. In particular, the present invention relates to a solid-state imaging device, in which a photoelectric conversion unit and a pixel transistor that outputs a signal charge generated by the photoelectric conversion unit as an electric signal are installed in a pixel area and an electronic device.

2. Description of the Related Art

Typically, a charge accumulation capacity of a photodiode greatly depends upon the capacity of a PN junction formed in the vicinity of a substrate surface. However, if pixel refinement is performed, the surface area of the photodiode becomes smaller to cause the area of the PN junction to become also smaller, and thus the charge accumulation capacity is reduced.

When a large quantity of light is incident to the photodiode, electrons photoelectrically converted in the photodiode easily overflow from the photodiode, and an image turns white.

Accordingly, if the pixel finement is performed, the dynamic range of the imaging device becomes small.

Accordingly, in order to enlarge the charge accumulation capacity, it is necessary to increase the capacity of the PN junction of the photodiode. For this, it is important to increase the junction capacity by steepening a gradient of an effective impurity concentration in the PN junction.

In order to obtain a steep PN junction, a shallow and dense ion implantation is performed, and then heat treatment should be considered to prevent thermal diffusion.

However, if the heat treatment is insufficient, implantation defects caused by the ion implantation are not removed by sufficient heat treatment, but remain in the vicinity of the PN junction.

Also, even in an etching process such as reactive ion etching or the like in a gate etching and side wall etch back, defects and impurities are introduced in the vicinity of the PN junction.

However, since the heat treatment should be reduced for the above-described reasons, it may not be possible to perform the heat treatment in order to sufficiently remove of the defects.

Accordingly, in the case of attempting to increase the junction capacity through heightened steepness of the PN junction on the surface, the above-described defects remain in the vicinity of the PN junction, and transition occurs between trap assist bands. Due to this, even in the case where the transition occurs between bands dominated only by the original electric field intensity, a large amount of junction leak current is induced, which results in an undesirable increase of dark current.

As described above, improving the dynamic range by simply steepening the PN junction causes yield deterioration such as the increase of dark current or the like.

Japanese Unexamined Patent Application Publication No. 2005-167588 describes that the vicinity of an interface of $SiO_2$/Si is pinned by burying P+ polysilicon in an element isolation area and applying a negative potential to the polysilicon. The pinning of the P+ polysilicon is limited to the inside of the element isolation area.

Japanese Unexamined Patent Application Publication No. 2001-189286 describes that a Si active layer is deposited on a glass substrate and a photo gate Al is arranged thereon. The photo gate is used to form a depletion layer in order to accumulate in the active layer one-side charge of a carrier that is generated by the photoelectric conversion in the active layer.

Japanese Unexamined Patent Application Publication No. 2003-338615 describes that a transparent electrode is arranged on the back surface, and a negative potential is applied thereto. The transparent electrode is for the pinning of the back surface.

Japanese Unexamined Patent Application Publication No. 2003-31785 describes a CMOS image sensor irradiated with light from the back surface.

Japanese Unexamined Patent Application Publication Nos. 2006-173351 and 2007-258684 and International Patent Publication No. 2008/139644 describe configurations in which an electrode is installed on the front surface of a light sensing surface.

An electronic device, such as a digital video camera, a digital still camera, or the like, includes a solid-state imaging device. For example, the electronic device includes a CMOS (Complementary Metal Oxide Semiconductor) type image sensor, a CCD (Charge Coupled Device) image sensor, or the like, as the solid-state imaging device.

According to the solid-state imaging device, a plurality of pixels is arranged on the front surface of a semiconductor substrate. In each pixel, a photoelectric conversion unit is installed. The photoelectric conversion unit, for example, is a photodiode, which receives light incident through an optical system attached to the outside through a light sensing surface, performs a photoelectric conversion of the received light, and generate a signal charge.

According to the CMOS type image sensor among the solid-state imaging devices, a pixel is configured so that the CMOS type image sensor includes a pixel transistor in addition to the photoelectric conversion unit. The pixel transistor includes a plurality of transistors to read the signal charge generated by the photoelectric conversion unit and to output the read signal charge on a signal line as an electric signal.

As the solid-state imaging device, a "front-illuminated", in which the photoelectric conversion unit receives the light incident from the front-surface side on which a circuit element, an interconnection, or the like is installed in a semiconductor substrate, is known. In the case of the "front-illuminated", since the incident light is shielded or reflected by the circuit element, interconnection, or the like, it may be difficult to improve the sensitivity. As a result, a "back-illuminated", in which the photoelectric conversion unit receives the light incident from the back-surface that is opposite to the surface on which the circuit element, interconnection, or the like, in the semiconductor substrate is installed, has been proposed (for example, see Japanese Patent No. 3759435).

In the solid-state imaging device as described above, an effective pixel area and an optical black area are installed on the surface of the semiconductor substrate. In the effective pixel area, effective pixels, in which the photoelectric conversion unit receives the incident light, are arranged. The optical black area is installed in a portion surrounding the effective pixel area, and in the optical black area, optical black (OB) pixels, in which a light shielding layer for shielding the light incident to the photoelectric conversion unit is installed, are arranged. From the OB pixel, a reference signal of a black level is output. Also, in the solid-state imaging device, a process of correcting signals output from the effective pixels based on signals output from the OB pixels is performed to remove noise components such as a dark current and the like (for example, see Japanese Unexamined Patent Application Publication Nos. 2006-147816, 2005-101985, 2009-164247, and 2006-25147).

In addition, in order to prevent optical crosstalk in the solid-state imaging device, it has been proposed to install a dummy pixel area between the effective pixel area and the optical black area. In the dummy pixel area, dummy pixels that are not connected to a read column circuit are installed to absorb signal charges leaking from the effective pixel area. Also, it has been proposed to install a conductivity type well, as a dummy pixel area, that is different from the well of the effective pixel area and to compulsively discharge the excessive charges in a bulk (for example, see Japanese Unexamined Patent Application Publication No. 2000-196055).

SUMMARY OF THE INVENTION

As described above, it is difficult to suppress the yield deterioration while improving the dynamic range through steepening of the PN junction.

Also, if only the dummy pixel area is provided, the excessive charges in the bulk leak into the optical black area to change the reference signal of the black level, and thus the image quality of the captured image may deteriorate.

In particular, in the case of the "back-illuminated", like the "front-illuminated", it is difficult to make the semiconductor substrate apparently function as an overflow drain, thus leading to the occurrence of problems.

Also, even in the case of the "front-illuminated", when a p-type substrate is used to process the negative charge (electron) or when an n-type substrate is used to process the positive charge (hole), the substrate does not function as an overflow drain, thus leading to the occurrence of problems.

Also, in the case of installing a conductivity type well (for example, N-type well), which is different from the well (for example, P-type well) of the effective pixel area, as a dummy pixel area, it is not easy to secure the continuity in process between a neighboring pixel and another pixel. Accordingly, the signal from the pixel has discontinuity in this portion, and thus the captured image may have unevenness in a portion that corresponds to the neighboring portion of the dummy pixel area.

As described above, in the solid-state imaging device, the image quality of the captured image may deteriorate.

According to an embodiment of the present invention, there is provided a solid-state imaging device, which includes a photodiode having a first conductivity type semiconductor area that is dividedly formed for each pixel arranged on a light sensing surface of a semiconductor substrate in the form of a matrix; a first conductivity type transfer gate electrode formed on the semiconductor substrate via a gate insulating layer in an area neighboring the photodiode, and transmitting signal charges generated and accumulated in the photodiode; a signal reading unit reading a voltage which corresponds to the signal charge or the signal charge; and an inversion layer induction electrode formed on the semiconductor substrate via the gate insulating layer in an area covering a portion or the whole of the photodiode, and composed of a conductor or a semiconductor having a work function that is larger than that of the transfer gate electrode; wherein an inversion layer is induced, which is formed by accumulating a second conductivity type carrier on a surface of the inversion layer induction electrode side of the semiconductor area through the inversion layer induction electrode.

In the solid-state imaging device according to an embodiment of the present invention, a photodiode having a first conductivity type semiconductor area is divided for each pixel arranged on a light sensing surface of a semiconductor substrate in the form of a matrix, and formed. In an area neighboring the photodiode, a first conductivity type transfer gate electrode is formed on the semiconductor substrate via a gate insulating layer to transmit signal charges generated and accumulated in the photodiode. A signal reading unit is formed to read a voltage which corresponds to the signal charge or the signal charge. Also, in an area covering a portion or the whole of the photodiode, an inversion layer induction electrode composed of a conductor or a semiconductor having a work function that is larger than that of the transfer gate electrode is formed on the semiconductor substrate via the gate insulating layer. Here, an inversion layer is induced, which is formed by accumulating a second conductivity type carrier on a surface of the inversion layer induction electrode of the semiconductor area through the inversion layer induction electrode.

According to another embodiment of the present invention, there is provided a method of manufacturing a solid-state imaging device, which includes the steps of forming a first conductivity type semiconductor area in a photodiode forming area that is dividedly formed for each pixel arranged on a light sensing surface of a semiconductor substrate in the form of a matrix; forming a first conductivity type transfer gate electrode, which transmits signal charges generated and accumulated in the photodiode, on the semiconductor substrate via a gate insulating layer in an area neighboring the photodiode forming area; forming a signal reading unit for reading a voltage which corresponds to the signal charge or the signal charge; and forming an inversion layer induced electrode composed of a conductor or a semiconductor having a work function that is larger than that of the transfer gate electrode on the semiconductor substrate via the gate insulating layer in an area covering a portion or the whole of the photodiode forming area; wherein the photodiode is formed, in which an inversion layer that is formed by accumulating a second conductivity type carrier on the surface of the inversion layer induction electrode side of the semiconductor area by the inversion layer induction electrode is induced as the photodiode.

In the method of manufacturing a solid-state imaging device according to another embodiment of the present invention, a first conductivity type semiconductor area is formed on a photodiode forming area that is dividedly formed for each pixel arranged on a light sensing surface of a semiconductor substrate in the form of a matrix. Then, a first conductivity type transfer gate electrode, which transmits signal charges generated and accumulated in the photodiode, is formed on the semiconductor substrate via a gate insulating layer in an area neighboring the photodiode forming area. Also, a signal reading unit for reading a voltage which corresponds to the signal charge or the signal charge is formed. Further, an inversion layer induced electrode is formed, which is composed of a conductor or a semiconductor having a work function that is larger than that of the transfer gate electrode on the semiconductor substrate via the gate insulating layer in an area covering a portion or the whole of the photodiode forming area.

Here, the photodiode is formed, in which an inversion layer that is formed by accumulating a second conductivity type carrier on the surface of the inversion layer induction electrode side of the semiconductor area by the inversion layer induction electrode is induced as the photodiode.

According to still another embodiment of the present invention, there is provided a camera, which includes a solid-state imaging device formed by integrating a plurality of pixels on a light sensing surface; an optical system guiding an incident light to an imaging unit of the solid-state imaging device; and a signal processing circuit processing an output signal of the solid-state imaging device; wherein the solid-state imaging device includes a photodiode having a first conductivity type semiconductor area that is dividedly formed for each pixel arranged on a light sensing surface of a semiconductor substrate in the form of a matrix; a first conductivity type transfer gate electrode formed on the semiconductor substrate via a gate insulating layer in an area neighboring the photodiode, and transmitting signal charges generated and accumulated in the photodiode; a signal reading unit reading a voltage which corresponds to the signal charge or the signal charge; and an inversion layer induction electrode formed on the semiconductor substrate via the gate insulating layer in an area covering a portion or the whole of the photodiode, and composed of a conductor or a semiconductor having a work function that is larger than that of the transfer gate electrode; wherein an inversion layer is induced, which is formed by accumulating a second conductivity type carrier on a surface of the inversion layer induction electrode side of the semiconductor area through the inversion layer induction electrode.

The camera according to still another embodiment of the present invention includes a solid-state imaging device formed by integrating a plurality of pixels on a light sensing surface, an optical system guiding an incident light to an imaging unit of the solid-state imaging device, and a signal processing circuit processing an output signal of the solid-state imaging device. Here, the solid-state imaging device is the solid-state imaging device having the above-described configuration according to an embodiment of the present invention.

According to still another embodiment of the present invention, there is provided a solid-state imaging device, which includes a photoelectric conversion unit receiving light through a light sensing surface and generating a signal charge, and a semiconductor substrate in which a pixel transistor that outputs the signal charge generated by the photoelectric conversion unit as an electric signal is installed in a pixel area; wherein the pixel area includes an effective pixel area in which an effective pixel, in which an incident light is incident to the light sensing surface of the photoelectric conversion unit, is arranged, and a light shielding area which is installed in the neighborhood of the effective pixel area and in which a light shielding pixel, in which a light shielding unit shielding the incident light is installed on an upper side of the light sensing surface of the photoelectric conversion unit, is arranged; wherein the light shielding area further includes a charge discharging area in which a charge discharging pixel that discharges the signal charge leaking from the effective pixel area is arranged as the light shielding pixel, in addition to an optical black area in which an optical black pixel, in which the pixel transistor outputs the signal charge generated by the photoelectric conversion unit as a reference signal of a black level, is arranged as the light shielding pixel, and the corresponding charge discharging area is installed between the effective pixel area and the optical black area.

Preferably, in the solid-state imaging device according to still another embodiment of the present invention, the charge discharging pixel, the optical black pixel, and the effective pixel are installed in the same conductivity type well installed on the semiconductor substrate.

Preferably, in the solid-state imaging device according to still another embodiment of the present invention, the pixel transistor includes a transmission transistor, an amplification transistor, a selection transistor, and a reset transistor; wherein in the charge discharging area, a gate of the transmission transistor is not electrically connected to a transmission line on which a transmitted signal is applied to the gate, but is configured so that a potential that causes the corresponding transmission transistor to be in an on state is applied thereto; a gate of the reset transistor is not electrically connected to a reset line on which a reset signal is applied to the gate, but is configured so that a potential that causes the corresponding reset transistor to be in an on state is applied thereto; and the signal line on which the electric signal is output is not electrically connected to a semiconductor device in which the electric signal is output on the signal line.

Preferably, in the solid-state imaging device according to still another embodiment of the present invention, the transmission transistors are installed one by one with respect to each of the photoelectric conversion units, and the amplification transistor, the selection transistor, and the reset transistors are installed one by one with respect to a set that includes a plurality of photoelectric conversion units.

Preferably, in the solid-state imaging device according to still another embodiment of the present invention, the pixel transistor includes a transmission transistor, an amplification transistor, a selection transistor, and a reset transistor; wherein in the charge discharging area, a gate of the transmission transistor is not electrically connected to a transmission line on which a transmitted signal is applied to the gate, but is configured so that a potential that causes the corresponding transmission transistor to be in an on state is applied to the gate of the transmission transistor and a floating diffusion that corresponds to a drain of the transmission transistor; and the signal line on which the electric signal is output is not electrically connected to a semiconductor device in which the electric signal is output on the signal line.

Preferably, in the solid-state imaging device according to still another embodiment of the present invention, the transmission transistors are installed one by one with respect to each of the photoelectric conversion units, and the amplification transistor, the selection transistor, and the reset transistors are installed one by one with respect to a set that includes a plurality of photoelectric conversion units.

Preferably, in the solid-state imaging device according to still another embodiment of the present invention, the pixel transistor includes a transmission transistor, an amplification transistor, and a reset transistor; wherein in the charge discharging area, a gate of the transmission transistor is not electrically connected to a transmission line on which a transmitted signal is applied to the gate, but is configured so that a potential that causes the corresponding transmission transistor to be in an on state is applied thereto; a gate of the reset transistor is not electrically connected to a reset line on which a reset signal is applied to the gate, but is configured so that a potential that causes the corresponding reset transistor to be in an on state is applied thereto; and the signal line on which the electric signal is output is not electrically connected to a semiconductor device in which the electric signal is output on the signal line.

Preferably, in the solid-state imaging device according to still another embodiment of the present invention, the transmission transistor is installed one by one with respect to each of the photoelectric conversion unit, and the amplification transistor and the reset transistor are installed one by one with respect to a set that includes a plurality of photoelectric conversion units.

Preferably, in the solid-state imaging device according to still another embodiment of the present invention, the pixel transistor includes a transmission transistor, an amplification transistor, and a reset transistor; wherein in the charge discharging area, a gate of the transmission transistor is not electrically connected to a transmission line on which a transmitted signal is applied to the gate, but is configured so that a potential that causes the corresponding transmission transistor to be in an on state is applied to the gate of the transmission transistor and a floating diffusion that corresponds to a drain of the transmission transistor; and the signal line on which the electric signal is output is not electrically connected to a semiconductor device in which the electric signal is output on the signal line.

Preferably, in the solid-state imaging device according to still another embodiment of the present invention, the transmission transistors are installed one by one with respect to each of the photoelectric conversion units, and the amplification transistor and the reset transistor are installed one by one with respect to a set that includes a plurality of photoelectric conversion units.

Preferably, in the solid-state imaging device according to still another embodiment of the present invention, the pixel transistor includes a transmission transistor, an amplification transistor, a selection transistor, and a reset transistor; wherein in the charge discharging area, a gate of the transmission transistor is not electrically connected to a transmission line on which a transmitted signal is applied to the gate, but is configured so that a potential that causes the corresponding transmission transistor to be in an on state is applied thereto; a gate of the reset transistor is not electrically connected to a reset line on which a reset signal is applied to the gate, but is configured so that a potential that causes the corresponding reset transistor to be in an on state is applied thereto; and a gate of the selection transistor is configured so that a ground potential or a low potential that corresponds to the ground potential is applied to the gate of the selection transistor, so that the corresponding selection transistor is not in an on state.

Preferably, in the solid-state imaging device according to still another embodiment of the present invention, the pixel transistor includes a transmission transistor, an amplification transistor, a selection transistor, and a reset transistor; wherein in the charge discharging area, a gate of the transmission transistor is not electrically connected to a transmission line on which a transmitted signal is applied to the gate, but is configured so that a potential that causes the corresponding transmission transistor to be in an on state is applied to the gate of the transmission transistor and a floating diffusion that corresponds to a drain of the transmission transistor; and a gate of the selection transistor is configured so that a ground potential or a low potential that corresponds to the ground potential is applied to the gate of the selection transistor, so that the corresponding selection transistor is not in an on state.

Preferably, in the solid-state imaging device according to still another embodiment of the present invention, the pixel transistor includes a transmission transistor, an amplification transistor, and a reset transistor; wherein in the charge discharging area, a gate of the transmission transistor is not electrically connected to a transmission line on which a transmitted signal is applied to the gate, but is configured so that a potential that causes the corresponding transmission transistor to be in an on state is applied thereto; a gate of the reset transistor is not electrically connected to a reset line on which a reset signal is applied to the gate, but is configured so that a potential that causes the corresponding reset transistor to be in an on state is applied thereto; a floating diffusion that corresponds to a drain of the transmission transistor and a gate of the amplification transistor are electrically separated from each other; and a ground potential or a low potential that corresponds to the ground potential is applied to the corresponding gate, so that the corresponding amplification transistor is not in an on state.

Preferably, in the solid-state imaging device according to still another embodiment of the present invention, the pixel transistor includes a transmission transistor, an amplification transistor, and a reset transistor; wherein in the charge discharging area, a gate of the transmission transistor is not electrically connected to a transmission line on which a transmitted signal is applied to the gate, but is configured so that a potential that causes the corresponding transmission transistor to be in an on state is applied to the gate of the transmission transistor and a floating diffusion that corresponds to a drain of the transmission transistor; the floating diffusion of the transmission transistor and a gate of the amplification transistor are electrically separated from each other; and a ground potential or a low potential that corresponds to the ground potential is applied to the corresponding gate, so that the corresponding amplification transistor is not in an on state.

Preferably, in the solid-state imaging device according to still another embodiment of the present invention, the pixel transistor at least includes a transmission transistor, and the corresponding transmission transistor is installed as a depletion transistor.

Preferably, in the solid-state imaging device according to still another embodiment of the present invention, the semiconductor substrate has one surface on which the pixel transistor is formed and the rear surface on which the incident light is incident to the light sensing surface of the effective pixel.

Preferably, in the solid-state imaging device according to still another embodiment of the present invention, the semiconductor substrate has one surface on which the pixel transistor is formed and the incident light is incident to the light sensing surface of the effective pixel on the surface, and an overflow drain area is not installed on the rear surface of the corresponding semiconductor substrate that is opposite to the position where the photoelectric conversion unit is installed.

According to still another embodiment of the present invention, there is provided an electronic device, which includes a photoelectric conversion unit receiving light through a light sensing surface and generating a signal charge, and a semiconductor substrate in which a pixel transistor that outputs the signal charge generated by the photoelectric conversion unit as an electric signal is installed in a pixel area; wherein the pixel area includes an effective pixel area in which an effective pixel, in which an incident light is incident to the light sensing surface of the photoelectric conversion unit, is arranged, and a light shielding area which is installed in the neighborhood of the effective pixel area and in which a light shielding pixel, in which a light shielding unit shielding the incident light is installed on an upper side of the light sensing surface of the photoelectric conversion unit, is arranged; wherein the light shielding area further includes a charge discharging area in which a charge discharging pixel that discharges the signal charge leaking from the effective pixel area is arranged as the light shielding pixel, in addition to an optical black area in which an optical black pixel, in which the pixel transistor outputs the signal charge generated by the photoelectric conversion unit as a reference signal of a black level, is arranged as the light shielding pixel, and the corresponding charge discharging area is installed between the effective pixel area and the optical black area.

Preferably, in the electronic device according to still another embodiment of the present invention, the charge discharging area is installed between the effective pixel area and the optical black area. In the charge discharging area, the charge discharging pixel is installed, and this charge discharging pixel compulsively discharges the signal charge leaking from the effective pixel area.

According to the solid-state imaging device according to an embodiment of the present invention, an inversion layer induction electrode is formed on an area covering a portion or the whole of the photodiode, and an inversion layer is induced, which is formed by accumulating a second conductivity type carrier on the surface of the inversion layer induction electrode side of the semiconductor area. Accordingly, the dynamic range is improved by steepening the PN junction, and the yield deterioration can be suppressed.

According to the method of manufacturing a solid-state imaging device according to another embodiment of the present invention, the solid-state imaging device can be manufactured by forming an inversion layer induction electrode on an area covering a portion or the whole of the photodiode and inducing an inversion layer which is formed by accumulating a second conductivity type carrier on the surface of the inversion layer induction electrode side of the semiconductor area. Accordingly, the dynamic range is improved by steepening the PN junction, and the yield deterioration can be suppressed.

According to the camera according to still another embodiment of the present invention, a camera using the solid-state imaging device which can suppress the yield deterioration and improve the dynamic range through steepening of the PN junction can be provided.

According to the embodiments of the present invention, a solid-state imaging device and the electronic device, which can improve the image quality of the image, can be provided.

DESCRIPTION OF THE PREFERRED EMBODIMENTS

Hereinafter, a solid-state imaging device, a manufacturing method thereof, and a camera provided with the corresponding solid-state imaging device according to embodiments of the present invention will be described with reference to the accompanying drawings. In this case, the explanation will be made in the following order.

1. First embodiment (Basic configuration)
2. First modification (Pushing out of signal charges by voltage applied to an inversion layer induction electrode)
3. Second modification (Modification of a gate electrode process)
4. Second embodiment (Configuration having grooves in an element isolation area of a photodiode)
5. Third embodiment (Configuration having grooves in a lower portion of a transfer gate)
6. Third modification (Configuration having no groove in an element isolation area of a photodiode in the third embodiment)
7. Fourth embodiment (camera using a solid-state imaging device)
8. Fifth Embodiment

First Embodiment

[Plan View of a Solid-State Imaging Device]

Figure 1:
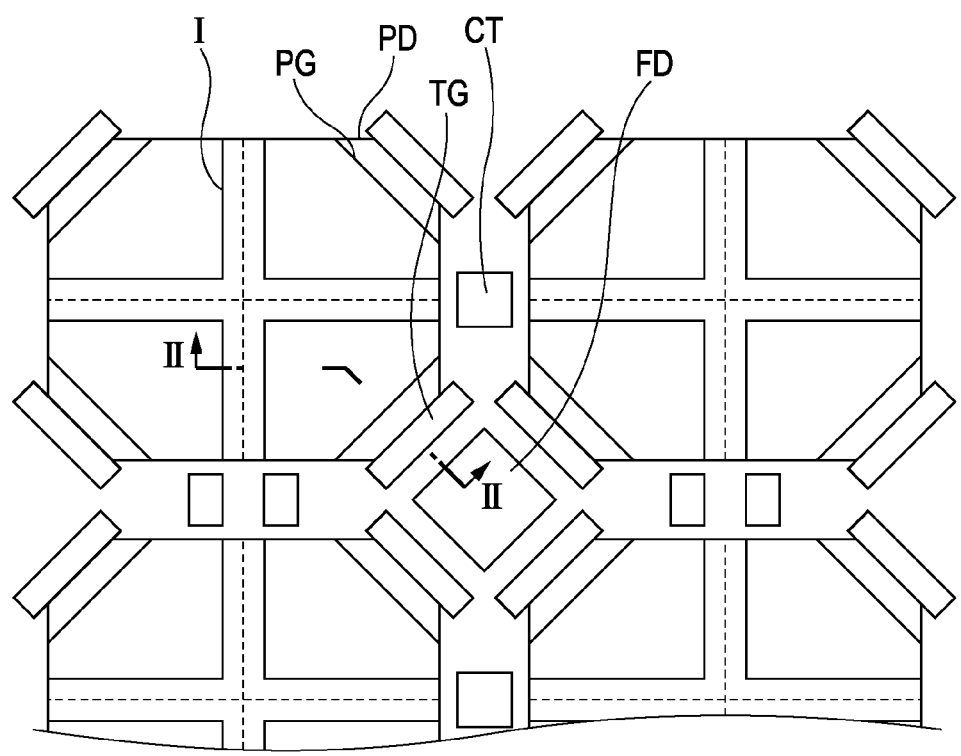
FIG. 1 is a plan view of a solid-state imaging device according to a first embodiment of the present invention.

FIG. 1 is a plan view of a CMOS image sensor that is a solid-state imaging device according to a first embodiment of the present invention.

According to the solid-state imaging device according to the first embodiment of the present invention, for example, a photodiode PD is dividedly formed for each pixel which is arranged on a light sensing surface of a semiconductor substrate in the form of a matrix.

For example, a transfer gate electrode TG is formed in an area neighboring the photodiode PD, and a floating diffusion FD is further formed in an area neighboring the transfer gate electrode TG.

For example, in this embodiment, one set of four photodiodes PD, which are divided by the element isolation area I with each other, is arranged in the form of a matrix. In an area between the photodiode sets, a transfer gate electrode TG, a floating diffusion FD, a contact CT, and other transistors are arranged.

For example, the floating diffusion FD is connected to the four photodiodes PD surrounding the floating diffusion through four transfer gate electrodes TG. That is, one floating diffusion FD is shared by four pixels.

For example, the photodiode PD accumulates signal charges which are generated by a photoelectric effect when the photodiode receives light. In the floating diffusion FD, an amplification transistor and a selection transistor are connected, and a signal reading unit that read a voltage in response to the signal charges is configured. Also, the floating diffusion FD is connected to the reset transistor to remove the signal charges accumulated inside the photodiode PD and the floating diffusion FD.

In a CMOS image sensor in this embodiment, in an area covering a portion or the whole of the photodiode PD, an inversion layer induction electrode PG is formed on the semiconductor substrate via a gate insulating layer.

The inversion layer induction electrode PG is composed of a conductor or a semiconductor having a work function that is larger than that of the transfer gate electrode TG. An inversion layer is induced, which is formed by accumulating a second conductivity type carrier on the surface of the inversion layer induction electrode PG of the first conductivity type semiconductor area that forms the photodiode PD, by the inversion layer induction electrode PG. For example, an inversion layer is induced, which is formed by accumulating holes that are P-type carrier, on the surface of the inversion layer induction electrode side PG of the N-type semiconductor area that forms the photodiode PD.

Also, in the CMOS image sensor in this embodiment, as described later, a CMOS transistor composed of an NMOS transistor and a PMOS transistor that constitute a logic circuit on the same substrate as the semiconductor substrate having the light sensing surface in an area (not illustrated).

[Sectional View of a Solid-State Imaging Device]

Figure 2A:
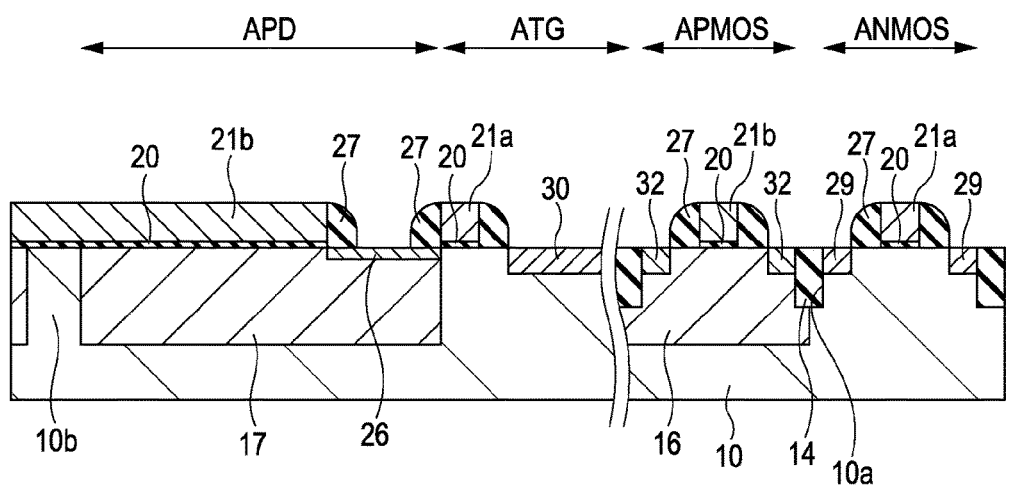
FIGS. 2A and 2B are sectional views of a solid-state imaging device according to the first embodiment of the present invention.

FIG. 2A is a sectional view of a solid-state imaging device according to this embodiment. For example, the sectional view taken along line I-I of FIG. 1 corresponds to a photodiode area APD and a transfer gate area ATG indicated along line IIA-IIA of FIG. 2A. The transfer gate area ATG includes a transfer gate electrode and a floating diffusion area. Also, for example, as shown in FIG. 2A, an NMOS transistor area ANMOS and a PMOS transistor area APMOS which constitute a logic circuit (not illustrated in FIG. 1) are illustrated.

For example, in the photodiode area APD that is divided by the element isolation area 10b, an N-type semiconductor area 17 that forms the photodiode in the semiconductor substrate 10 made of P-type silicon is formed. The semiconductor substrate 10 may be a silicon substrate of a bulk, or may be an SOI (Silicon on Insulator) substrate.

On the surface layer portion of the semiconductor area 17 in the end portion of the photodiode area APD, a P-type semiconductor layer 26 is formed, which makes a portion of the PN junction that becomes the photodiode as the semiconductor area 17.

In the transfer gate area ATG neighboring the area of the P-type semiconductor layer 26, a conduction layer 21a made of an N-type polysilicon, which is the transfer gate electrode, is formed on the semiconductor substrate 10 via the gate insulating layer 20. Further, an N-type semiconductor layer 30 that is the floating diffusion is formed on an area neighboring the conduction layer 21a that is the transfer gate electrode.

In the CMOS image sensor in this embodiment, in the area covering a portion or the whole of the photodiode PD, a conduction layer 21b that is formed of a P-type polysilicon that is the inversion layer conduction electrode is formed on the semiconductor substrate 10 via the gate insulating layer 20. As illustrated in FIG. 2A, the conduction layer 21b that is the inversion layer induction electrode is integrally formed with the conduction layer 21b that is the inversion layer induction electrode formed on the adjacent photodiode.

As described above, on side surfaces of the N-type conduction layer 21a and the P-type conduction layer 21b, a side wall insulating layer 27 is formed.

Also, in the CMOS image sensor in this embodiment, in the NMOS transistor area ANMOS and the PMOS transistor area APMOS, an NMOS transistor and a PMOS transistor that constitute a logic circuit are formed on the semiconductor substrate 10. A CMOS transistor is formed from the NMOS transistor and PMOS transistor.

That is, an element isolation insulating layer 14 is formed on an element isolation groove 10a that is formed on the semiconductor substrate 10 by an STI (Shallow Trench Isolation) method. In the NMOS transistor area ANMOS divided by the element isolation insulating layer 14, a conduction layer 21a made of N-type polysilicon, which is the gate electrode, is formed on the semiconductor substrate 10 via the gate insulating layer 20.

As described above, a side wall insulating layer 27 is formed on the side surface of the N-type conduction layer 21a, and an N-type semiconductor layer 29, which is a source/drain area, is formed in the semiconductor substrate 10 on both side portions of the side wall insulating layer 27. As such, the PMOS transistor is configured.

Also, in the PMOS transistor area APMOS that is divided by the element isolation insulating layer 14 by the STI method of the semiconductor substrate 10, an N-type well 16 is formed. Further, a conduction layer 21b made of P-type polysilicon, which is the gate electrode, is formed on the semiconductor substrate 10 via the gate insulating layer 20.

As described above, the side wall insulating layer 27 is formed on the side surface of the P-type conduction layer 21b, and a P-type semiconductor layer 32, which is a source/drain area, is formed in the semiconductor substrate 10 on both side portions of the side wall insulating layer 27. As such, the PMOS transistor is configured.

Figure 2B:
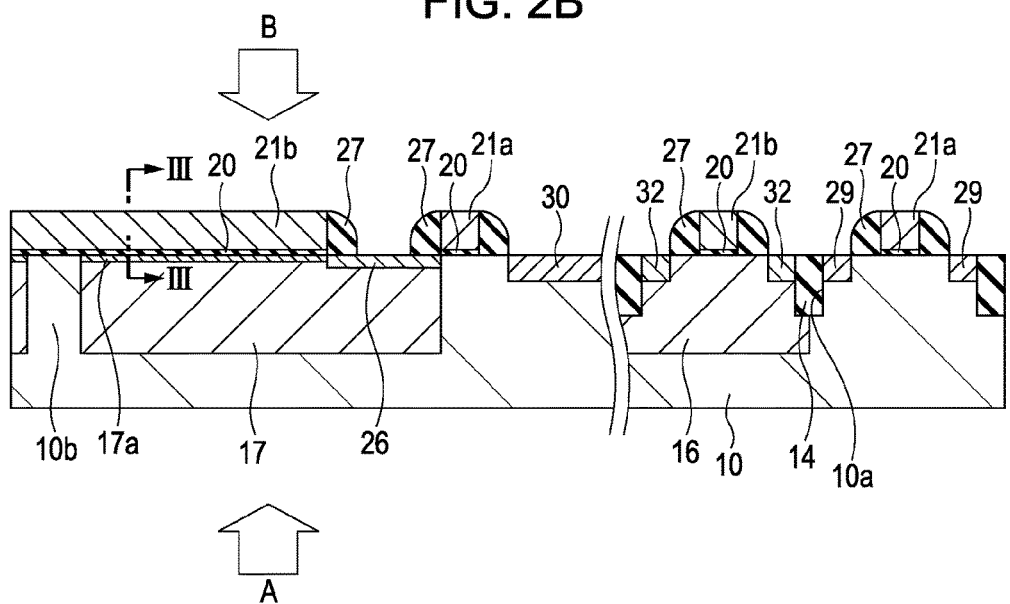

FIG. 2B is a sectional view of a solid-state imaging device according to this embodiment of the present invention.

Although FIG. 2B is substantially equal to FIG. 2A, FIG. 2B shows that an inversion layer 17a is induced on the surface of the conduction layer side 21b made of P-type polysilicon that is the inversion layer induction electrode of the N-type semiconductor area 17.

For example, the inversion layer induction electrode is made of a conductor or a semiconductor having a work function that is larger than that of the transfer gate electrode. In this embodiment, the inversion layer induction electrode is made of P-type polysilicon, and the transfer gate electrode is made of N-type polysilicon.

The inversion layer 17a is induced, which is formed by accumulating holes that are P-type carriers on the surface of the inversion layer induction electrode side of the N-type semiconductor area 17 forming the photodiode by the inversion layer induction electrode.

Although the inversion layer induction electrode has an effect of inducing the inversion layer 17a caused by the work function of the inversion layer induction electrode even without the applied voltage, however, for example, the effective carrier concentration inside the inversion layer 17a can be heightened by accumulating holes having much higher concentration through applying of a negative voltage. The holes on the surface have effects in reduction of leak current caused by the surface of the substrate, and since the leak is reduced as the concentration is higher, it is preferable to induce holes having the concentration as high as possible. The reason for the induction of the surface inversion layer 17a will be described later.

It is preferable that the effective concentration of the N-type impurities in the semiconductor area 17 has a smooth concentration gradient, that is, becomes higher as being closer to the surface of the semiconductor substrate. In this case, the signal charges generated from the photodiode smoothly moves near the surface of the substrate. The signal charges are caught by the potential and accumulated inside the photodiode PD.

Also, an insulating layer and an upper layer interconnection are formed on the semiconductor substrate by covering the photodiode.

If the light incident surface is on the rear surface side (direction A in FIG. 2B) of the substrate, if necessary, a color filter and the like are formed on the rear surface side of the substrate. Further, an optical guide or an on-chip lens may be installed on the rear surface side of the substrate. In the above-described construction, the inversion layer induction electrode that is formed by covering the photodiode may not be transparent with respect to the incident light. For example, the inversion layer induction electrode may be formed of P-type polysilicon that is the same layer as the gate electrode of the PMOS transistor. Also, it is also possible to use a metal layer such as copper as a reflective layer against the incident light so as to return the light to the photodiode area again when the incident light from the rear surface side of the substrate is not absorbed in the photodiode but passes through the photodiode.

The inversion layer induction electrode is made of a conductor or a semiconductor having a work function that is larger than that of the transfer gate electrode, and for example, P-type silicon, P-type polysilicon, copper, tungsten, NiSi, CoSi, TiN, ITO (Indium Tin Oxide), or the like, may be used.

If the light incident surface is on the surface side (direction B in FIG. 2B) of the substrate, if necessary, an optical guide is installed inside the insulating layer on the substrate, and a color filter and an on-chip lens are formed on an upper layer thereof. In the above-described construction, it is important that the inversion layer induction electrode formed by covering the photodiode is transparent with respect to the incident light. For example, a transparent electrode such as ITO or the like may be formed. Even the polysilicon has somewhat light transmission depending upon the layer thickness thereof, and can be used if it is applicable. Since the inversion layer induction electrode such as polysilicon can reduce the interface state of the substrate surface, it has noise reduction effects due to the surface of the photodiode, and thus can be preferably applied to a device in which the reduction of surface noise is important. Following the condition of the device, the inversion layer induction electrode may be formed of one selected from the above-described materials.

In FIGS. 2A and 2B, illustration of the insulating layer, the upper layer interconnection, the optical guide, the color filter, and the on-chip lens is omitted.

[Energy Band of Photodiodes Constituting a Solid-State Imaging Device]

FIGS. 3A to 3D are energy band diagrams of photodiode areas of a CMOS image sensor according to this embodiment and a CMOS image sensor according to comparative example.

Figure 3A:
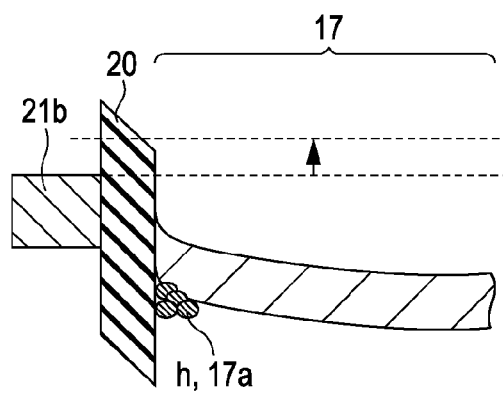
FIGS. 3A to 3D are energy band diagrams of a photodiode area of a solid-state imaging device according to the first embodiment and comparative examples.
Figure 3B:
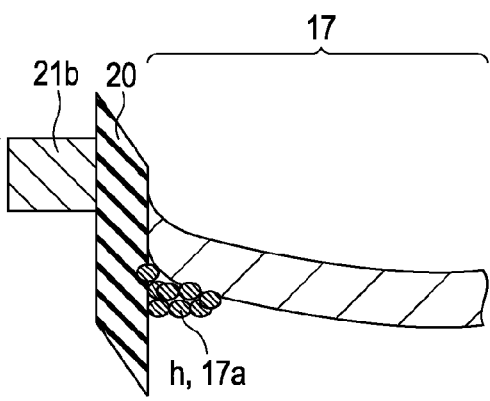

FIGS. 3A and 3B are energy band diagrams of a photodiode area of the CMOS image sensor according to an embodiment of the present invention. IIB-IIB as illustrated in FIG. 2B indicates an energy band on the cross sections of the conduction layer 21b that is the inversion layer induction electrode, the gate insulating layer 20, and the semiconductor area 17. Here, FIG. 3A shows a case where the applied voltage to the inversion layer induction electrode is zero, and FIG. 3B shows a case where a predetermined negative voltage is applied to the inversion layer induction electrode.

Figure 3C:
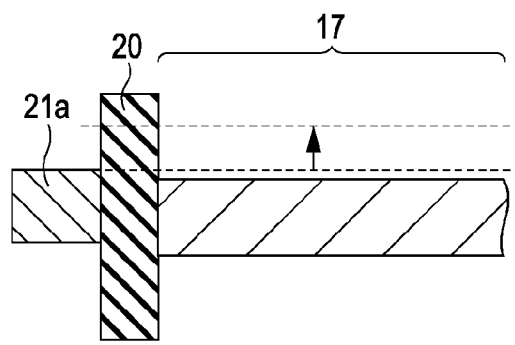
Figure 3D:
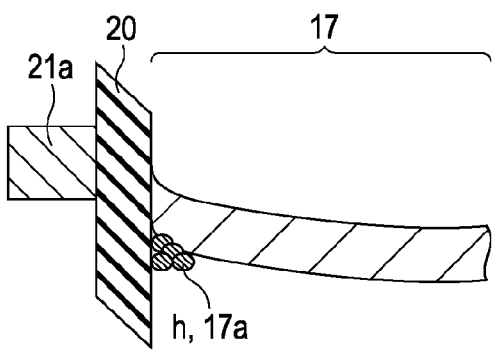

On the other hand, FIGS. 3C and 3D are energy band diagrams of a photodiode area of the CMOS image sensor according to comparative examples. IIB-IIB illustrated in FIG. 2B corresponds to the cross section, and in the comparative examples, the inversion layer induction electrode is composed of the conduction layer 21a that is made of N-type polysilicon. Here, FIG. 3C shows a case where the applied voltage to the inversion layer induction electrode is zero, and FIG. 3D shows a case where a predetermined negative voltage is applied to the inversion layer induction electrode.

In the CMOS image sensor according to the comparative examples, as illustrated in FIG. 3C, if the applied voltage is zero, the conduction layer 21a and the semiconductor area 17 have the same potential, and the inversion layer is not induced. As illustrated in FIG. 3D, if a predetermined negative potential is applied, holes h are accumulated on the surface of the conduction layer side 21a of the semiconductor area 17, and thus the inversion layer 17a is induced.

In the CMOS image sensor according to this embodiment, in the case where a material having a sufficiently large work function such as P-type polysilicon is used as the inversion layer induction electrode, as illustrated in FIG. 3A, holes h are accumulated on the surface of the conduction layer side 21b of the semiconductor area 17, for example, as much as that illustrated in FIG. 3D, even if the applied voltage is zero, and thus the inversion layer 17a is induced. This is caused by the fact that the work function of the conduction layer 21b is larger than that of the conduction layer 21a.

Also, as illustrated in FIG. 3B, if a predetermined negative potential is applied to the conduction layer 21b, the effective carrier concentration in the inversion layer 17a can be heightened through accumulation of the holes having a much higher concentration.

According to the solid-state imaging device according to this embodiment, the inversion layer induction electrode is formed in the area covering a portion or the whole of the photodiode, and the inversion layer is induced, which is formed by accumulating the second conductivity type carrier on the surface of the inversion layer induction electrode side of the semiconductor area. Accordingly, the dynamic range can be improved by steepening the PN junction.

Also, in the method of manufacturing a solid-state imaging device to be described later, it is possible to perform heat treatment for removing the defect introduced through the gate etching and side wall etch back. Also, the conduction layer itself, which is the inversion layer induction electrode covering the photodiode, suppresses the introduction of the defect to the photodiode area in the etching process. Accordingly, the increase of the dark current is avoided, and thus the yield deterioration can be suppressed.

[Method of Manufacturing a Solid-State Imaging Device]

FIGS. 4A to 8B are sectional views illustrating manufacturing processes of a method of manufacturing a solid-state image device according to an embodiment of the present invention. With reference to these drawings, a method of manufacturing a CMOS image sensor that is the solid-state imaging device according to an embodiment of the present invention will be described.

The drawings are sectional views corresponding to FIGS. 2A and 2B, and show a photodiode area APD, a transfer gate area ATG, an NMOS transistor area ANMOS, and a PMOS transistor area APMOS.

Figure 4A:
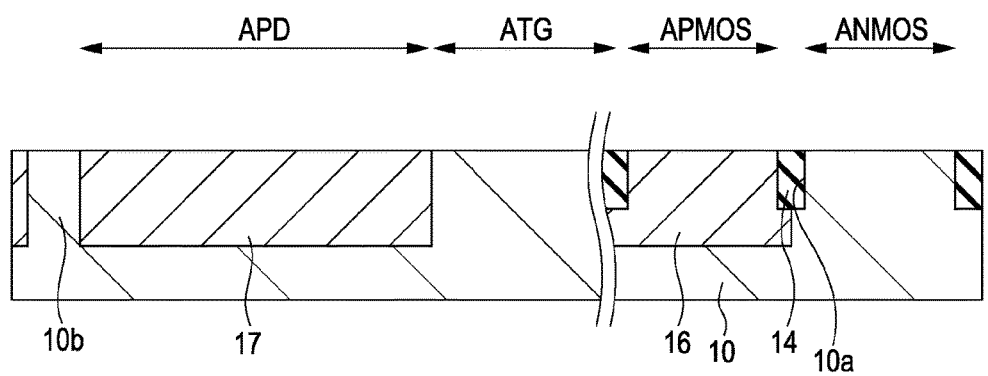
FIGS. 4A and 4B are sectional views illustrating manufacturing processes of a method of manufacturing a solid-state imaging device according to the first embodiment of the present invention.

First, as shown in FIG. 4A, for example, in the NMOS transistor area ANMOS and the PMOS transistor area APMOS, an element isolation groove 10a is formed on the semiconductor substrate 10 by an STI method, and an element isolation insulating layer 14 is formed. For example, through the ion implantation of N-type impurities, N-type well 16 is formed on the PMOS transistor area APMOS. In forming the N-type well 16, P is formed with a combination of implantation energy of 0.2 to 1000 keV and ion implantation of doze amount of $1\times10^{11}$ to $1\times10^{13}/cm^2$.

Also, in the photodiode area APD and the transfer gate area ATG, the element isolation is performed in the P-type element isolation area 10b, and the N-type semiconductor area 17 that forms the photodiode is formed in the photodiode area APD. For example, in forming the N-type semiconductor area 17, P is formed with a combination of implantation energy of 50 to 3000 keV and ion implantation of doze amount of $1\times10^{11}$ to $1\times10^{13}/cm^2$.

Also, if necessary, a well, channel impurities, and impurities for element isolation may be ion-injected.

The semiconductor substrate 10 may be a silicon substrate of a bulk or may be an SOI substrate.

In forming the semiconductor area 17, due to the above-described reason, it is preferable that the effective concentration of the N-type impurities has a smooth concentration gradient, that is, becomes higher as being closer to the surface of the semiconductor substrate.

Figure 4B:
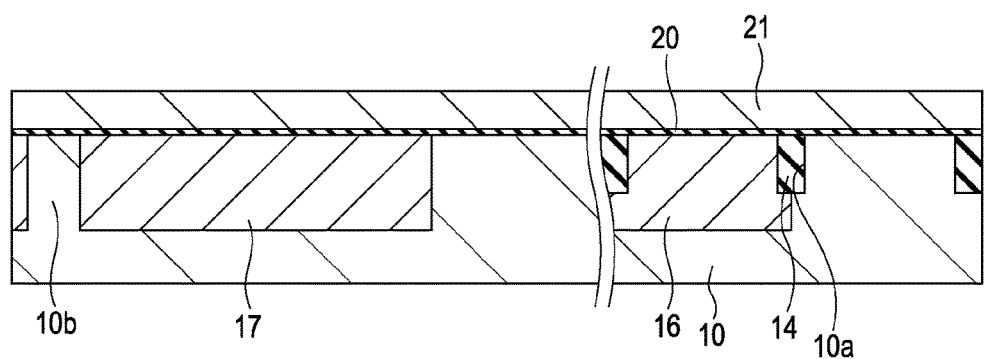

Next, as illustrated in FIG. 4B, for example, in the photodiode area APD, the transfer gate area ATG, the NMOS transistor area ANMOS, and the PMOS transistor area APMOS, the gate insulating layer 20 is formed on the surface of the semiconductor substrate 10. The gate insulting layer 20, for example, may be formed by forming a silicon oxide layer by a thermal oxidation method or a CVD (Chemical Vapor Deposition) method. Next, a polysilicon layer 21 is formed on the upper layer of the gate insulating layer 20 with a thickness of 80 to 250 nm by the CVD method.

Figure 5A:
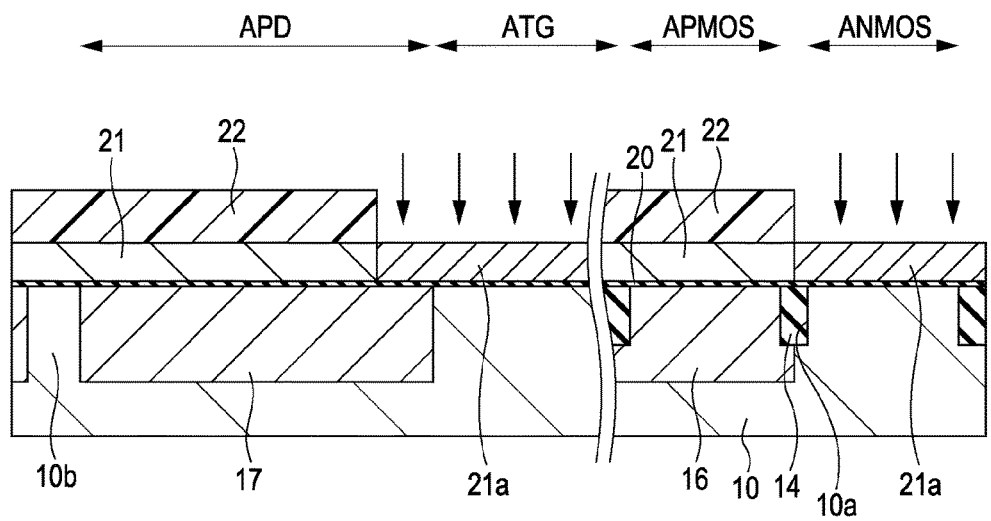
FIGS. 5A and 5B are sectional views illustrating manufacturing processes of a method of manufacturing a solid-state imaging device according to the first embodiment of the present invention.

Next, as illustrated in FIG. 5A, for example, a resist layer 22 for protecting the photodiode area APD and the PMOS transistor area APMOS is formed to be patterned. Using the resist layer 22 as a mask, in the transfer gate area ATG and the NMOS transistor area ANMOS, the N-type conduction layer 21a is formed by introducing N-type conductive impurities such as P or the like onto the polysilicon layer 21. For example, in forming the N-type conduction layer 21a, P is formed with a combination of implantation energy of 5 to 30 keV and ion implantation of doze amount of 0 to $1\times10^{16}/cm^2$.

Figure 5B:
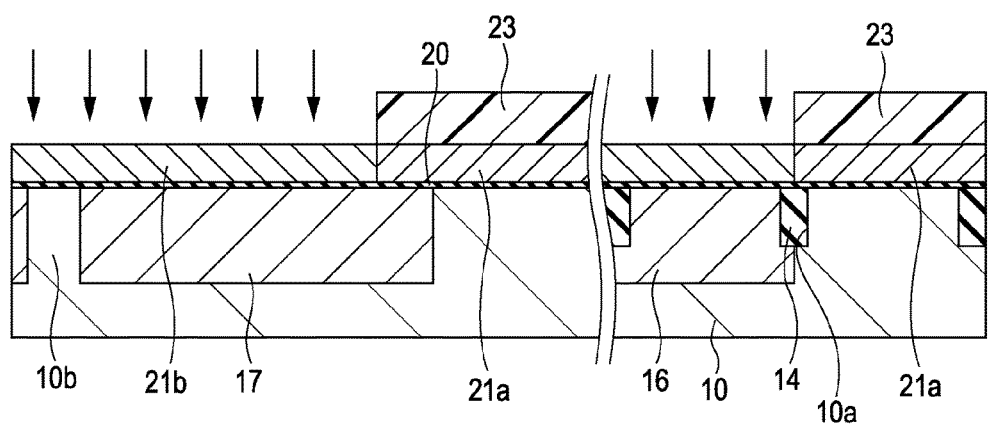

Next, as illustrated in FIG. 5B, for example, a resist layer 23 for protecting the transfer gate area ATG and the NMOS transistor area ANMOS is formed to be patterned. Using the resist layer 23 as a mask, in the photodiode area APD and the PMOS transistor area APMOS, the P-type conduction layer 21b is formed by introducing P-type conductive impurities such as B or the like onto the polysilicon layer 21. For example, in forming the P-type conduction layer 21b, B is formed with a combination of implantation energy of 3 to 15 keV and ion implantation of doze amount of 0 to $1\times10^{16}/cm^2$.

Figure 6A:
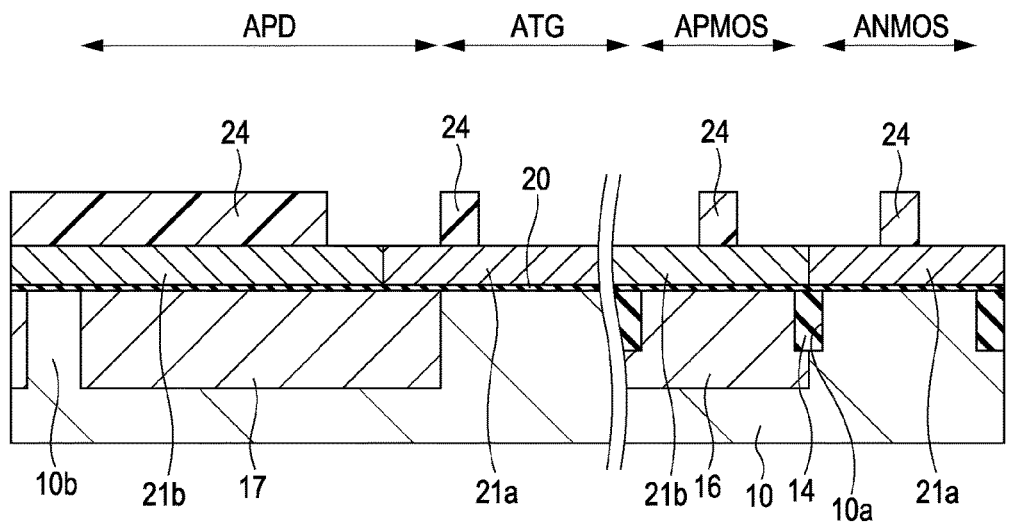
FIGS. 6A and 6B are sectional views illustrating manufacturing processes of a method of manufacturing a solid-state imaging device according to the first embodiment of the present invention.

Next, as illustrated in FIG. 6A, for example, a resist layer 24 is formed to be patterned on the conduction layer 21a and the conduction layer 21b.

The resist layer 24 has patterns of the inversion layer induction electrode of the photodiode area APD, the transfer gate electrode of the transfer gate area ATG, and the gate electrode of the NMOS transistor area ANMOS and the PMOS transistor area APMOS.

Figure 6B:
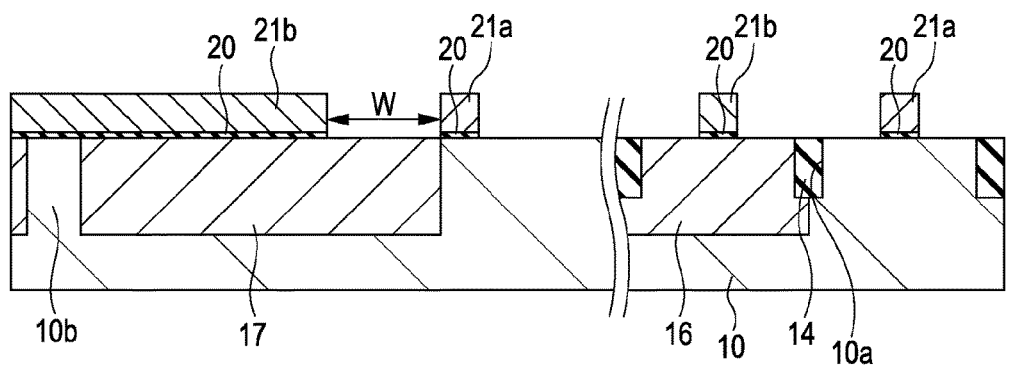

Next, as illustrated in FIG. 6B, for example, an etching process is performed using the resist layer 24 as a mask. The etching process may be, for example, an anisotropic etching process such as RIE (Reactive Ion Etching) by plasma of a mixed gas of $Cl_2+O_2$.

As described above, the conduction layer 21b that is the inversion layer induction electrode, the conduction layer 21a that is the transfer gate electrode, the conduction layer 21a that is the gate electrode of the NMOS transistor, and the conduction layer 21b that is the gate electrode of the PMOS transistor are formed to be patterned. The conduction layer 21b that is the inversion layer induction electrode is integrally formed with the conduction layer 21b that is the inversion layer induction electrode on the photodiode of the neighboring pixel.

In the above-described etching process, the gate insulting layer 20 is processed in the same pattern as that of the respective conduction layers 21a and 21b.

Here, it is sufficient if the width W between the conduction layer 21b that is the inversion layer induction electrode and the conduction layer 21a that is the transfer gate electrode is a distance in which the P-type conduction layer 21b and the N-type conduction layer 21a are sufficiently separable. For example, the width W may be formed by a minimum design rule that can be processed, and may be, for example, 50 to 300 nm.

Figure 7A:
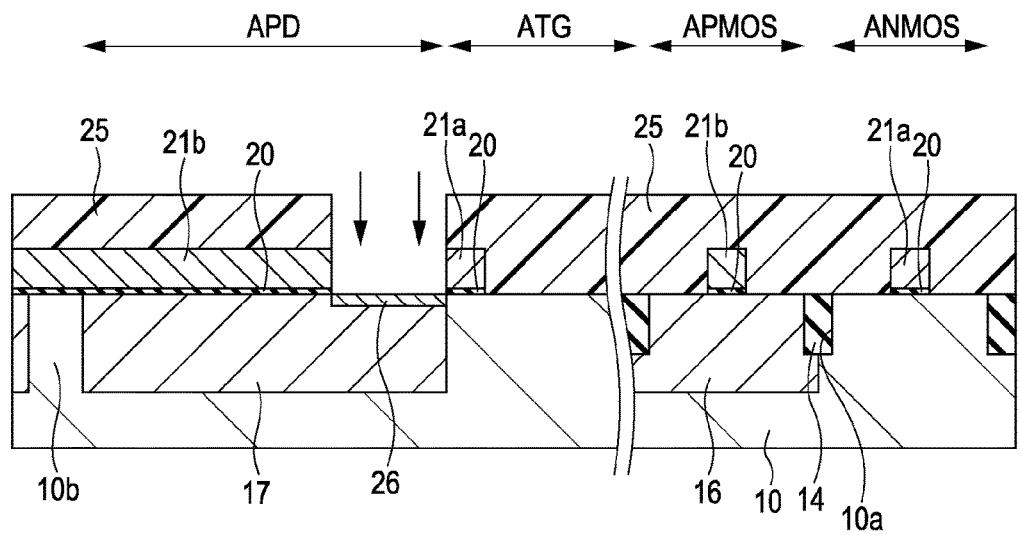
FIGS. 7A and 7B are sectional views illustrating manufacturing processes of a method of manufacturing a solid-state imaging device according to the first embodiment of the present invention.

Next, as illustrated in FIG. 7A, for example, a resist layer 25 is formed, which is the end portion of the photodiode area APD and opens the area neighboring the transfer gate area ATG. By ion-injecting the P-type impurities such as B using the resist layer 25 as a mask, a P-type semiconductor layer 26 which forms a portion of the PN junction as the semiconductor area 17 that becomes the photodiode is formed on the surface layer of the semiconductor area 17 in the end portion of the photodiode area APD. For example, the P-type semiconductor layer 26 is formed with a combination of implantation energy of 0.2 to 10 keV and ion implantation of doze amount of $1\times10^{12}$ to $5\times10^{13}/cm^2$.

Figure 7B:
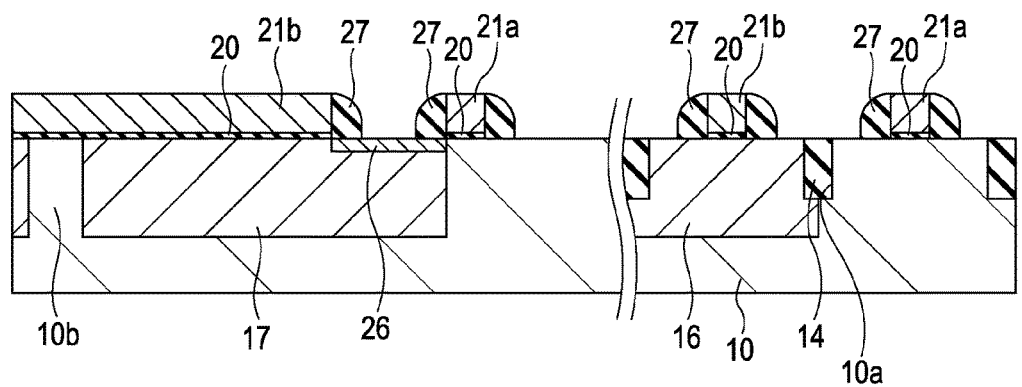

Next, as illustrated in FIG. 7B, a silicon oxide layer of 5 to 30 nm and a silicon nitride layer of 30 to 100 nm are laminated on the whole surface by the CVD method, and the etch back process is performed on the front surface. Accordingly, in the photodiode area APD, the transfer gate area ATG, the NMOS transistor area ANMOS, and the PMOS transistor area APMOS, a side wall insulating layer 27 is formed on the side surfaces of the N-type conduction layer 21a and the P-type conduction layer 21b.

The above-described etch back process, for example, may be an anisotropic etching process such as RIE (Reactive Ion Etching) by plasma of a mixed gas of $CF_4+O_2$.

The width W between the conduction layer 21b that is the inversion layer induction electrode and the conduction layer 21a that is the transfer gate electrode may be entirely filled up with the side wall insulating layer 27.

Figure 8A:
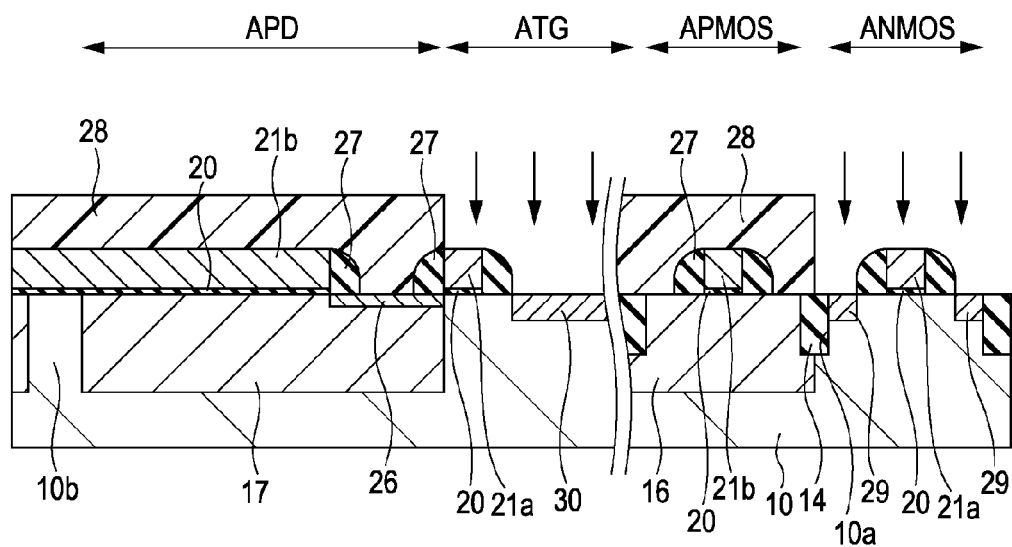
FIGS. 8A and 8B are sectional views illustrating manufacturing processes of a method of manufacturing a solid-state imaging device according to the first embodiment of the present invention.

Next, as illustrated in FIG. 8A, for example, a resist layer 28 for protecting the photodiode area APD and the PMOS transistor area APMOS is formed to be patterned. Next, the N-type conductive impurities such as P or the like are introduced using the resist layer 28 as a mask. On the NMOS transistor area ANMOS, the N-type semiconductor layer 29 that is the N-type source/drain area is formed. Also, on the transfer gate area ATG, the N-type semiconductor layer 30 that is the floating diffusion is formed. Here, the N-type semiconductor layer is formed, for example, with a combination of implantation energy of 5 to 20 keV and a doze amount of $1\times10^{15}$ to $5\times10^{15}/cm^2$.

Figure 8B:
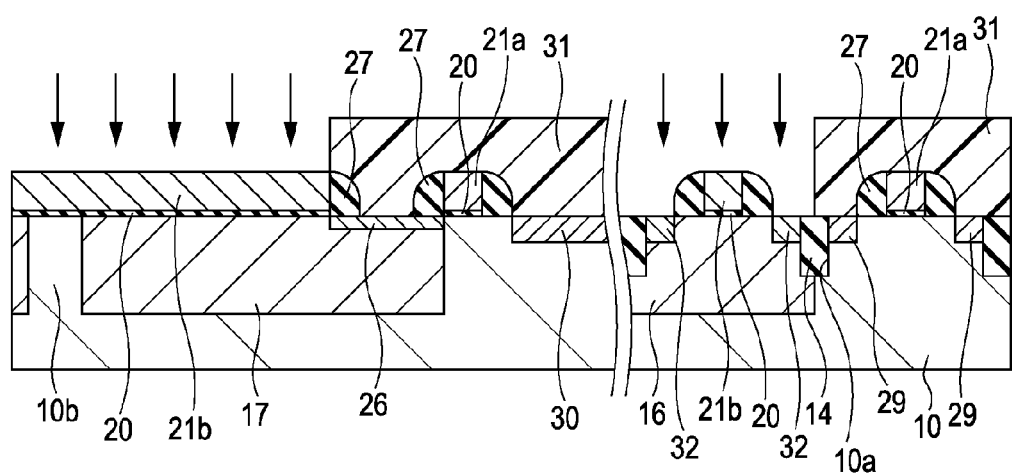

Next, as illustrated in FIG. 8B, for example, a resist layer 31 for protecting the transfer gate area ATG, the end portion (the area of the semiconductor layer 26) neighboring the transfer gate area ATG of the photodiode area APD, and the NMOS transistor area ANMOS is formed to be patterned. Then, using the resist layer 31 as a mask, the P-type conductive impurities such as B and the like are introduced. On the PMOS transistor area APMOS, the P-type semiconductor layer 32 that is the P-type source/drain area is formed. Also, in the photodiode area APD, the concentration of the P-type impurities in the P-type conduction layer 21b is heightened. Here, for example, the P-type semiconductor layer 32 is formed with a combination of implantation energy of 2 to 8 keV and ion implantation of doze amount of $1\times10^{15}$ to $5\times10^{15}/cm^2$.

After the ion implantation as described above, the impurities are activated by performing an RTA (Rapid Thermal Annealing) process at 1000 to 1100° C. and for about 0 to 20 seconds to remove the defects.

As the following processes, for example, if the light incident surface is on the rear surface side (direction A in FIG. 2B) of the substrate, thin filming of the substrate is performed by grinding the other surface of the substrate, and if necessary, a color filter and the like are formed on the rear surface side of the substrate. Further, an optical guide or an on-chip lens may be installed.

If the light incident surface is on the surface side (direction B in FIG. 2B) of the substrate, if necessary, an optical guide is installed inside the insulating layer on the substrate, and a color filter and an on-chip lens are formed on an upper layer thereof.

Through the above-described processes, the CMOS sensor configured as illustrated in FIGS. 2A and 2B can be manufactured.

According to the method of manufacturing a solid-state imaging device according to this embodiment, the inversion layer induction electrode is formed in the area covering a portion or the whole of the photodiode, and the inversion layer is induced, which is formed by accumulating the second conductivity type carrier on the surface of the inversion layer induction electrode side of the semiconductor area. Accordingly, the solid-state imaging device can be manufactured.

Also, it is possible to perform heat treatment for removing the defect introduced through the gate etching and side wall etch back. Also, the conduction layer itself, which is the inversion layer induction electrode covering the photodiode, suppresses the introduction of the defect into the photodiode area in the etching process.

Accordingly, the increase of the dark current is avoided, and thus the yield deterioration can be suppressed.

<First Modification>
[Pushing Out of Signal Charges by an Applied Voltage to an Inversion Layer Induction Electrode]

In the first embodiment, the applied voltage to the inversion layer induction electrode is configured basically at a predetermined negative voltage, and the applied voltage may be changed at a certain timing as in this modification.

Figure 9:
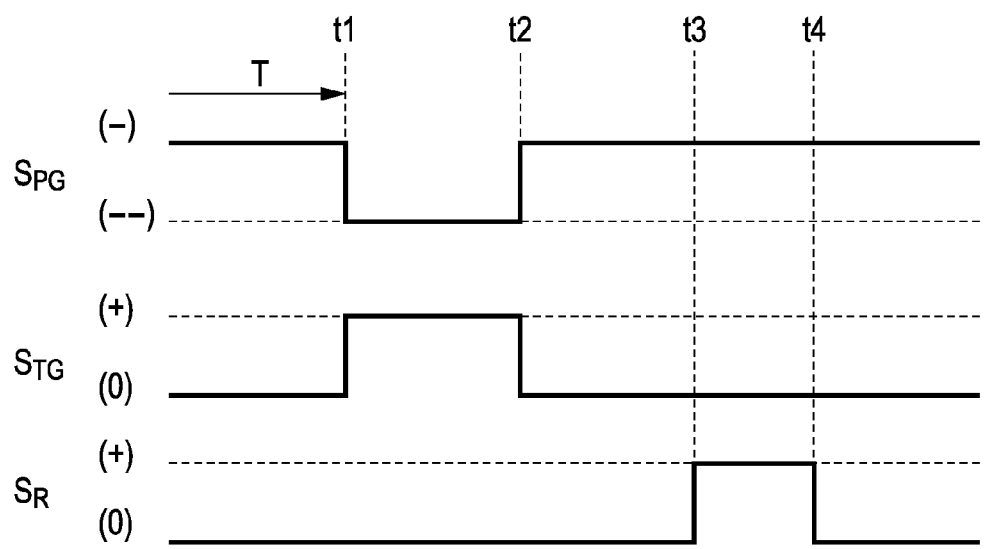
FIG. 9 is a timing diagram of an applied voltage of a solid-state imaging device according to a first modification of the present invention.

FIG. 9 is a timing diagram of an applied voltage of a solid-state imaging device according to a modification of the present invention. SPG denotes the applied voltage to the inversion layer induction electrode, STG denotes the applied voltage to the transfer gate electrode, and SR denotes the applied voltage to the gate of the reset transistor.

In a charge accumulation period T of a certain field, a predetermined negative voltage (−) is applied as the applied voltage SPG to the inversion layer induction electrode. The transfer gate is closed in the case where the applied voltage STG to the transfer gate electrode is zero.

In the time t1 when a charge accumulation period T is ended, the accumulated signal charges are transmitted to the floating diffusion through opening of the transfer gate by making the applied voltage STG to the transfer gate electrode (+). Here, by applying much higher negative voltage (−) as the applied voltage SPG to the inversion layer induction electrode, a potential that sufficiently pushes the signal charges to the floating diffusion can be formed. By doing this, the signal charges in the photodiode can be depleted.

In the time t2 when the transmission of the signal charges is ended, the applied voltage STG to the transfer gate electrode is returned to zero and the applied voltage SPG to the inversion layer induction electrode is returned to the predetermined negative voltage (−).

In the time t3 when the reset operation starts, the signal charges are removed by making the applied voltage SR to the gate of the reset transistor (+).

From the time t4 when the reset operation is ended, the charge accumulation period of the next field starts.

<Second Modification>

[Modification of Gate Electrode Processing]

Figure 10A:
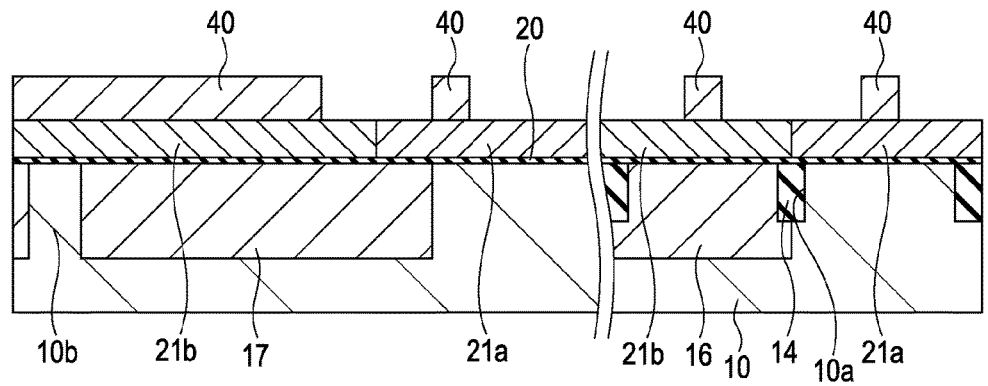
FIGS. 10A to 10C are sectional views illustrating manufacturing processes of a method of manufacturing a solid-state imaging device according to a second modification of the present invention.
Figure 10B:
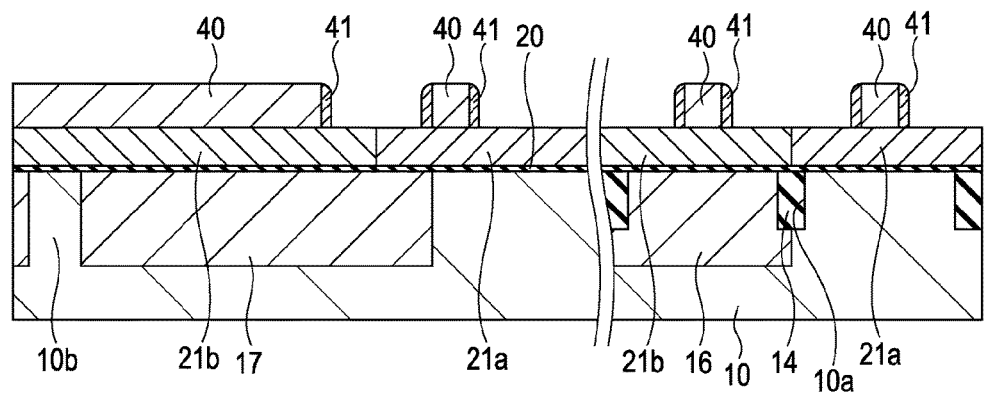
Figure 10C:
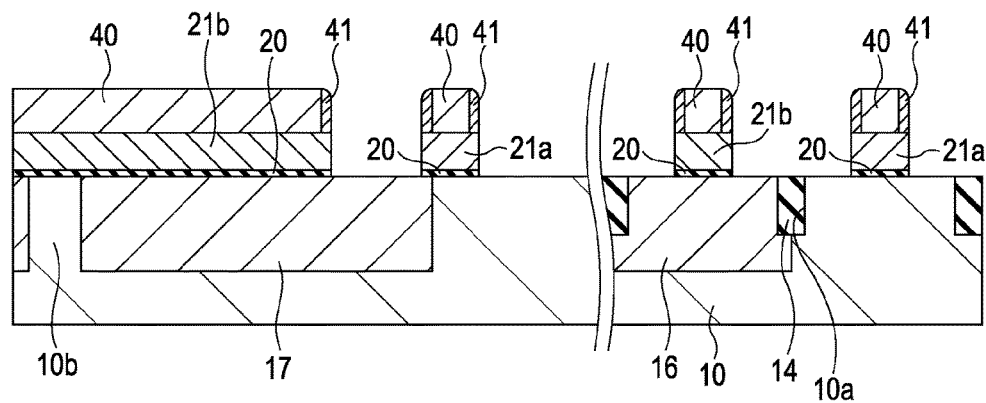

FIGS. 10A to 10C are sectional views illustrating manufacturing processes of a method of manufacturing a solid-state imaging device according to a second modification of the present invention.

Processes up to FIG. 5B are the same as those described according to the above-described embodiments.

Next, as illustrated in FIG. 10A, for example, a hard mask 40 is formed to be patterned on the conduction layer 21a and the conduction layer 21b.

The hard mask 40 has patterns of the inversion layer induction electrode of the photodiode area APD, the transfer gate electrode of the transfer gate area ATG, the gate electrodes of the NMOS transistor area ANMOS and the PMOS transistor area APMOS. These patterns can be obtained, for example, by forming a silicon nitride layer and etching the silicon nitride layer with the above-described pattern.

Next, as illustrated in FIG. 10B, a side wall 41 is formed on the side portion of the hard mask 40. This can be formed by accumulating the silicon nitride layer over the whole surface and performing etch back thereof.

Next, as illustrated in FIG. 10C, a pattern is processed by etching the conduction layers 21a and 21b using the hard mask 40 and the side wall 41 as a mask. The width between the conduction layer 21b that is the inversion layer induction electrode and the conduction layer 21a that is the transfer gate electrode may be formed to be narrower than that according to the minimum design rule that can be processed.

After the above-described processes, the gate electrode as in the first embodiment can be manufactured by removing the hard mask 40 and the side wall 41.

Second Embodiment

[Plan View of a Solid-State Imaging Device]

Figure 11:
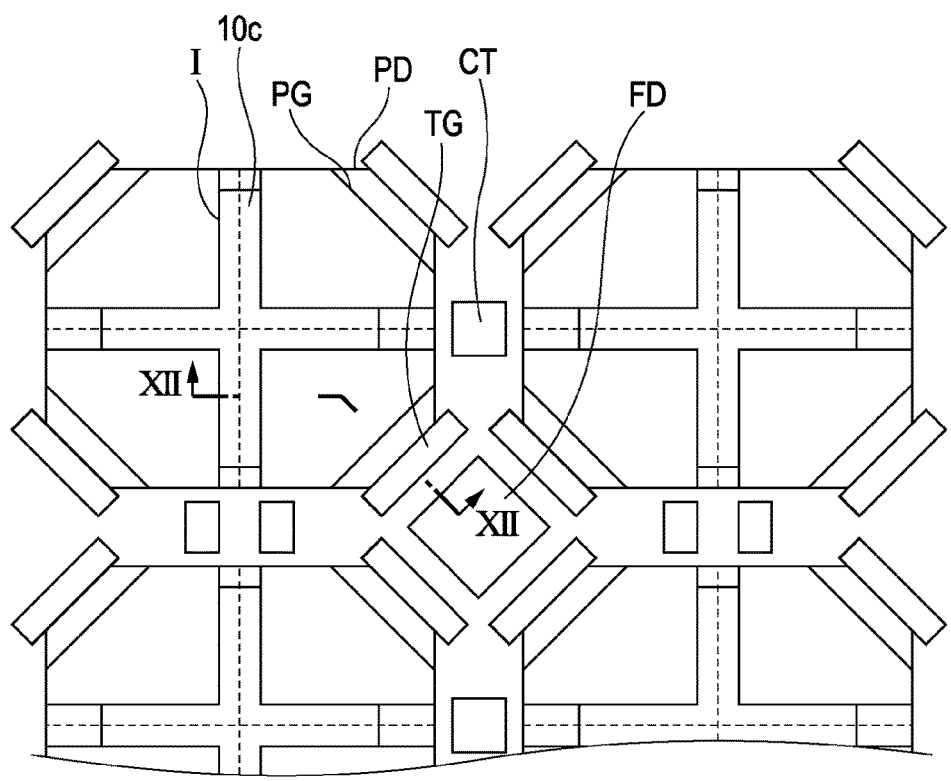
FIG. 11 is a plan view of a solid-state imaging device according to a second embodiment of the present invention.
Figure 12A:
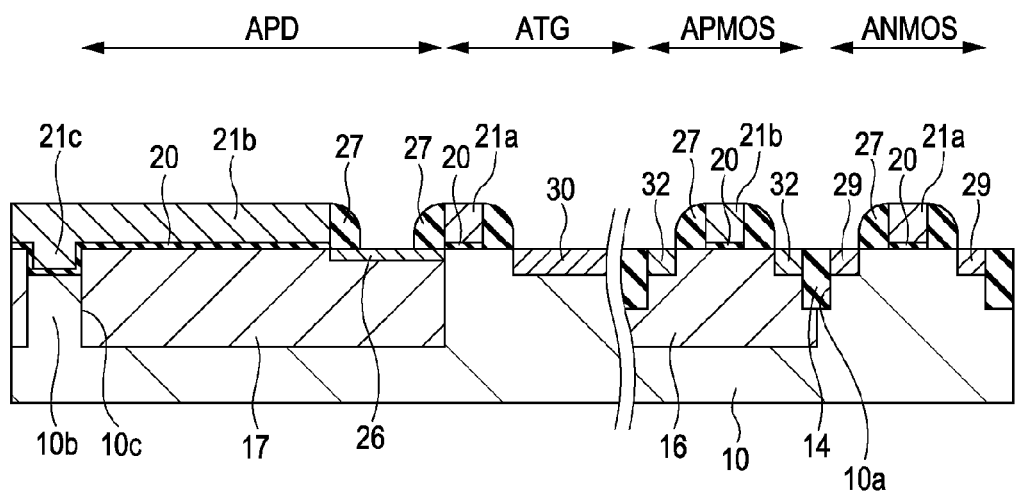
FIGS. 12A and 12B are sectional views of a solid-state imaging device according to a second embodiment of the present invention.

FIG. 11 is a plan view of a CMOS image sensor that is a solid-state imaging device according to a second embodiment of the present invention. FIG. 12A is a sectional view of a solid-state imaging device according to a second embodiment of the present invention. For example, the sectional view taken along line XI-XI of FIG. 11 corresponds to the photodiode area APD and the transfer gate area ATG indicated along line XIIA-XIIA of FIG. 12A.

A concave portion 10c for exposing the side surface of the semiconductor area 17 is formed on the semiconductor substrate in an element isolation area I 10b that divides a photodiode for each pixel. On the side surface of the semiconductor area 17, the conduction layer 21b that is the inversion layer induction electrode is formed via the gate insulting layer 20.

Figure 12B:
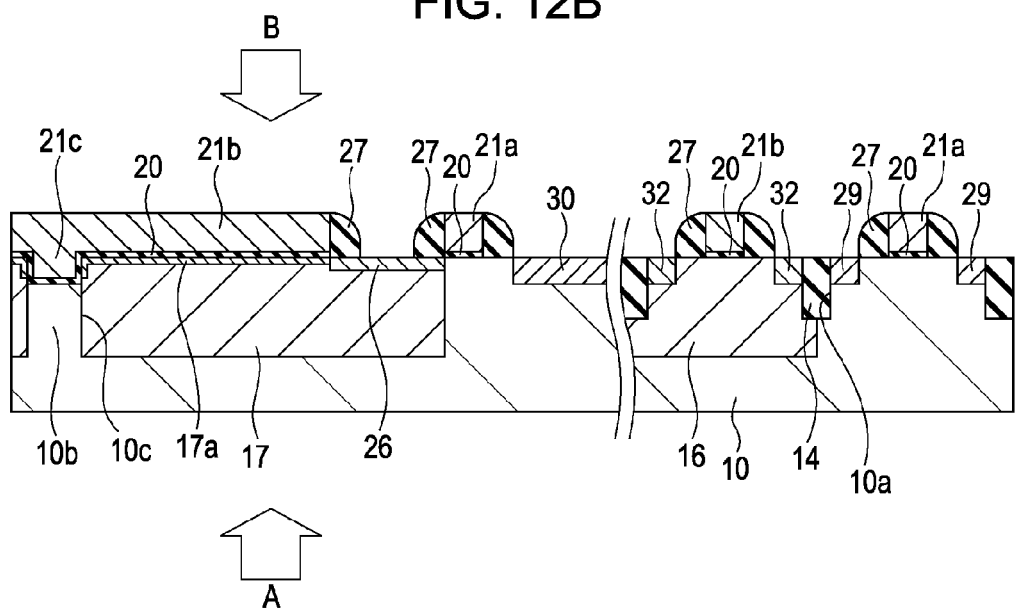

FIG. 12B is a sectional view of a solid-state imaging device according to this embodiment of the present invention.

Although substantially the same as that in FIG. 12A, FIG. 12B shows that the inversion layer 17a is induced on the surface of the conduction layer side 21b that is made of P-type polysilicon, which is the inversion layer induction electrode of the N-type semiconductor area 17.

Here, as described above, the concave portion 10c for exposing the side surface of the semiconductor area 17 is formed on the semiconductor substrate in the element isolation area I 10b, and the conduction layer 21b is formed in the concave portion 10c via the gate insulating layer 20. Accordingly, the inversion layer 17a is induced from the side surface of the semiconductor area.

Except for that described above, the solid-state imaging device according to the second embodiment is substantially the same as that of the first embodiment.

According to the solid-state imaging device according to this embodiment, the inversion layer induction electrode is formed in the area covering a portion or the whole of the photodiode, and the inversion layer is induced, which is formed by accumulating the second conductivity type carrier on the surface of the inversion layer induction electrode side of the semiconductor area. Accordingly, the dynamic range can be improved by steepening the PN junction.

Also, in the method of manufacturing a solid-state imaging device to be described later, it is possible to perform heat treatment for removing the defect introduced through the gate etching and side wall etch back. Also, the conduction layer itself, which is the inversion layer induction electrode covering the photodiode, suppresses the introduction of the defect to the photodiode area in the etching process. Accordingly, the increase of the dark current is avoided, and thus the yield deterioration can be suppressed.

[Method of Manufacturing a Solid-State Imaging Device]

FIGS. 13A to 20B are sectional views illustrating manufacturing processes of a method of manufacturing a solid-state image device according to this embodiment of the present invention. With reference to these drawings, a method of manufacturing a CMOS image sensor that is the solid-state imaging device according to this embodiment of the present invention will be described.

The drawings are sectional views corresponding to FIGS. 12A and 12B, and show a photodiode area APD, a transfer gate area ATG, an NMOS transistor area ANMOS, and a PMOS transistor area APMOS.

Figure 13A:
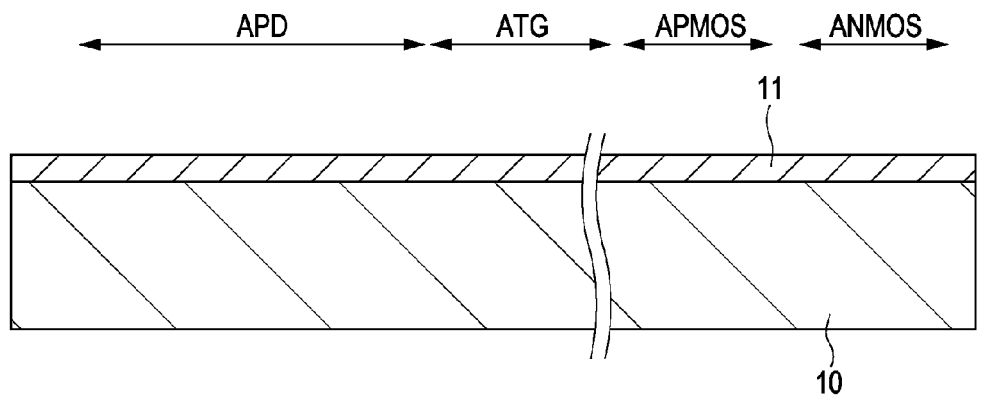
FIGS. 13A to 13C are sectional views illustrating manufacturing processes of a method of manufacturing a solid-state imaging device according to the second embodiment of the present invention.

First, as shown in FIG. 13A, for example, a hard mask 11 is formed on the semiconductor substrate 10 by accumulating silicon nitride over the whole surface with a layer thickness of 100 to 250 nm by a CVD method.

The semiconductor substrate 10 may be a silicon substrate of a bulk or may be an SOI substrate.

Figure 13B:
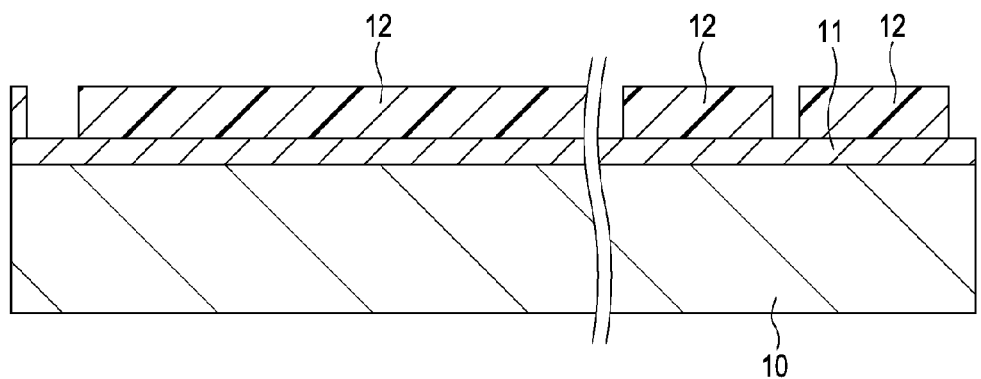

Next, as illustrated in FIG. 13B, for example, a resist layer 12 for opening the element isolation area of the NMOS transistor area ANMOS and the PMOS transistor area APMOS and the element isolation area of the photodiode area APD is formed to be patterned.

Figure 13C:
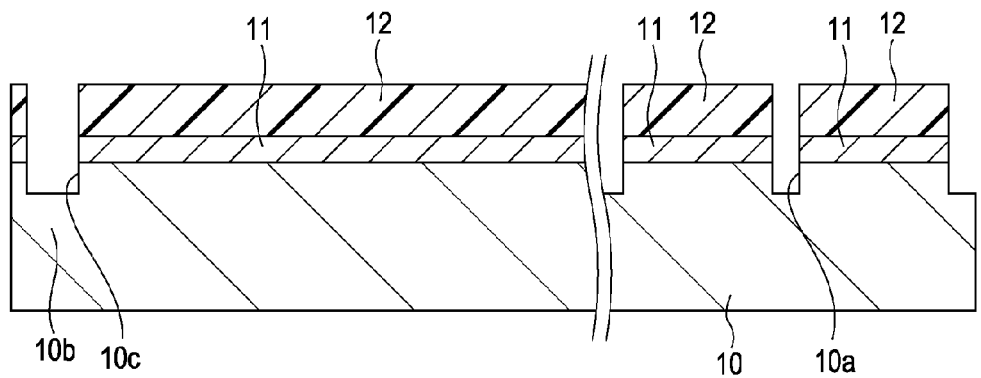

Next, as illustrated in FIG. 13C, for example, the hard mask 11 is pattern-etched using the resist layer 12 as a mask. Further, in the NMOS transistor area ANMOS and the PMOS transistor area APMOS, an element isolation groove 10a is formed on the surface layer of the semiconductor substrate 10. Also, the concave portion 10c is formed even in the element isolation area 10b of the photodiode area APD.

The etching is performed by, for example, an RIE with a mixed gas of $CF_4+O_2$, and the depth of the element isolation groove 10a and the concave portion 10c is 0 to 300 nm.

Figure 14A:
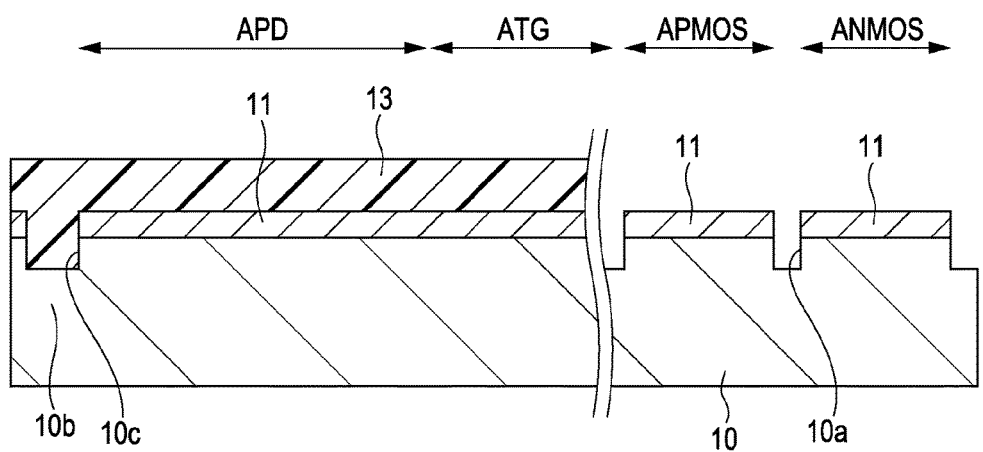
FIGS. 14A and 14B are sectional views illustrating manufacturing processes of a method of manufacturing a solid-state imaging device according to the second embodiment of the present invention.

Next, as illustrated in FIG. 14a, for example, the resist layer 12 is removed, and then a resist layer 13 for opening the NMOS transistor area ANMOS and the PMOS transistor area APMOS is formed to be patterned.

Figure 14B:
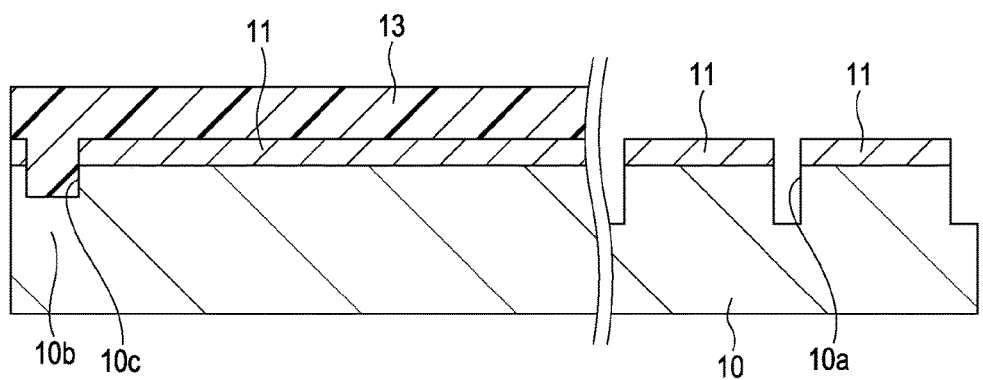

Next, as illustrated in FIG. 14B, for example, the element isolation groove 10a in the NMOS transistor area ANMOS and the PMOS transistor area APMOS is processed to have a large depth using the resist layer 13 as a mask.

The etching is performed by, for example, an RIE with a mixed gas of $Cl_2+O_2$, and the depth of the element isolation groove 10a and the concave portion 10c is 200 to 500 nm in addition to the previous etching.

Figure 15A:
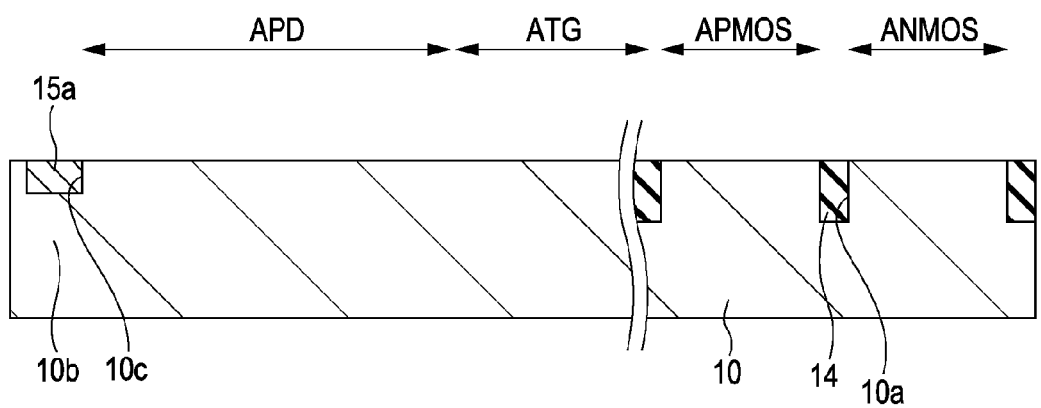
FIGS. 15A and 15B are sectional views illustrating manufacturing processes of a method of manufacturing a solid-state imaging device according to the second embodiment of the present invention.

Next, as illustrated in FIG. 15A, for example, silicon oxide is accumulated over the whole surface with a thickness of 200 to 800 nm by filling the silicon oxide in the element isolation groove 10a and the concave portion 10c by the CVD method. Then, the silicon oxide accumulated on the outside of the element isolation groove 10a and the concave portion 10c is removed for planarization by CMP.

Through the above-described processes, the element isolation insulating layer 14 which is filled in the device separation groove 10a is formed. Also, a dummy layer 15a is formed on the concave portion 10c.

Further, the hard mask 11 of the silicon nitride is removed by a hot phosphorus process. The amount of projection from the semiconductor substrate 10 of the element isolation insulating layer 14 is adjusted by a thin hydrofluoric acid (HF) process after the CMP process.

Figure 15B:
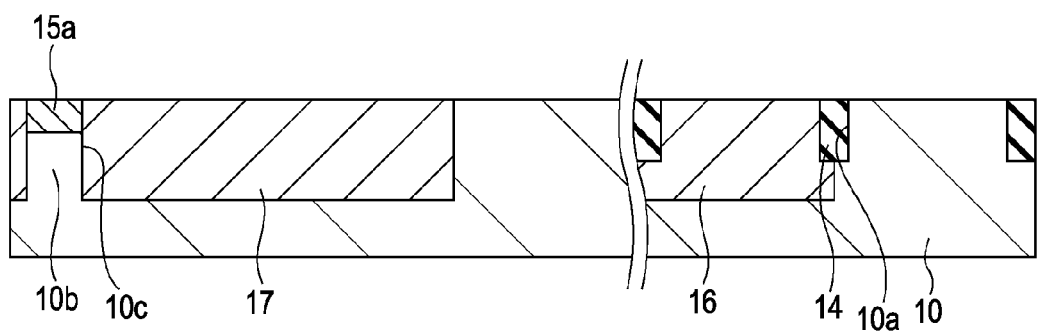

Next, as illustrated in FIG. 15B, for example, N-type well 16 is formed by ion implantation of N-type impurities into the PMOS transistor area APMOS. In forming the N-type well 16, P is formed with a combination of implantation energy of 0.2 to 1000 keV and ion implantation of doze amount of $1\times10^{11}$ to $1\times10^{13}/cm^2$.

Also, in the photodiode area APD, the N-type semiconductor area 17 that forms the photodiode is formed. For example, in forming the N-type semiconductor area 17, P is formed with a combination of implantation energy of 50 to 3000 keV and ion implantation of doze amount of $1\times10^{11}$ to $1\times10^{13}/cm^2$.

Also, if necessary, a well, channel impurities, and impurities for element isolation may be ion-injected.

In forming the semiconductor area 17, due to the above-described reason, it is preferable that the effective concentration of the N-type impurities has a smooth concentration gradient, that is, becomes higher as being closer to the surface of the semiconductor substrate.

Figure 16A:
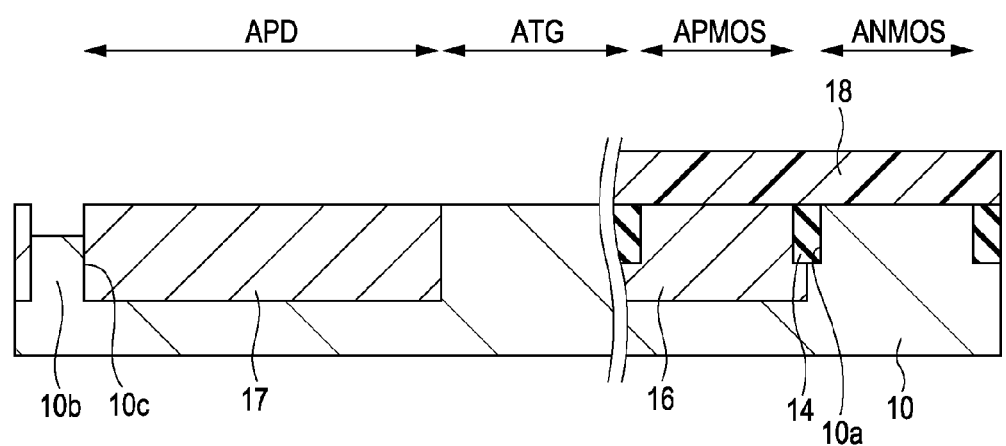
FIGS. 16A and 16B are sectional views illustrating manufacturing processes of a method of manufacturing a solid-state imaging device according to the second embodiment of the present invention.

Next, as illustrated in FIG. 16A, for example, a resist layer 18 for protecting the NMOS transistor area ANMOS and the PMOS transistor area APMOS and opening the photodiode area APD and the transfer gate area ATG is formed to be patterned.

Next, for example, the dummy layer 15a of silicon oxide is removed by performing a wet etching process with thin hydrofluoric acid using the resist layer 18 as a mask. Accordingly, the concave portion 10c for exposing the side surface of the semiconductor area 17 is formed.

Figure 16B:
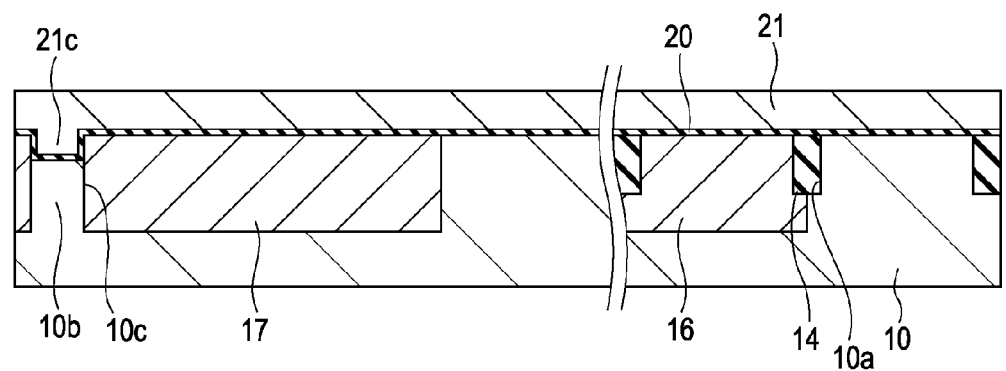

Next, as illustrated in FIG. 16B, for example, in the photodiode area APD, the transfer gate area ATG, the NMOS transistor area ANMOS, and the PMOS transistor area APMOS, the gate insulating layer 20 is formed on the surface of the semiconductor substrate 10. The gate insulting layer 20, for example, may be formed by forming a silicon oxide layer by a thermal oxidation method or a CVD method. In this case, the gate insulating layer 20 is formed to cover the side surface of the semiconductor area 17 in the concave portion 10c.

Next, a polysilicon layer 21 is formed on the upper layer of the gate insulating layer 20 with a layer thickness of 80 to 250 nm by the CVD method. In this case, the polysilicon layer 21 is formed to have a filling layer 21c that fills the upper layer of the gate insulating layer 20 in the concave portion 10c.

Figure 17A:
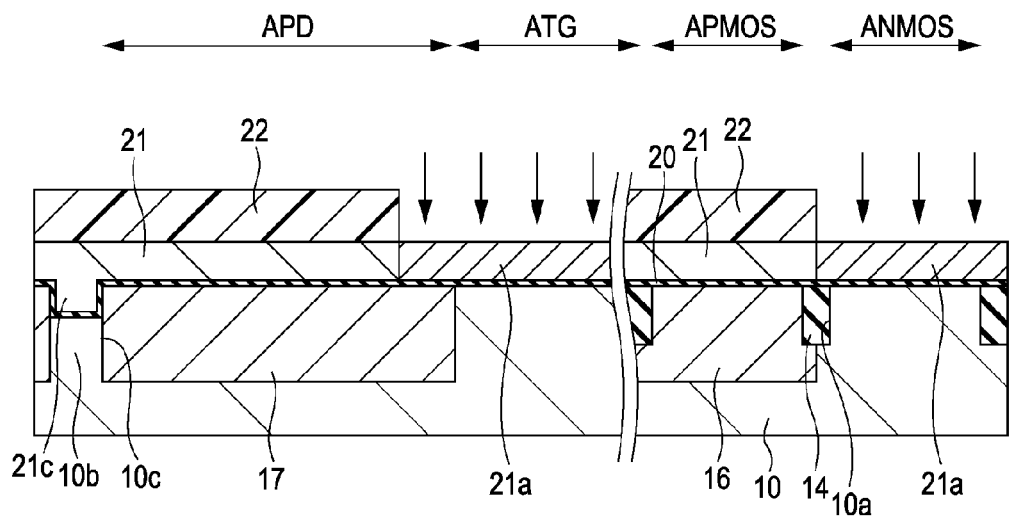
FIGS. 17A and 17B are sectional views illustrating manufacturing processes of a method of manufacturing a solid-state imaging device according to the second embodiment of the present invention.

Next, as illustrated in FIG. 17A, for example, a resist layer 22 for protecting the photodiode area APD and the PMOS transistor area APMOS is formed to be patterned. Using the resist layer 22 as a mask, in the transfer gate area ATG and the NMOS transistor area ANMOS, the N-type conduction layer 21a is formed by introducing N-type conductive impurities such as P or the like onto the polysilicon layer 21. For example, in forming the N-type conduction layer 21a, P is formed with a combination of implantation energy of 5 to 30 keV and ion implantation of doze amount of 0 to $1\times10^{15}/cm^2$.

Figure 17B:
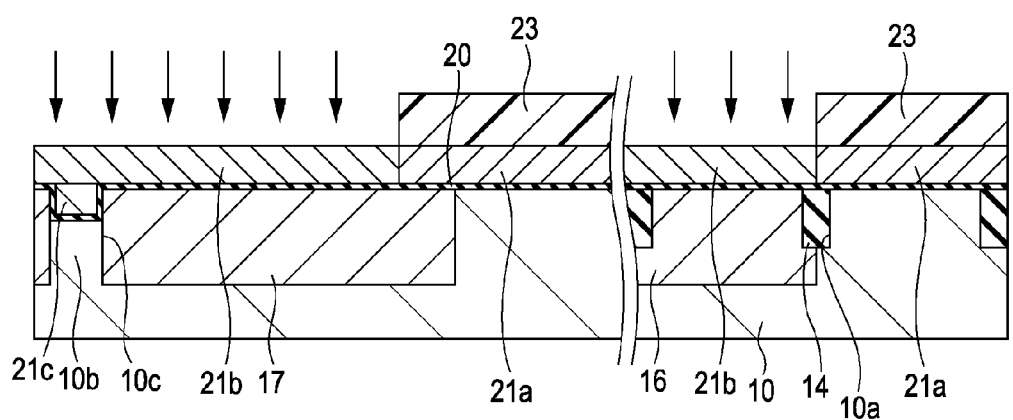

Next, as illustrated in FIG. 17B, for example, a resist layer 23 for protecting the transfer gate area ATG and the NMOS transistor area ANMOS is formed to be patterned. Using the resist layer 23 as a mask, in the photodiode area APD and the PMOS transistor area APMOS, the P-type conduction layer 21b is formed by introducing P-type conductive impurities such as B or the like onto the polysilicon layer 21. For example, in forming the P-type conduction layer 21b, B is formed with a combination of implantation energy of 3 to 15 keV and ion implantation of doze amount of $1\times10^{16}/cm^2$.

In the drawing, a state where P-type conductive impurities are not diffused up to the filling layer 21c inside the concave portion 10c.

Figure 18A:
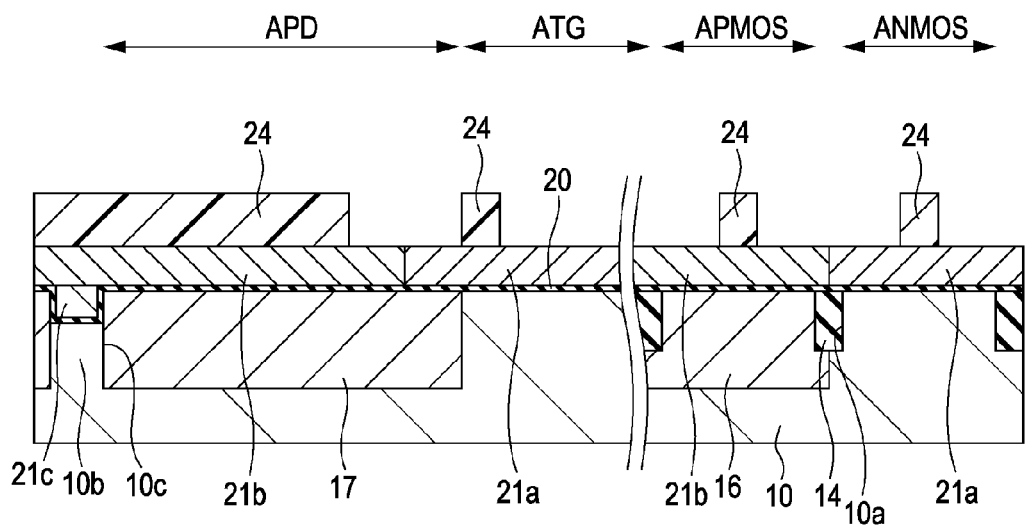
FIGS. 18A and 18B are sectional views illustrating manufacturing processes of a method of manufacturing a solid-state imaging device according to the second embodiment of the present invention.

Next, as illustrated in FIG. 18A, for example, a resist layer 24 is formed to be patterned on the conduction layer 21a and the conduction layer 21b.

The resist layer 24 has patterns of the inversion layer induction electrode of the photodiode area APD, the transfer gate electrode of the transfer gate area ATG, and the gate electrodes of the NMOS transistor area ANMOS and the PMOS transistor area APMOS.

Figure 18B:
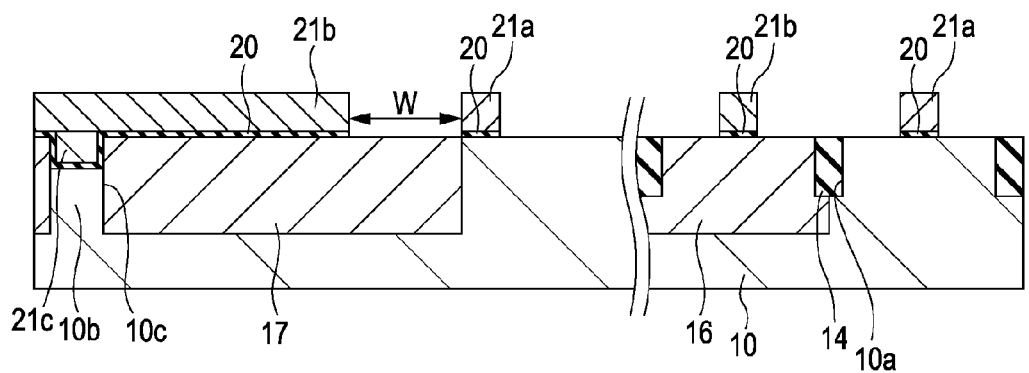

Next, as illustrated in FIG. 18B, for example, an etching process is performed using the resist layer 24 as a mask. The etching process may be, for example, an anisotropic etching process such as RIE (Reactive Ion Etching) by plasma of a mixed gas of $Cl_2+O_2$.

As described above, the conduction layer 21b that is the inversion layer induction electrode, the conduction layer 21a that is the transfer gate electrode, the conduction layer 21a that is the gate electrode of the NMOS transistor, and the conduction layer 21b that is the gate electrode of the PMOS transistor are formed to be patterned. The conduction layer 21b that is the inversion layer induction electrode is integrally formed with the conduction layer 21b that is the inversion layer induction electrode on the photodiode of the neighboring pixel.

In the above-described etching process, the gate insulting layer 20 is processed in the same pattern as that of the respective conduction layers 21a and 21b.

Here, it is sufficient if the width W between the conduction layer 21b that is the inversion layer induction electrode and the conduction layer 21a that is the transfer gate electrode is a distance in which the P-type conduction layer

21b and the N-type conduction layer 21a are sufficiently separable. For example, the width W may be formed by a minimum design rule that can be processed, and may be, for example, 50 to 300 nm.

Figure 19A:
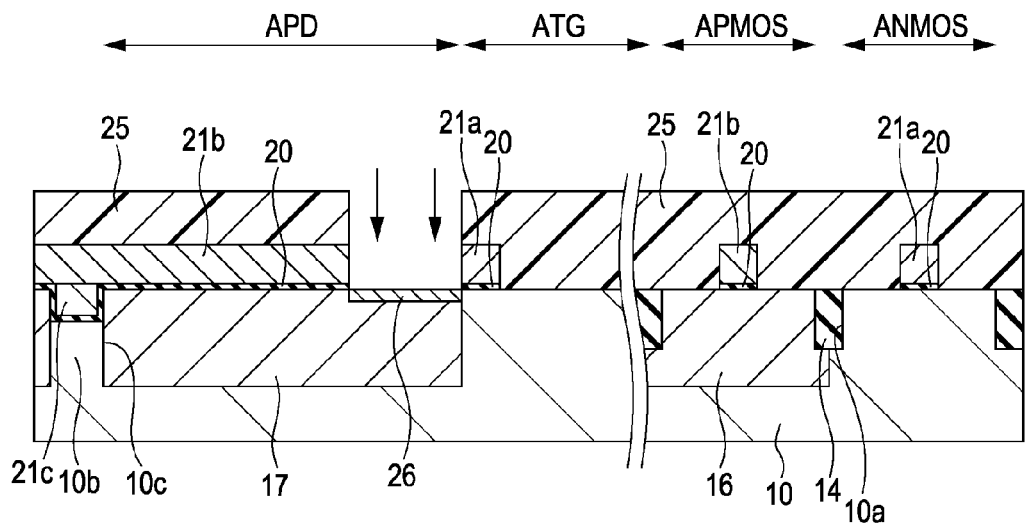
FIGS. 19A and 19B are sectional views illustrating manufacturing processes of a method of manufacturing a solid-state imaging device according to the second embodiment of the present invention.

Next, as illustrated in FIG. 19A, for example, a resist layer 25 is formed, which is the end portion of the photodiode area APD and opens the area neighboring the transfer gate area ATG. By ion-injecting the P-type impurities such as B using the resist layer 25 as a mask, a P-type semiconductor layer 26, which forms a portion of the PN junction that becomes the photodiode as the semiconductor area 17, is formed on the surface layer of the semiconductor area 17 in the end portion of the photodiode area APD. For example, the P-type semiconductor layer 26 is formed with a combination of implantation energy of 0.2 to 10 keV and ion implantation of doze amount of $1 \times 10^{12}$ to $1 \times 10^{13}/cm^2$.

Figure 19B:
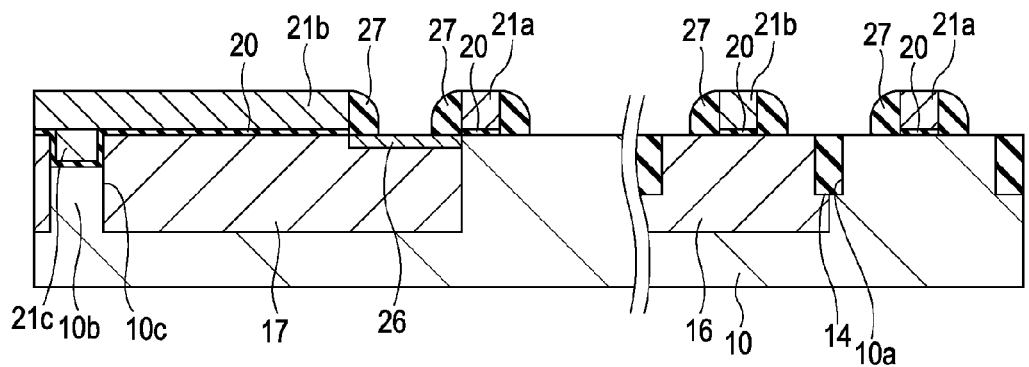

Next, as illustrated in FIG. 19B, for example, a silicon oxide layer of 5 to 30 nm and a silicon nitride layer of 30 to 100 nm are laminated on the whole surface by the CVD method, and the etch back process is performed on the front surface thereof. Accordingly, in the photodiode area APD, the transfer gate area ATG, the NMOS transistor area ANMOS, and the PMOS transistor area APMOS, a side wall insulating layer 27 is formed on the side surfaces of the N-type conduction layer 21a and the P-type conduction layer 21b.

The above-described etch back process, for example, may be an anisotropic etching process such as RIE (Reactive Ion Etching) by plasma of a mixed gas of $CF_4 + O_2$.

The width W between the conduction layer 21b that is the inversion layer induction electrode and the conduction layer 21a that is the transfer gate electrode may be entirely filled up with the side wall insulating layer 27.

Figure 20A:
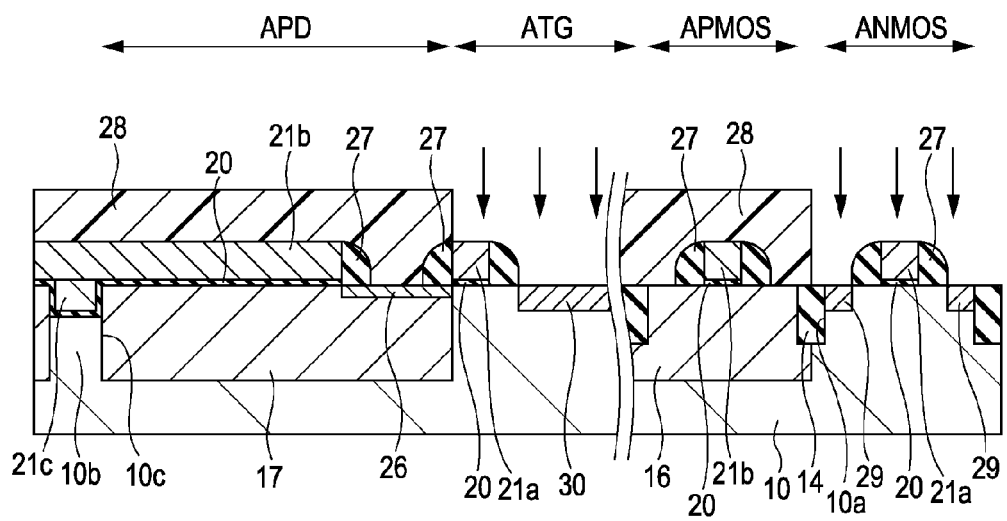
FIGS. 20A and 20B are sectional views illustrating manufacturing processes of a method of manufacturing a solid-state imaging device according to the second embodiment of the present invention.

Next, as illustrated in FIG. 20A, for example, a resist layer 28 for protecting the photodiode area APD and the PMOS transistor area APMOS is formed to be patterned. Next, the N-type conductive impurities such as P or the like are introduced using the resist layer 28 as a mask. On the NMOS transistor area ANMOS, the N-type semiconductor layer 29 that is the N-type source/drain area is formed. Also, on the transfer gate area ATG, the N-type semiconductor layer 30 that is the floating diffusion is formed. Here, the N-type semiconductor layer is formed, for example, with a combination of implantation energy of 5 to 20 keV and a doze amount of $1 \times 10^{15}$ to $5 \times 10^{15}/cm^2$.

Figure 20B:
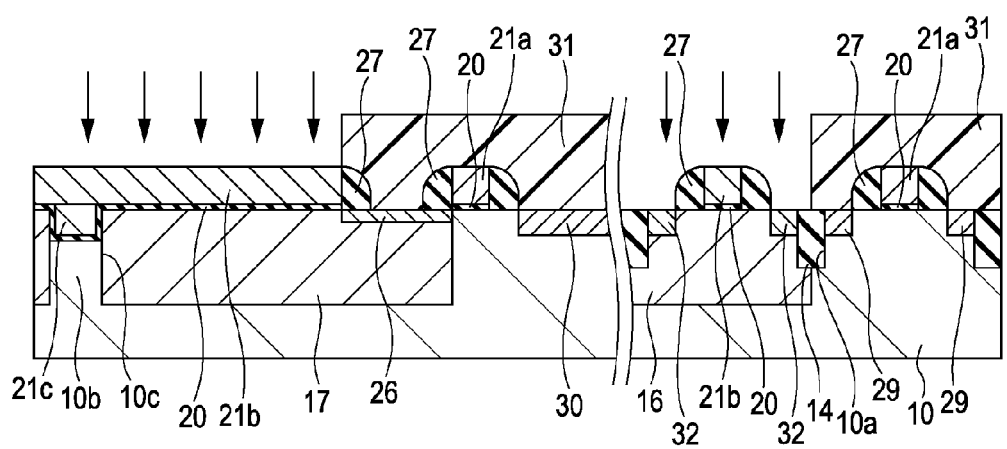

Next, as illustrated in FIG. 20B, for example, a resist layer 31 for protecting the transfer gate area ATG, the end portion (the area of the semiconductor layer 26) neighboring the transfer gate area ATG of the photodiode area APD, and the NMOS transistor area ANMOS is formed to be patterned. Then, using the resist layer 31 as a mask, the P-type conductive impurities such as B and the like are introduced. On the PMOS transistor area APMOS, the P-type semiconductor layer 32 that is the P-type source/drain area is formed. Also, on the photodiode area APD, the concentration of the P-type impurities inside the P-type conduction layer 21b is heightened. Here, for example, the P-type semiconductor layer 32 is formed with a combination of implantation energy of 2 to 8 keV and ion implantation of doze amount of $1 \times 10^{15}$ to $5 \times 10^{15}/cm^2$.

After the ion implantation as described above, the impurities are activated by performing an RTA (Rapid Thermal Annealing) process at 1000 to 1100° C. and for about 0 to 20 seconds to remove the defects. By the RTA process, the P-type conductive impurities are diffused up to the filling layer 21c inside the concave portion 10c.

As the following processes, for example, if the light incident surface is on the rear surface side (direction A in FIG. 12B) of the substrate, thin filming of the substrate is performed by grinding the rear surface of the substrate, and if necessary, a color filter and the like are further formed on the rear surface side of the substrate. Further, an optical guide or an on-chip lens may be installed.

If the light incident surface is on the surface side (direction B in FIG. 12B), if necessary, an optical guide is installed inside the insulating layer on the substrate, and a color filter and an on-chip lens are formed on the upper layer thereof.

Through the above-described processes, the CMOS image sensor configured as illustrated in FIGS. 12A and 12B can be manufactured.

According to the method of manufacturing a solid-state imaging device according to this embodiment, the inversion layer induction electrode is formed in the area covering a portion or the whole of the photodiode, and the inversion layer is induced, which is formed by accumulating the second conductivity type carrier on the surface of the inversion layer induction electrode side of the semiconductor area. Accordingly, the solid-state imaging device can be manufactured.

Also, it is possible to perform heat treatment for removing the defect introduced through the gate etching and side wall etch back. Also, the conduction layer itself, which is the inversion layer induction electrode covering the photodiode, suppresses the introduction of the defect into the photodiode area in the etching process.

Accordingly, the increase of the dark current is avoided, and thus the yield deterioration can be suppressed.

Third Embodiment

[Plan View of a Solid-State Imaging Device]

Figure 21:
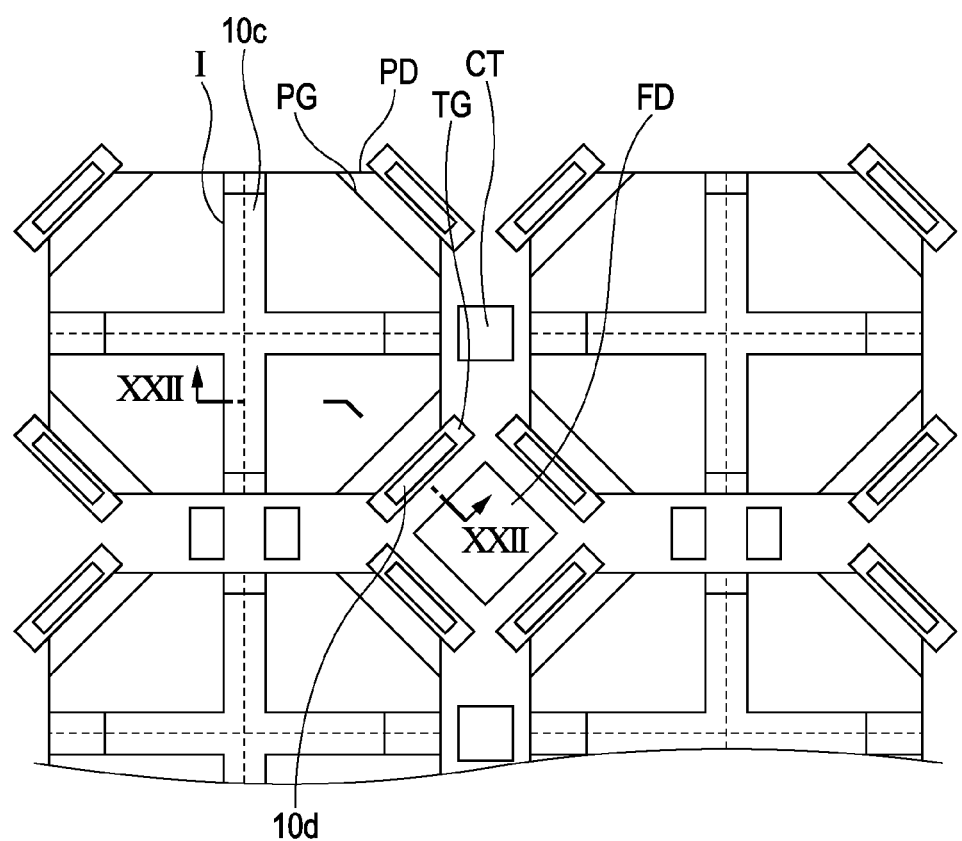
FIG. 21 is a plan view of a solid-state imaging device according to a third embodiment of the present invention.

FIG. 21 is a plan view of a CMOS image sensor that is a solid-state imaging device according to a third embodiment of the present invention. In this embodiment, the CMOS image sensor has a construction in which a groove is formed on a lower portion of the transfer gate.

Figure 22A:
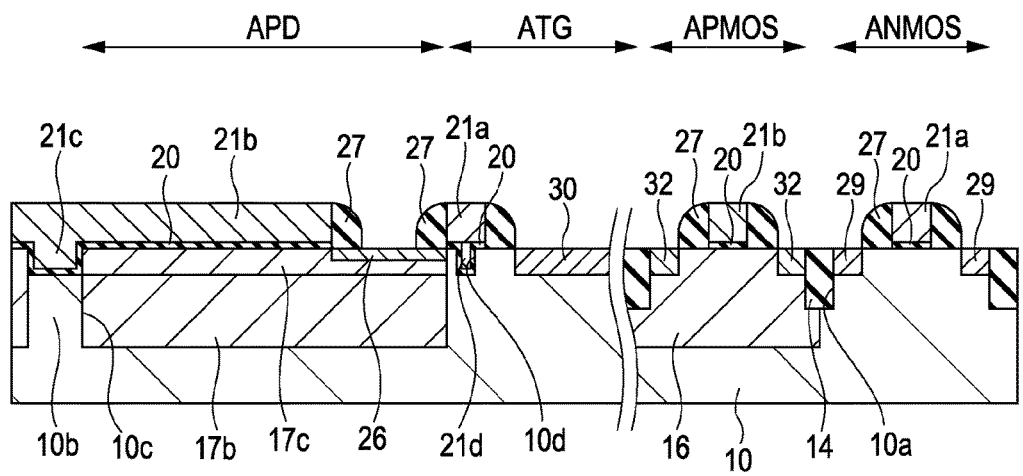
FIGS. 22A and 22B are sectional views of a solid-state imaging device according to a third embodiment of the present invention.

FIG. 21 is a plan view of a CMOS image sensor that is a solid-state imaging device according to this embodiment. Also, FIG. 22A is a sectional view of a solid-state imaging device according to this embodiment of the present invention. For example, the sectional view taken along line XXI-XXI of FIG. 21 corresponds to the photodiode area APD and the transfer gate area ATG indicated along line XXIIA-XXIIA of FIG. 22A.

A concave portion 10c for exposing the side surface of the semiconductor area 17 is formed on the semiconductor substrate in an element isolation area I 10b that divides a photodiode for each pixel. On the side surface of the semiconductor area 17, the conduction layer 21b that is the inversion layer induction electrode is formed via the gate insulting layer 20.

Figure 22B:
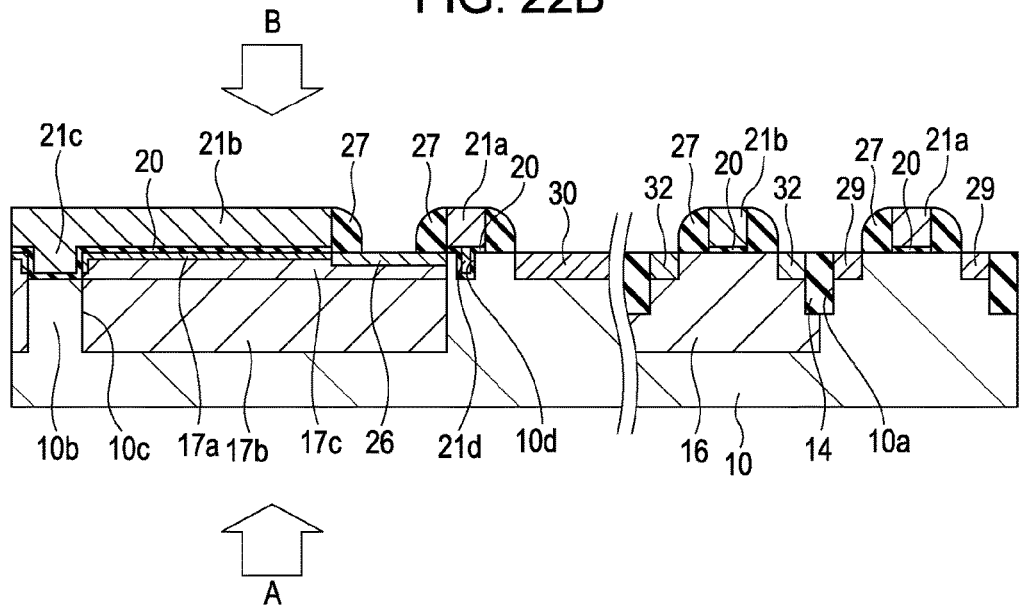

FIG. 22B is a sectional view of a solid-state imaging device according to this embodiment of the present invention.

Although substantially the same as that in FIG. 22A, FIG. 22B shows that the inversion layer 17a is induced on the surface of the conduction layer side 21b that is made of P-type polysilicon, which is the inversion layer induction electrode of the N-type semiconductor area 17.

Here, as described above, the concave portion 10c for exposing the side surface of the semiconductor area 17 is formed on the semiconductor substrate in the element isolation area I 10b, and the conduction layer 21b is formed in the concave portion 10c via the gate insulating layer 20. Accordingly, the inversion layer 17a is induced from the side surface of the semiconductor area.

Also, in the lower portion of the conduction layer 21a that is the transfer gate electrode, the concave portion 10d is formed on the semiconductor substrate 10, and the conduction layer 21a that is the transfer gate electrode is formed to be filled in the inside of the concave portion 10d via the gate insulating layer 20.

The filling layer 21d that is the conduction layer filled in the concave portion 10d functions as a so-called vertical gate, and can transmit signal charges accumulated in the photodiode to the floating diffusion more smoothly and accurately.

Also, in this embodiment, the N-type semiconductor area that forms the photodiode in the photodiode area APD includes a low-concentration area 17b having a low effective N-type impurity concentration and a high-concentration area 17c having a high effective N-type impurity concentration.

Except for that described above, the solid-state imaging device according to this embodiment is substantially the same as that of the first embodiment.

According to the solid-state imaging device according to this embodiment, the inversion layer induction electrode is formed in the area covering a portion or the whole of the photodiode, and the inversion layer is induced, which is formed by accumulating the second conductivity type carrier on the surface of the inversion layer induction electrode side of the semiconductor area. Accordingly, the dynamic range can be improved by steepening the PN junction.

Also, in the method of manufacturing a solid-state imaging device to be described later, it is possible to perform heat treatment for removing the defect introduced through the gate etching and side wall etch back. Also, the conduction layer itself, which is the inversion layer induction electrode covering the photodiode, suppresses the introduction of the defect to the photodiode area in the etching process. Accordingly, the increase of the dark current is avoided, and thus the yield deterioration can be suppressed.

[Method of Manufacturing a Solid-State Imaging Device]

FIGS. 23A to 30B are sectional views illustrating manufacturing processes of a method of manufacturing a solid-state image device according to this embodiment of the present invention. With reference to these drawings, a method of manufacturing a CMOS image sensor that is the solid-state imaging device according to this embodiment of the present invention will be described.

The drawings are sectional views corresponding to FIGS. 22A and 22B, and show a photodiode area APD, a transfer gate area ATG, an NMOS transistor area ANMOS, and a PMOS transistor area APMOS.

Figure 23A:
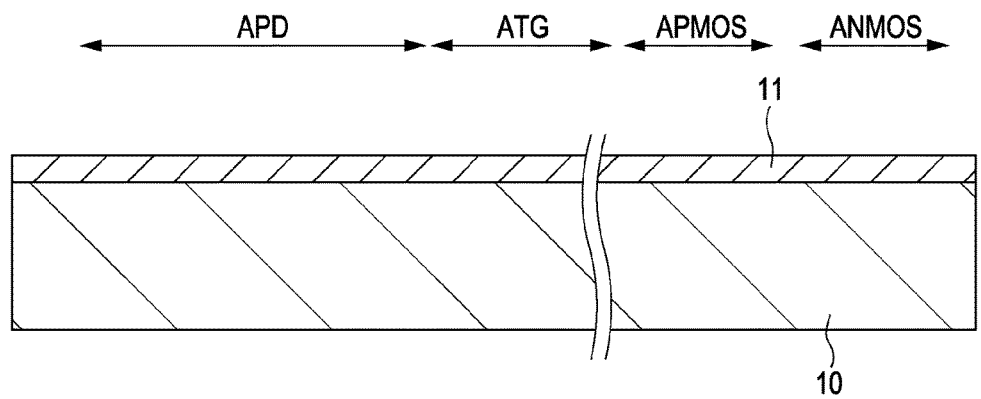
FIGS. 23A to 23C are sectional views of manufacturing processes of a method of manufacturing a solid-state imaging device according to the third embodiment of the present invention.

First, as shown in FIG. 23A, for example, a hard mask 11 is formed on the semiconductor substrate 10 by accumulating silicon nitride over the whole surface with a layer thickness of 100 to 250 nm by a CVD method.

The semiconductor substrate 10 may be a silicon substrate of a bulk or may be an SOI substrate.

Figure 23B:
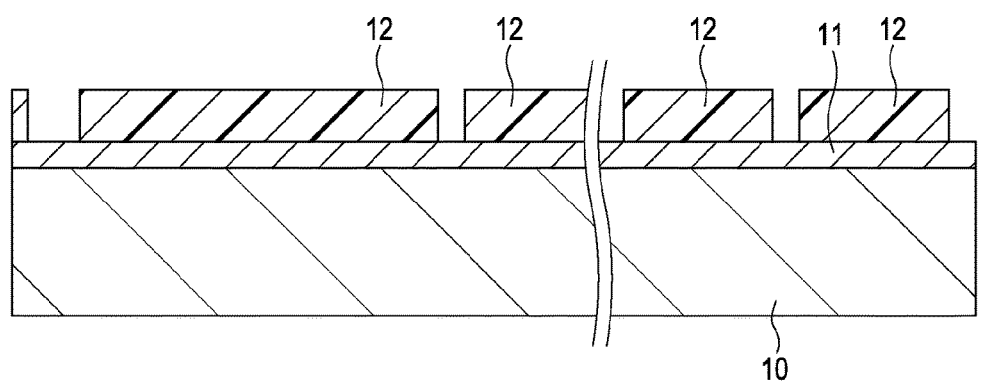

Next, as illustrated in FIG. 23B, for example, a resist layer 12 is formed to be patterned on a hard mask 11.

The resist layer 12 opens the element isolation area of the NMOS transistor area ANMOS and the PMOS transistor area APMOS, the element isolation area of the photodiode area APD, and the vertical gate area in the lower portion of the transfer gate.

Figure 23C:
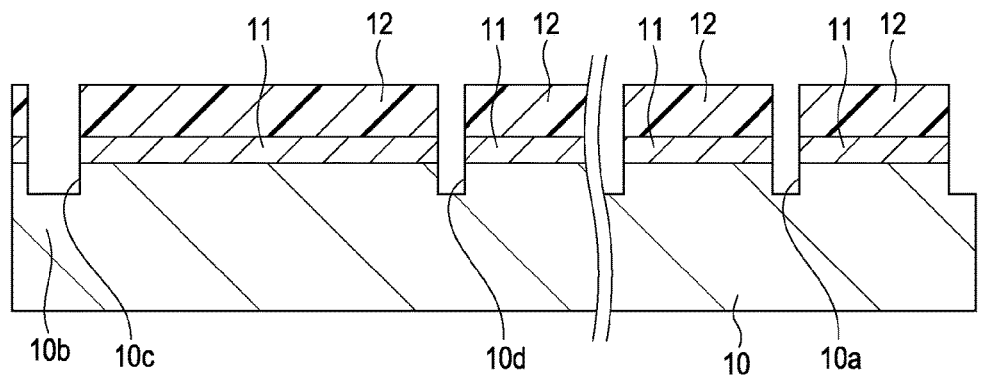

Next, as illustrated in FIG. 23C, for example, the hard mask 11 is pattern-etched using the resist layer 12 as a mask. Further, in the NMOS transistor area ANMOS and the PMOS transistor area APMOS, an element isolation groove 10a is formed on the surface layer of the semiconductor substrate 10. Also, the concave portion 10c is formed even in the element isolation area 10b of the photodiode area APD, and the concave portion 10d is formed in the area that becomes the vertical gate in the lower portion of the transfer gate.

The etching is performed by, for example, an RIE with a mixed gas of $CF_4+O_2$, and the depth of the element isolation groove 10a and the concave portion 10c and 10d is 0 to 300 nm.

Figure 24A:
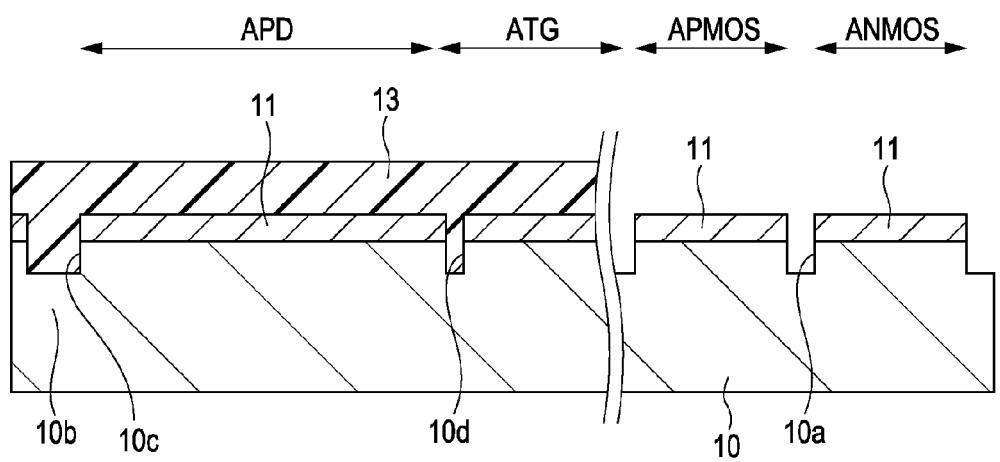
FIGS. 24A and 24B are sectional views illustrating manufacturing processes of a method of manufacturing a solid-state imaging device according to the third embodiment of the present invention.

Next, as illustrated in FIG. 24A, for example, the resist layer 12 is removed, and a resist layer 13 for opening the NMOS transistor area ANMOS and the PMOS transistor area APMOS is formed to be patterned.

Figure 24B:
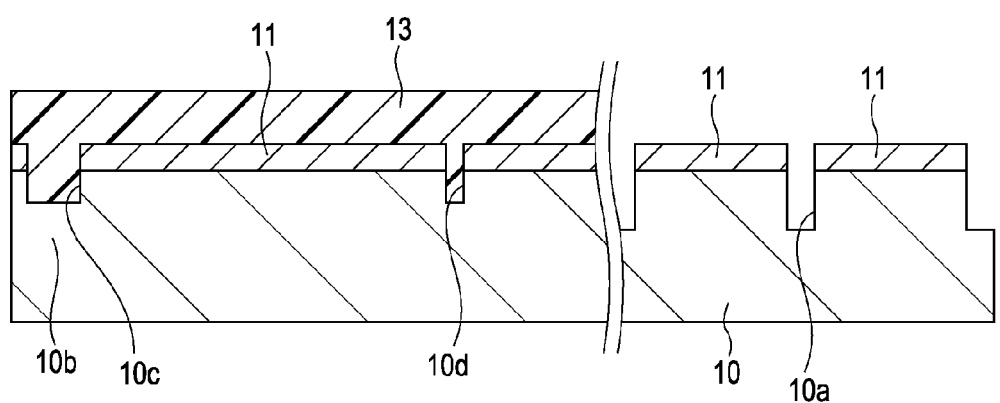

Next, as illustrated in FIG. 24B, for example, the element isolation groove 10a in the NMOS transistor area ANMOS and the PMOS transistor area APMOS is processed to have a large depth using the resist layer 13 as a mask.

The etching is performed by, for example, an RIE with a mixed gas of $Cl_2+O_2$, and the depth of the element isolation groove 10a and the concave portion 10c is 200 to 500 nm in addition to the previous etching.

Figure 25A:
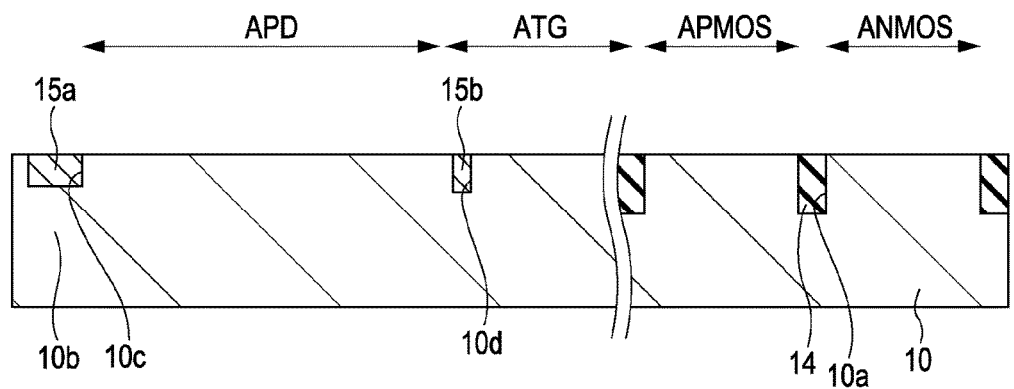
FIGS. 25A and 25B are sectional views illustrating manufacturing processes of a method of manufacturing a solid-state imaging device according to the third embodiment of the present invention.

Next, as illustrated in FIG. 25A, for example, silicon oxide is accumulated over the whole surface with a thickness of 200 to 800 nm by filling the silicon oxide in the element isolation groove 10a and the concave portion 10c by the CVD method. Then, the silicon oxide accumulated on the outside of the element isolation groove 10a and the concave portion 10c is removed for planarization by CMP.

Through the above-described processes, the element isolation insulating layer 14 which is filled in the device separation groove 10a is formed. Also, a dummy layer 15a is formed on the concave portion 10c, and the dummy layer 15b is formed on the concave portion 10d.

Further, the hard mask 11 of the silicon nitride is removed by a hot phosphorus process. The amount of projection from the semiconductor substrate 10 of the element isolation insulating layer 14 is adjusted by a thin hydrofluoric acid (HF) process after the CMP process.

Figure 25B:
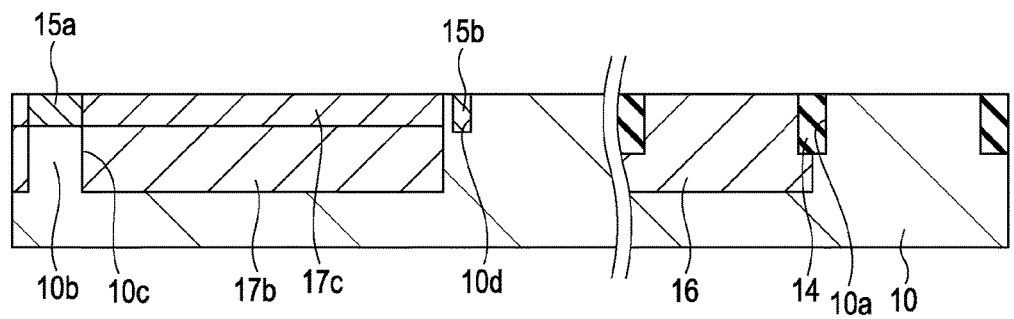

Next, as illustrated in FIG. 25B, for example, N-type well 16 is formed by ion implantation of N-type impurities into the PMOS transistor area APMOS. In forming the N-type well 16, P is formed with a combination of implantation energy of 0.2 to 1000 keV and ion implantation of doze amount of $1\times10^{11}$ to $1\times10^{13}/cm^2$.

Also, in the photodiode area APD, the N-type semiconductor area 17 that forms the photodiode is formed. In this embodiment, the N-type semiconductor area 17 includes the low-concentration area 17b having a low effective N-type impurity concentration and a high-concentration area 17c.

For example, in forming the N-type low-concentration area 17b and the high-concentration area 17c, P is formed with a combination of implantation energy of 50 to 3000 keV and ion implantation of doze amount of $1\times10^{11}$ to $1\times10^{13}/cm^2$.

Also, if necessary, a well, channel impurities, and impurities for element isolation may be ion-injected.

In forming the semiconductor area including the low-concentration area 17b and the high-concentration area 17c, due to the above-described reason, it is preferable that the effective concentration of the N-type impurities has a smooth concentration gradient, that is, becomes higher as being closer to the surface of the semiconductor substrate.

Figure 26A:
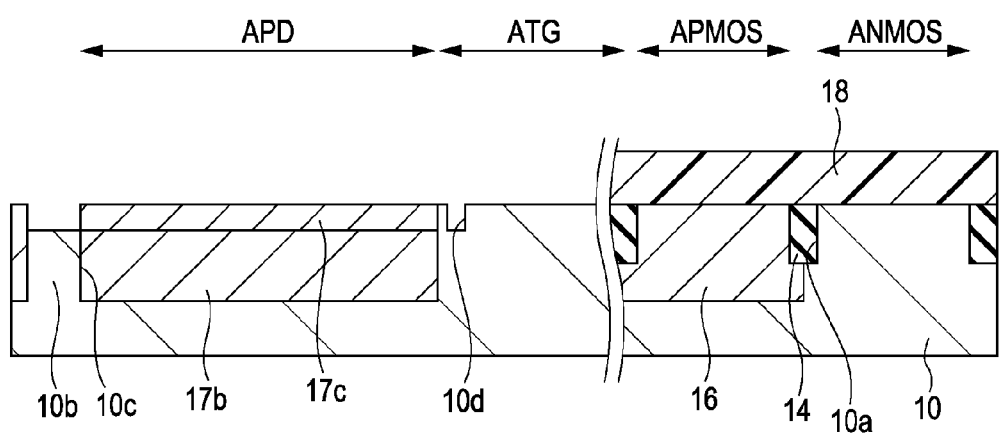
FIGS. 26A and 26B are sectional views illustrating manufacturing processes of a method of manufacturing a solid-state imaging device according to the third embodiment of the present invention.

Next, as illustrated in FIG. 26A, for example, a resist layer 18 for protecting the NMOS transistor area ANMOS and the PMOS transistor area APMOS and opening the photodiode area APD and the transfer gate area ATG is formed to be patterned.

Next, for example, the dummy layers 15a and 15b of silicon oxide are removed by performing a wet etching process with thin hydrofluoric acid using the resist layer 18 as a mask. Accordingly, the concave portion 10c for exposing the side surface of the semiconductor area 17 is formed. Also, the concave portion 10c is formed on the area that becomes the vertical gate in the lower portion of the transfer gate.

Figure 26B:
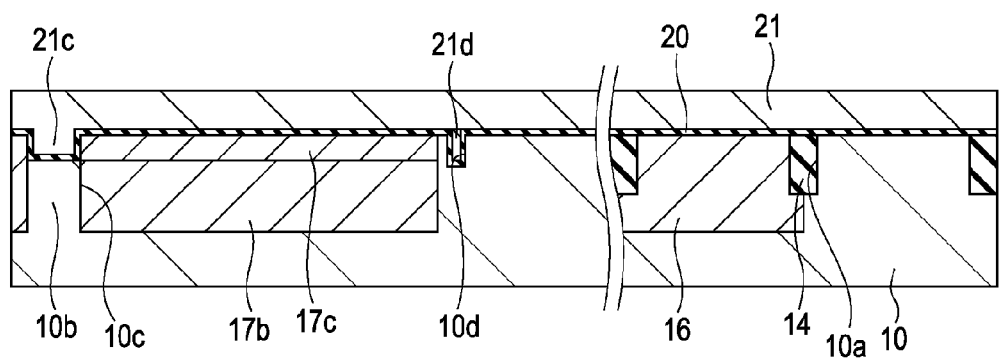

Next, as illustrated in FIG. 26B, for example, in the photodiode area APD, the transfer gate area ATG, the NMOS transistor area ANMOS, and the PMOS transistor area APMOS, the gate insulating layer 20 is formed on the surface of the semiconductor substrate 10. The gate insulating layer 20, for example, may be formed by forming a silicon oxide layer by a thermal oxidation method or a CVD method. In this case, the gate insulating layer 20 is formed to cover the side surface of the semiconductor area 17 in the concave portion 10c. Also, the gate insulating layer 20 is formed to cover the inner wall of the semiconductor area 17 in the concave portion 19d.

Next, a polysilicon layer 21 is formed on the upper layer of the gate insulating layer 20 with a layer thickness of 80 to 250 nm by the CVD method. In this case, the polysilicon layer 21 is formed to have a filling layer 21c that fills the upper layer of the gate insulating layer 20 in the concave portion 10c. Also, the polysilicon layer 21 is formed to have a filling layer 21d that fills the upper layer of the gate insulating layer 20 in the concave portion 10d.

Figure 27A:
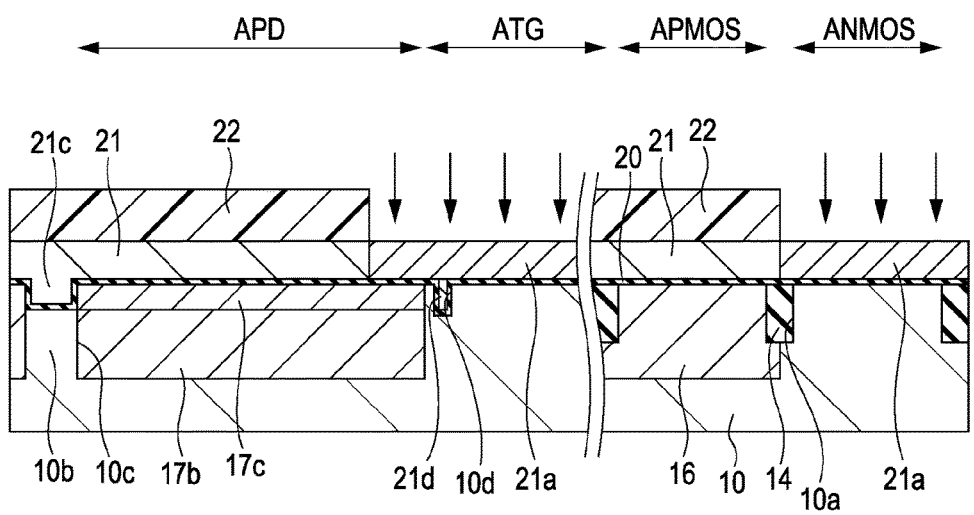
FIGS. 27A and 27B are sectional views illustrating manufacturing processes of a method of manufacturing a solid-state imaging device according to the third embodiment of the present invention.

Next, as illustrated in FIG. 27A, for example, a resist layer 22 for protecting the photodiode area APD and the PMOS transistor area APMOS is formed to be patterned. Using the resist layer 22 as a mask, in the transfer gate area ATG and the NMOS transistor area ANMOS, the N-type conduction layer 21a is formed by introducing N-type conductive impurities such as P or the like onto the polysilicon layer 21. For example, in forming the N-type conduction layer 21a, P is formed with a combination of implantation energy of 5 to 30 keV and ion implantation of doze amount of $1 \times 10^{15}/\text{cm}^2$.

Figure 27B:
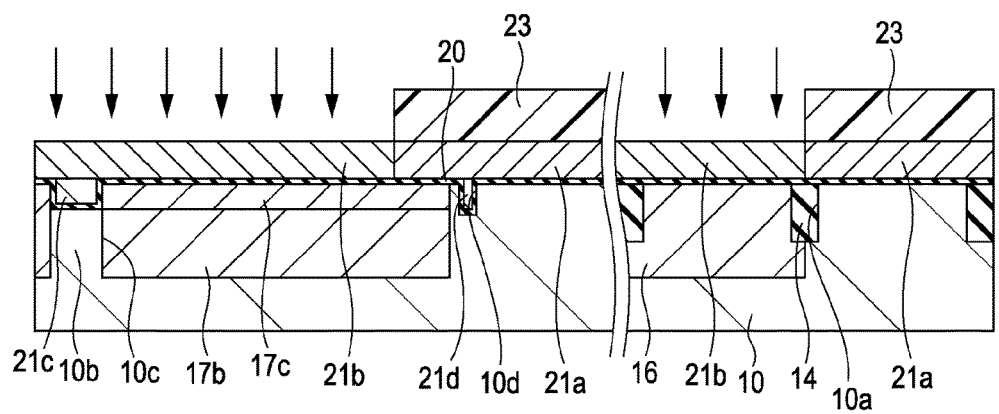

Next, as illustrated in FIG. 27B, for example, a resist layer 23 for protecting the transfer gate area ATG and the NMOS transistor area ANMOS is formed to be patterned. Using the resist layer 23 as a mask, in the photodiode area APD and the PMOS transistor area APMOS, the P-type conduction layer 21b is formed by introducing P-type conductive impurities such as B or the like onto the polysilicon layer 21. For example, in forming the P-type conduction layer 21b, B is formed with a combination of implantation energy of 3 to 15 keV and ion implantation of doze amount of 0 to $1 \times 10^{16}/\text{cm}^2$.

In the drawing, a state where P-type conductive impurities such as B or the like are not diffused up to the filling layer 21c and the filling area 21d inside the concave portion 10c.

Figure 28A:
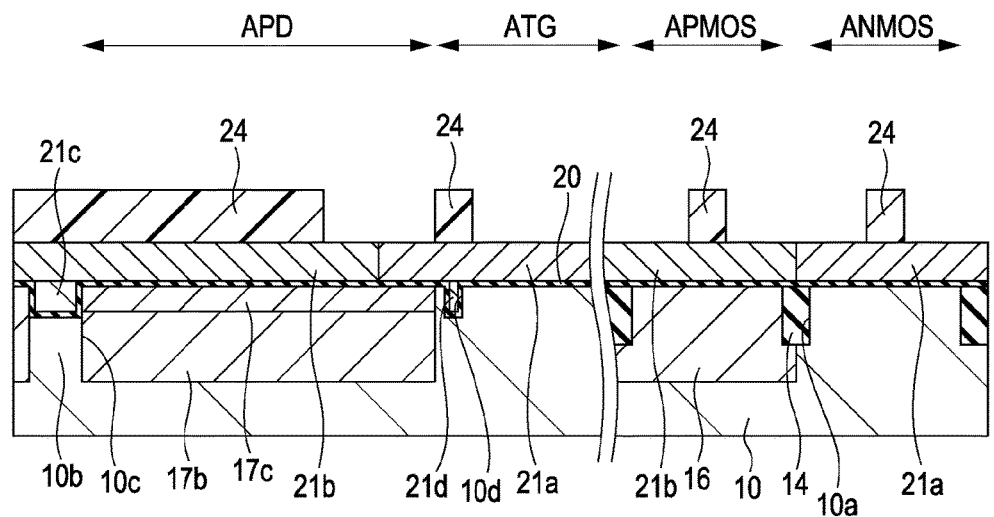
FIGS. 28A and 28B are sectional views illustrating manufacturing processes of a method of manufacturing a solid-state imaging device according to the third embodiment of the present invention.

Next, as illustrated in FIG. 28A, for example, a resist layer 24 is formed to be patterned on the conduction layer 21a and the conduction layer 21b.

The resist layer 24 has patterns of the inversion layer induction electrode of the photodiode area APD, the transfer gate electrode of the transfer gate area ATG, and the gate electrodes of the NMOS transistor area ANMOS and the PMOS transistor area APMOS.

Figure 28B:
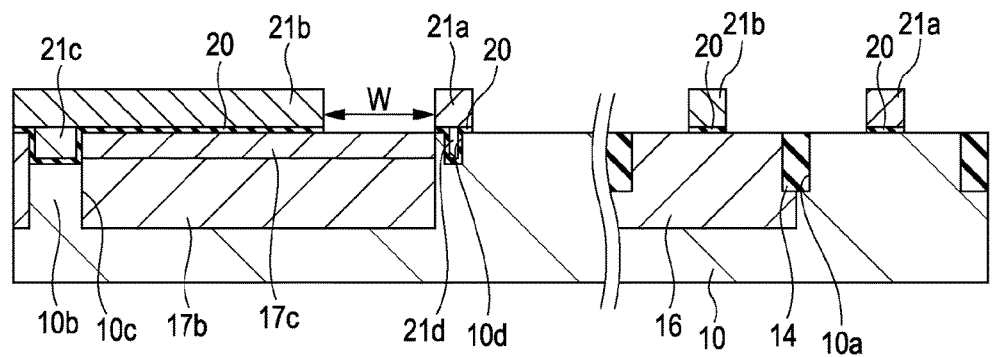

Next, as illustrated in FIG. 28B, for example, an etching process is performed using the resist layer 24 as a mask. The etching process may be, for example, an anisotropic etching process such as RIE (Reactive Ion Etching) by plasma of a mixed gas of $Cl_2+O_2$.

As described above, the conduction layer 21b that is the inversion layer induction electrode, the conduction layer 21a that is the transfer gate electrode, the conduction layer 21a that is the gate electrode of the NMOS transistor, and the conduction layer 21b that is the gate electrode of the PMOS transistor are formed to be patterned. The conduction layer 21b that is the inversion layer induction electrode is integrally formed with the conduction layer 21b that is the inversion layer induction electrode on the photodiode of the neighboring pixel.

In the above-described etching process, the gate insulating layer 20 is processed in the same pattern as that of the respective conduction layers 21a and 21b.

Here, it is sufficient if the width W between the conduction layer 21b that is the inversion layer induction electrode and the conduction layer 21a that is the transfer gate electrode is a distance in which the P-type conduction layer 21b and the N-type conduction layer 21a are sufficiently separable. For example, the width W may be formed by a minimum design rule that can be processed, and may be, for example, 50 to 300 nm.

Figure 29A:
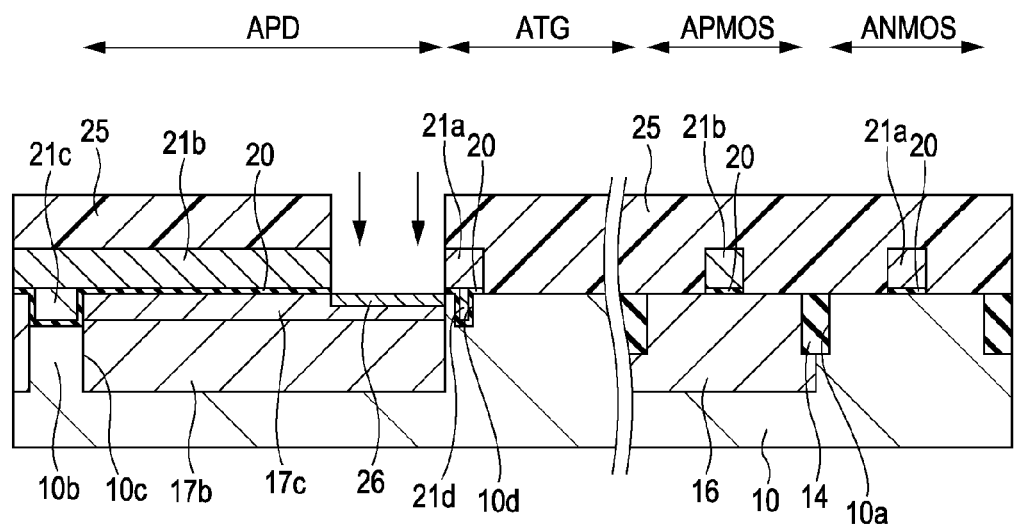
FIGS. 29A and 29B are sectional views illustrating manufacturing processes of a method of manufacturing a solid-state imaging device according to the third embodiment of the present invention.

Next, as illustrated in FIG. 29A, for example, a resist layer 25 is formed, which is the end portion of the photodiode area APD and opens the area neighboring the transfer gate area ATG. By ion-injecting the P-type impurities such as B using the resist layer 25 as a mask, a P-type semiconductor layer 26, which forms a portion of the PN junction that becomes the photodiode as the semiconductor area 17, is formed on the surface layer of the semiconductor area 17 in the end portion of the photodiode area APD. For example, the P-type semiconductor layer 26 is formed with a combination of implantation energy of 0.2 to 10 keV and ion implantation of doze amount of $1 \times 10^{12}$ to $1 \times 10^{13}/\text{cm}^2$.

Figure 29B:
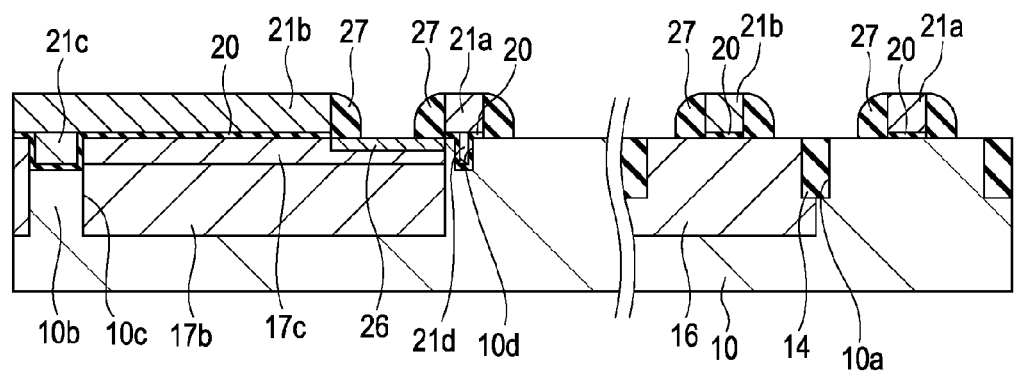

Next, as illustrated in FIG. 29B, for example, a silicon oxide layer of 5 to 30 nm and a silicon nitride layer of 30 to 100 nm are laminated on the whole surface by the CVD method, and the etch back process is performed on the front surface thereof. Accordingly, in the photodiode area APD, the transfer gate area ATG, the NMOS transistor area ANMOS, and the PMOS transistor area APMOS, a side wall insulating layer 27 is formed on the side surfaces of the N-type conduction layer 21a and the P-type conduction layer 21b.

The above-described etch back process, for example, may be an anisotropic etching process such as RIE (Reactive Ion Etching) by plasma of a mixed gas of $CF_4+O_2$.

The width W between the conduction layer 21b that is the inversion layer induction electrode and the conduction layer 21a that is the transfer gate electrode may be entirely filled up with the side wall insulating layer 27.

Figure 30A:
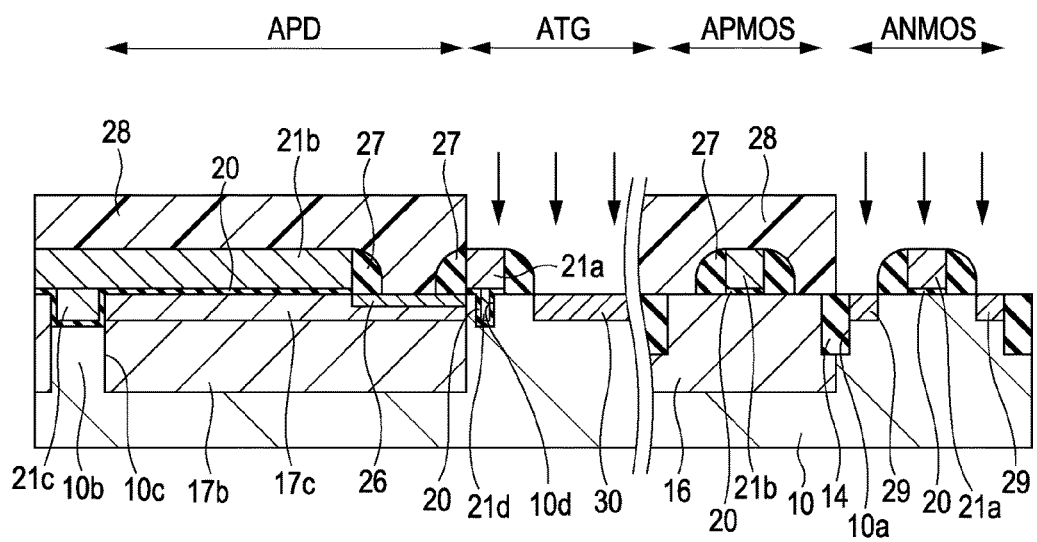
FIGS. 30A and 30B are sectional views illustrating manufacturing processes of a method of manufacturing a solid-state imaging device according to the third embodiment of the present invention.

Next, as illustrated in FIG. 30A, for example, a resist layer 28 for protecting the photodiode area APD and the PMOS transistor area APMOS is formed to be patterned. Next, the N-type conductive impurities such as P or the like are introduced using the resist layer 28 as a mask. On the NMOS transistor area ANMOS, the N-type semiconductor layer 29 that is the N-type source/drain area is formed. Also, on the transfer gate area ATG, the N-type semiconductor layer 30 that is the floating diffusion is formed. Here, the N-type semiconductor layer is formed, for example, with a combination of implantation energy of 5 to 20 keV and a doze amount of $1 \times 10^{15}$ to $5 \times 10^{15}/\text{cm}^2$.

Figure 30B:
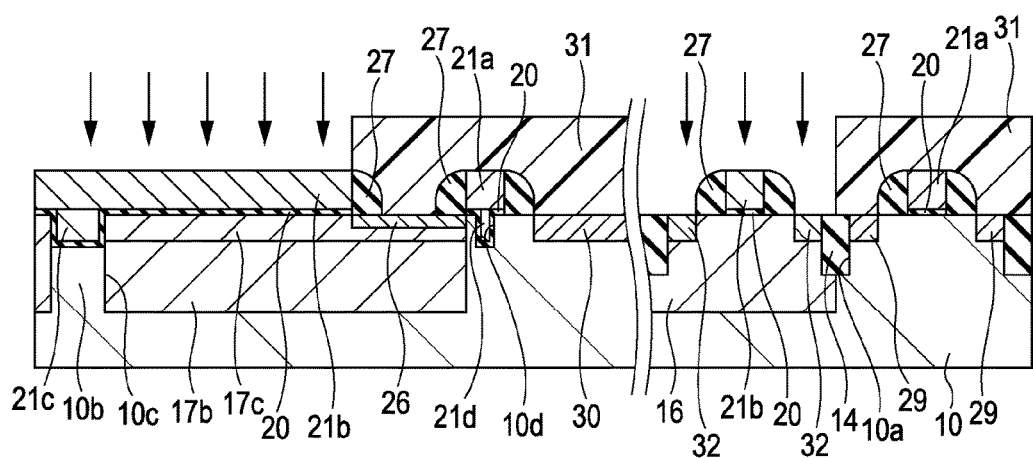

Next, as illustrated in FIG. 30B, for example, a resist layer 31 for protecting the transfer gate area ATG, the end portion (the area of the semiconductor layer 26) neighboring the transfer gate area ATG of the photodiode area APD, and the NMOS transistor area ANMOS is formed to be patterned. Then, using the resist layer 31 as a mask, the P-type conductive impurities such as B and the like are introduced. On the PMOS transistor area APMOS, the P-type semiconductor layer 32 that is the P-type source/drain area is formed. Also, on the photodiode area APD, the concentration of the P-type impurities inside the P-type conduction layer 21b is heightened. Here, for example, the P-type semiconductor layer 32 is formed with a combination of implantation energy of 2 to 8 keV and ion implantation of doze amount of $1 \times 10^{15}$ to $5 \times 10^{15}/cm^2$.

After the ion implantation as described above, the impurities are activated by performing an RTA (Rapid Thermal Annealing) process at 1000 to 1100° C. and for about 0 to 20 seconds to remove defects. By the RTA process, the P-type conductive impurities are diffused up to the filling layer 21c of the concave portion 10c and the filling area 21d inside the concave portion 10d.

As the following processes, for example, if the light incident surface is on the rear surface side (direction A in FIG. 22B) of the substrate, thin filming of the substrate is performed by grinding the rear surface of the substrate, and if necessary, a color filter and the like are further formed on the rear surface side of the substrate. Further, an optical guide or an on-chip lens may be installed.

For example, if the light incident surface is on the surface side (direction B in FIG. 22B), if necessary, an optical guide is installed inside the insulating layer on the substrate, and a color filter and an on-chip lens are formed on the upper layer thereof.

Through the above-described processes, the CMOS image sensor configured as illustrated in FIGS. 22A and 22B can be manufactured.

According to the method of manufacturing a solid-state imaging device according to this embodiment, the inversion layer induction electrode is formed in the area covering a portion or the whole of the photodiode, and the inversion layer is induced, which is formed by accumulating the second conductivity type carrier on the surface of the inversion layer induction electrode side of the semiconductor area. Accordingly, the solid-state imaging device can be manufactured.

Also, it is possible to perform heat treatment for removing the defect introduced through the gate etching and side wall etch back. Also, the conduction layer itself, which is the inversion layer induction electrode covering the photodiode, suppresses the introduction of the defect into the photodiode area in the etching process.

Accordingly, the increase of the dark current is avoided, and thus the yield deterioration can be suppressed.

<Third Modification>

[Construction Having No Groove in an Element Isolation Area of a Photodiode in the Third Embodiment]

In the third embodiment of the present invention, the conduction layer 21b that is the inversion layer induction electrode has the filling layer 21c that fills in the concave portion 10c. Further, the conduction layer 21a that is the transfer gate electrode has the filling layer 21d that fills in the concave portion 10c.

However, in the construction, the concave portion 10c may not be formed, and the conduction layer 21b that is the inversion layer induction electrode may not have the filling layer 21c that fills in the concave portion 10d.

Fourth Embodiment

[Camera Using a Solid-State Imaging Device]

Figure 31:
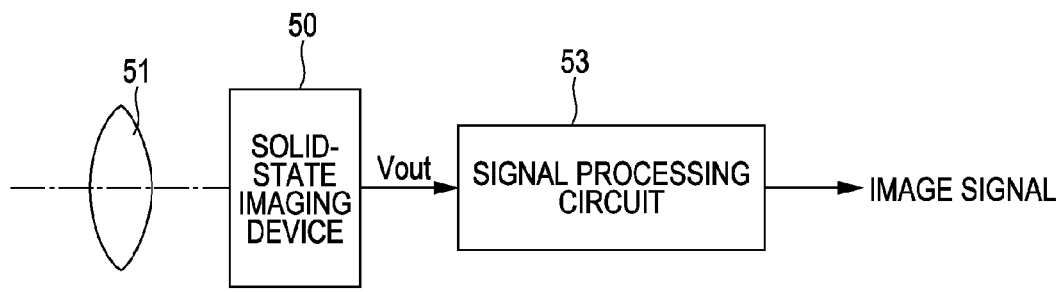
FIG. 31 is a diagram illustrating the schematic configuration of a camera according to a fourth embodiment of the present invention.

FIG. 31 is a diagram illustrating the schematic configuration of a camera according to a fourth embodiment of the present invention.

The camera includes a solid-state imaging device 50 composed of a plurality of pixels integrated therein, an optical system 51, and a signal processing circuit 53.

In this embodiment, the solid-state imaging device 50 includes any one of solid-state imaging devices according to the first to third embodiments of the present invention.

The optical system 51 forms an image light (incident light) from an object on an image pickup surface of the solid-state imaging device 50. Accordingly, a photodiode that forms each pixel on the image pickup surface of the solid-state imaging device 50 converts the image light into signal charges according to the quantity of incident light, and the corresponding signal charges are accumulated for a certain period.

The accumulated signal charges are extracted as an output signal Vout through a CCD charge transfer path.

The signal processing circuit 53 performs diverse signal process with respect to an output signal Vout of the solid-state imaging device 50, and outputs an image signal.

In this embodiment of the present invention, a camera using a solid-state imaging device, in which the dynamic range is improved by steepening the PN junction and the yield deterioration is suppressed, can be provided.

The present invention is not limited to that as described above.

For example, this embodiment can be applied to any one of a CMOS sensor and a CCD device. In the case of the CCD device, a CCD (Charge-Coupled Device) is connected to the photodiode as the signal reading unit. In the CCD, signal charges transmitted from the respective pixels are read.

In the respective embodiments of the present invention, it is possible to replace the first conductivity type and the second conductivity type. In this case, carriers which are induced in the inversion layer are not holes, but are electrons.

In the solid-state imaging device according to the first to third embodiments of the present invention, in the area between the transfer gate electrode and the inversion layer induction electrode, a layer having negative fixed charges, such as hafnium oxide or the like may be formed on the semiconductor substrate. The layer having the negative fixed charges may be made of hafnium oxide, aluminum oxide, zirconium oxide, tantalum oxide, or titan oxide. Also, the layer having the negative fixed charges may be made of lanthanum oxide, praseodymium oxide, cerium oxide, neodymium oxide, promethium oxide, samarium oxide, europium oxide, gadrinium oxide, terbium oxide, dysprosium oxide, holmium oxide, erbium oxide, thulium oxide, ytterbium oxide, lutetium oxide, yttrium oxide, or the like.

In addition, diverse modifications are possible without departing from the scope of the present invention.

Fifth Embodiment

Next, the fifth embodiment of the present invention will be described. In this case, the explanation of the fifth embodiment will be made in the following order.
1. Embodiment 1 (4Tr type)
2. Embodiment 2 (4Tr type)
3. Embodiment 3 (4Tr type+pixel sharing)
4. Embodiment 4 (4Tr type+pixel sharing)

5. Embodiment 5 (3Tr type)
6. Embodiment 6 (3Tr type)
7. Embodiment 7 (3Tr type+pixel sharing)
8. Embodiment 8 (3Tr type+pixel sharing)
9. Modifications 1. Embodiment 1

(A) Device Configuration
(A-1) Configuration of Main Portions of a Camera

Figure 32:
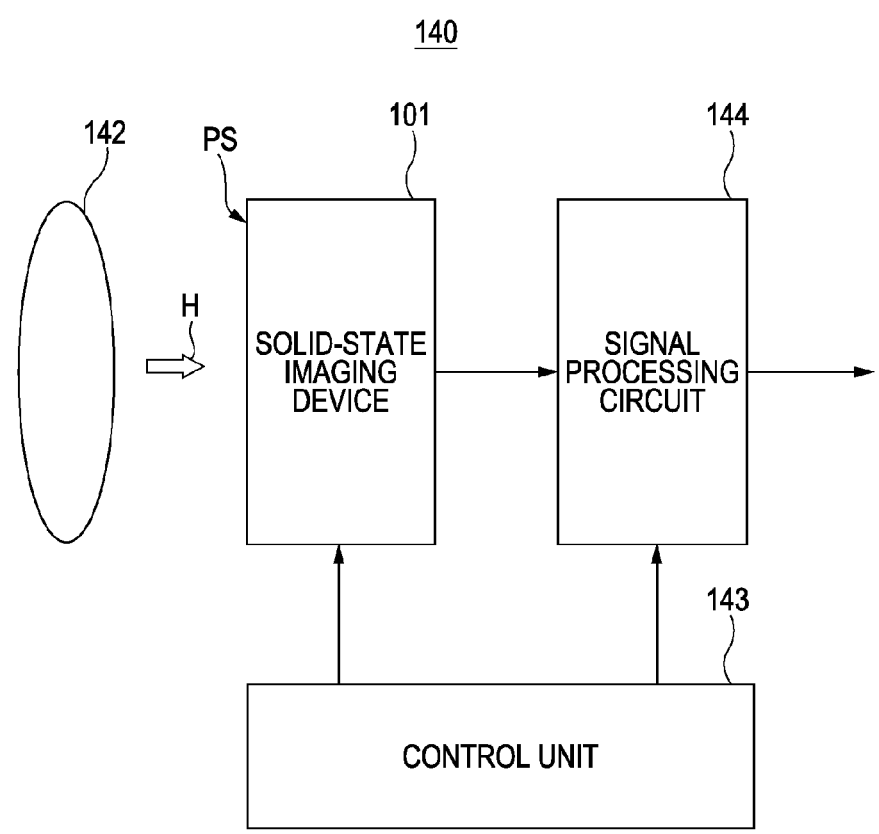
FIG. 32 is a diagram illustrating the schematic configuration of a camera according to embodiment 1 of the present invention.

FIG. 32 is a diagram illustrating the schematic configuration of a camera 140 according to embodiment 1 of the present invention.

101 is a solid-state imaging device, 113 is a vertical drive circuit, 114 is a column circuit, 115 is a horizontal drive circuit, 117 is an external output circuit, 117a is an AGC circuit, 117b is an ADC circuit, 118 is a timing generator, 119 is a shutter drive circuit, 121 is a photodiode, 122 is a transmission transistor, 123 is an amplification transistor, 124 is a selection transistor, 125 is a reset transistor, 126 is a transmission line, 127 is a vertical signal line, 128 is an address line, 129 is a reset line, 140 is a camera, 142 is an optical system, 143 is a control unit, 144 is a signal processing circuit, 1101 is a substrate, 1101na is n-type charge accumulation area, 1101pa is a p-type semiconductor area, 1101pc is a p-type semiconductor area, BL is a light shielding area, FD is a read drain, H is light, HS is an interconnection, HT is an interconnection layer, IMG is an effective pixel area, JS is a light sensing surface, MT is a load MOS transistor, OFD is a charge discharging area, OPB is an optical black area, P is a pixel, PA is a pixel area, PS is a pickup surface, SA is a surrounding area, Sz is an insulating layer, Tr is a pixel transistor, Vdd is a power potential supply line, WT is a well tap, x indicates a horizontal direction, and y indicates a vertical direction.

As illustrated in FIG. 32, the camera 40 includes the solid-state imaging device 101, the optical system 142, the control unit 143, and the signal processing circuit 144. The respective units will be described in order.

The solid-state imaging device 101 receives light (object image), which is incident through the optical system 142, from the image pickup surface PS, and converts the light into signal charges to generate the signal charges. Here, the solid-state imaging device 101 operates based on a control signal output from the control unit 143. Specifically, the solid-state imaging device read the signal charges and output the signal charges as raw data.

The optical system 142 includes optical members such as an image forming lens, an iris, and the like, which are arranged to collect the incident light H according to the object image onto the image pickup surface PS of the solid-state imaging device 101.

The control unit 143 outputs various kinds of control signals to the solid-state imaging device 101 and the signal processing circuit 144 to control the operation of the solid-state imaging device 101 and the signal processing circuit 144.

The signal processing circuit 144 is configured to generate a digital image for the object image by performing a signal process with respect to the raw data output from the solid-state imaging device 101.

(A-2) Configuration of Main Parts of a Solid-State Imaging Device

The whole configuration of the solid-state imaging device 101 will be described.

Figure 33:
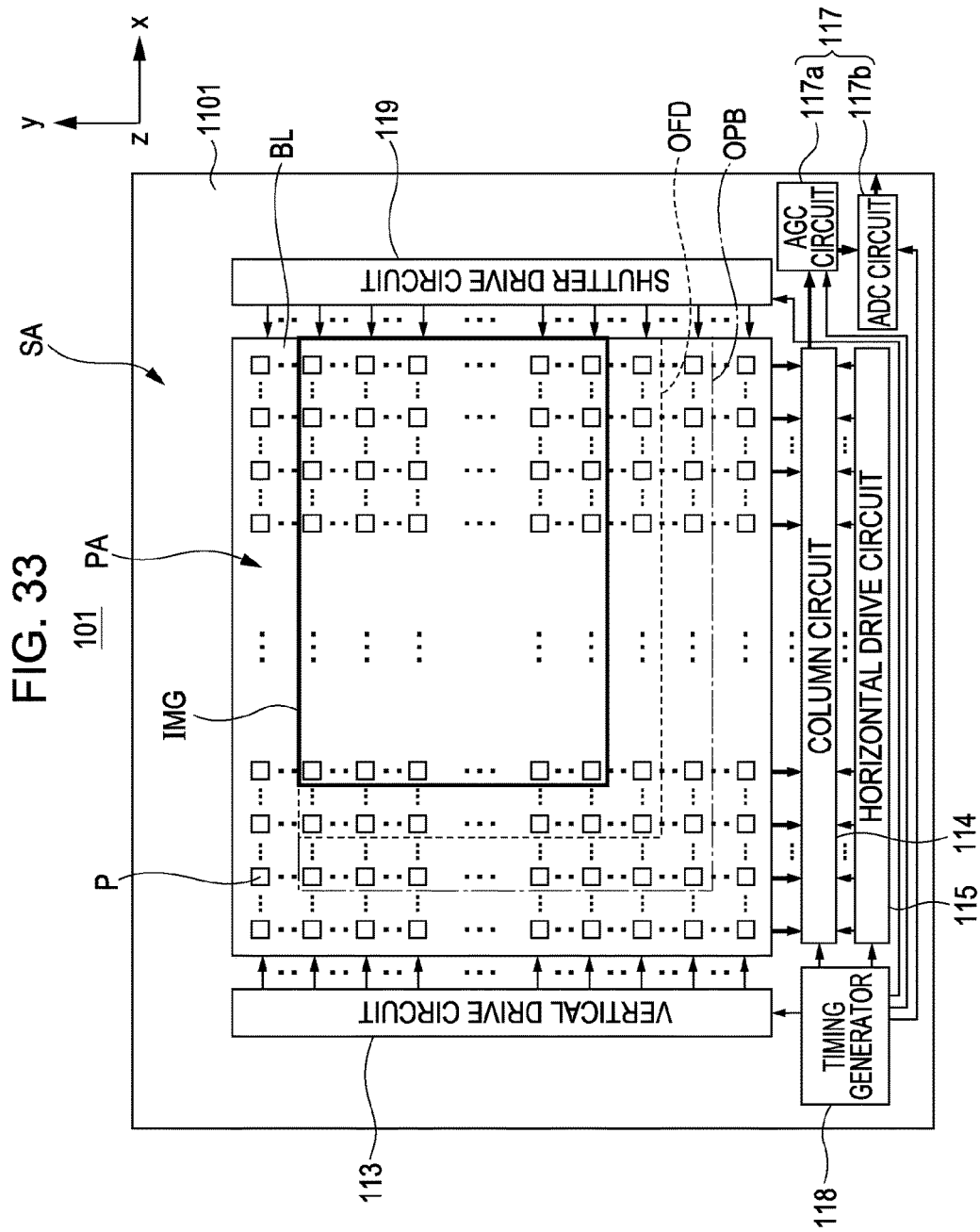
FIG. 33 is a block diagram illustrating the whole configuration of a solid-state imaging device according to embodiment 1 of the present invention.

FIG. 33 is a block diagram illustrating the whole configuration of a solid-state imaging device 101 according to embodiment 1 of the present invention.

The solid-state imaging device 101 according to this embodiment is a CMOS image sensor, and as illustrated in FIG. 33, includes a substrate 1101. The substrate 1101, for example, is a semiconductor substrate 1101 made of silicon, and as illustrated in FIG. 33, includes a pixel area PA and a surrounding area SA.

The pixel area PA, as illustrated in FIG. 33, is in the form of a tetragon, and a plurality of pixels P is arranged in the horizontal direction x and in the vertical direction y, respectively. That is, the pixels P are arranged in the form of a matrix. Also, the pixel area PA is arranged so that the center of the pixel area PA corresponds to an optical axis of the optical system 142 as illustrated in FIG. 32.

In the pixel area PA, the pixels P are configured to receive the incident light and generate signal charges. Also, the generated signal charges are read by the pixel transistors (not illustrated) and then output. The detailed configuration of the pixels P will be described later.

In this embodiment of the present invention, an effective pixel area IMG and a light shielding area BL are installed in the pixel area PA.

In the effective pixel area IMG of the pixel area PA, the pixels P are arranged as so-called effective pixels. That is, in the effective pixel area IMG, the upper side of the pixels P is opened to receive the incident light incident as the object image, and the image pickup is performed.

In the pixel area PA, the light shielding area BL, as illustrated in FIG. 33, is installed around the effective pixel area IMG. Here, the light shielding area BL, for example, is installed in upper, lower, and left portions of the effective pixel area IMG. The light shielding area BL is configured so that a light shielding layer (not illustrated) is installed on the upper side of the pixels P and the incident light is not directly incident to the pixels P.

Also, in the light shielding area BL, as illustrated in FIG. 33, an optical black area OPB and a charge discharging area OFD are installed.

In the optical black area OPB of the light shielding area BL, the pixels P are arranged as so-called optical black (OB) pixels. The optical black area OPB is installed in a portion around the effective pixel area IMG, and from the pixel P, a reference signal of a black level is output. The reference signal of the black level output from the pixel P is used to remove the noise component such as the dark current and the like when correction is performed with respect to the signals output from the effective pixels.

In the light shielding area BL, the charge discharging area OFD, as illustrated in FIG. 33, is installed to be interposed between the effective pixel area IMG and the optical black area OPB. Also, in the charge discharging area OFD, the pixels P are arranged to function as charge discharging pixels that compulsively discharge excessive charges. That is, in the bulk (substrate 1101), the reference signal of the black level is prevented from being changed due to the leakage of the excessive charges into the optical black area OPB.

The surrounding area SA, as illustrated in FIG. 33, is positioned around the pixel area PA. In the surrounding area SA, surrounding circuits are installed.

Specifically, as illustrated in FIG. 33, a vertical driving circuit 113, a column circuit 114, a horizontal driving circuit 115, an external output circuit 117, a timing generator (TG) 118, and a shutter driving circuit 119 are installed as surrounding circuits.

The vertical driving circuit 113, as illustrated in FIG. 33, is installed on the side portion of the pixel area PA in the surrounding area SA, and is configured to select and drive the pixels P of the pixel area PA in the unit of a row.

The column circuit 114, as illustrated in FIG. 33, is installed on the lower end portion of the pixel area PA in the surrounding area SA, and performs a signal process with respect to the signal output from the pixels P in the unit of a column. Here, the column circuit 114 includes a CDS (Correlated Double Sampling) circuit (not illustrated), and performs a signal process of removing a fixed pattern noise.

The horizontal driving circuit 115, as illustrated in FIG. 33, is electrically connected to the column circuit 114. The horizontal driving circuit 115, for example, includes a shift register, and the column circuit 114 sequentially outputs signals held for each column of the pixels P to the external output circuit 117.

The external output circuit 117, as illustrated in FIG. 33, is electrically connected to the column circuit 114, and performs a signal process with respect to the signal output from the column circuit 114 to output the processing signal to the outside. The external output circuit 117 includes an AGC (Automatic Gain Control) circuit 117a and an ADC circuit 117b. In the external output circuit 117, the AGC circuit 117a multiplies the signal by a gain, the ADC circuit 117b converts the analog signal into a digital signal, and outputs the digital signal to the outside.

The timing generator 118, as illustrated in FIG. 33, is electrically connected to the vertical driving circuit 113, the column circuit 114, the horizontal driving circuit 115, the external output circuit 117, and the shutter driving circuit 119. The timing generator 118 generates and outputs various kinds of timing signals to the vertical driving circuit 113, the column circuit 114, the horizontal driving circuit 115, the external output circuit 117, and the shutter driving circuit 119 to control the operation of the respective circuits.

The shutter driving circuit 119 is configured to select the pixels P in the unit of a row and to control the exposing time of the pixels P.

(A-3) Detailed Configuration of a Solid-State Imaging Device

The detailed contents of the solid-state imaging device according to this embodiment will be described.

FIGS. 34 to 39 are diagrams illustrating main parts of a solid-state imaging device according to embodiment 1 of the present invention.

Figure 34:
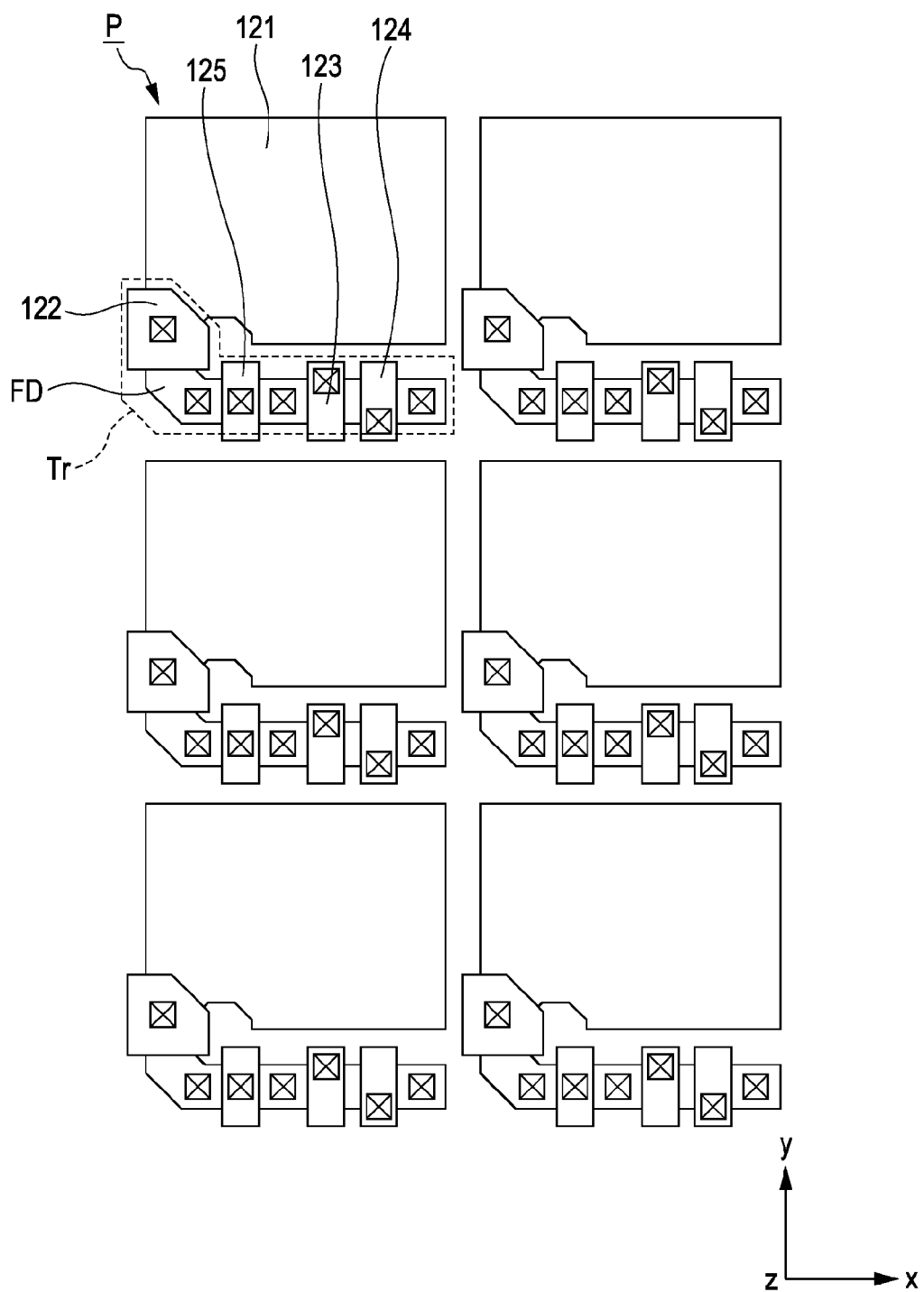
FIG. 34 is a diagram illustrating a main part of a solid-state imaging device according to embodiment 1 of the present invention.
Figure 35:
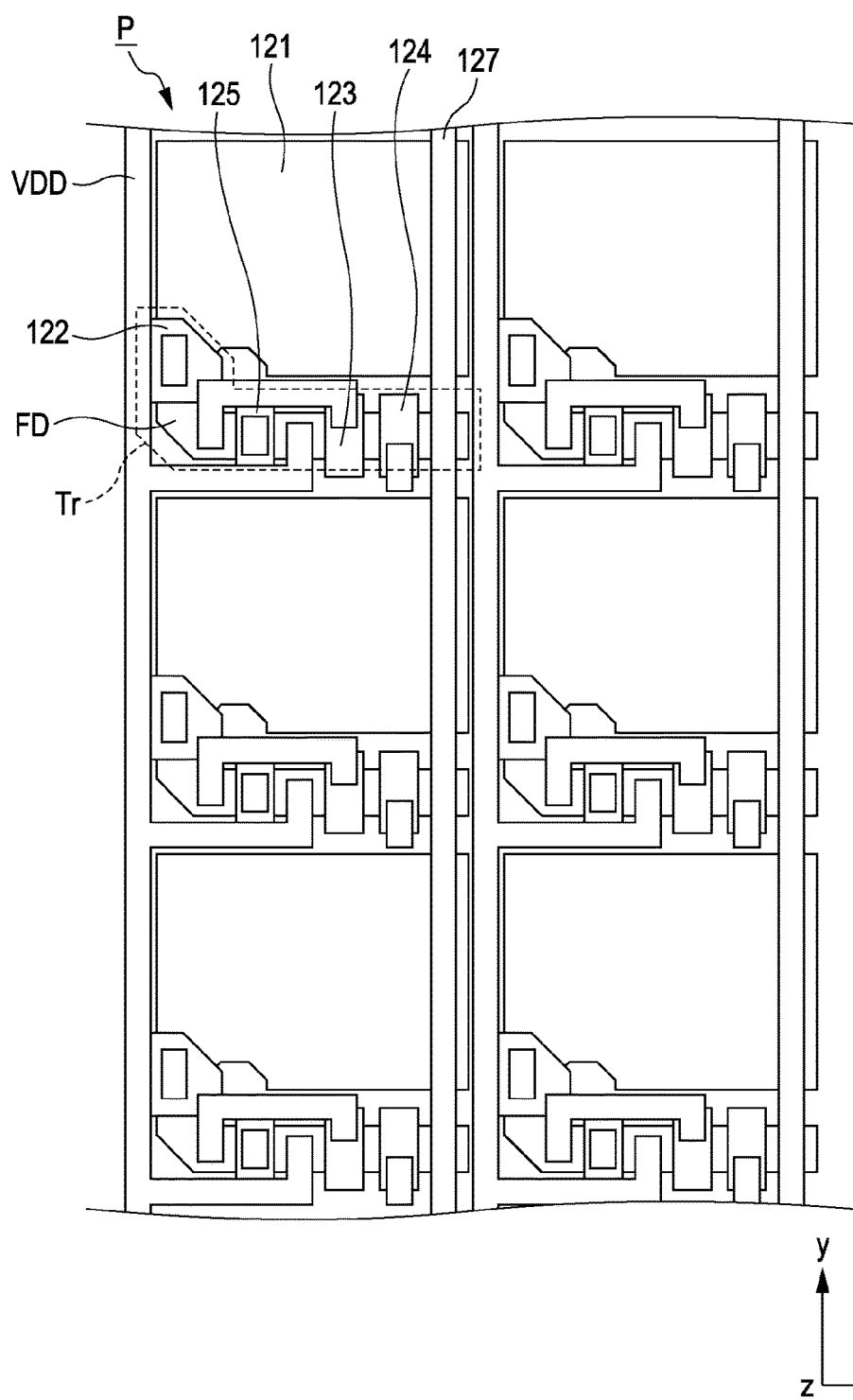
FIG. 35 is a diagram illustrating a main part of a solid-state imaging device according to embodiment 1 of the present invention.
Figure 36:
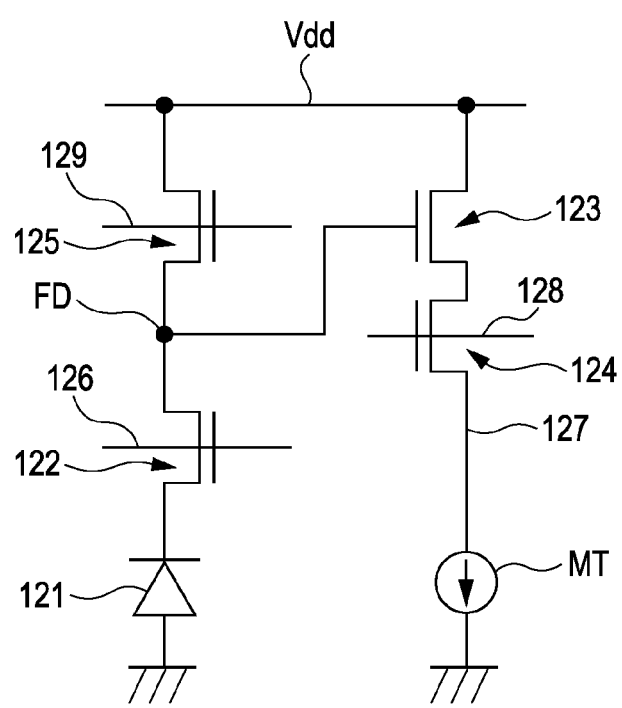
FIG. 36 is a diagram illustrating a main part of a solid-state imaging device according to embodiment 1 of the present invention.

Here, FIGS. 34 to 36 show the pixels P in the effective pixel area IMG. FIGS. 34 and 35 show the upper surface of the pixel area PA. FIG. 34 shows the pixel P (interconnection not illustrated), and FIG. 35 shows the relationship between the pixel P and the interconnection (hatched portion) in the effective pixel area IMG. Also, FIG. 36 shows the circuit configuration of the pixel P installed in the effective pixel area IMG.

Figure 37:
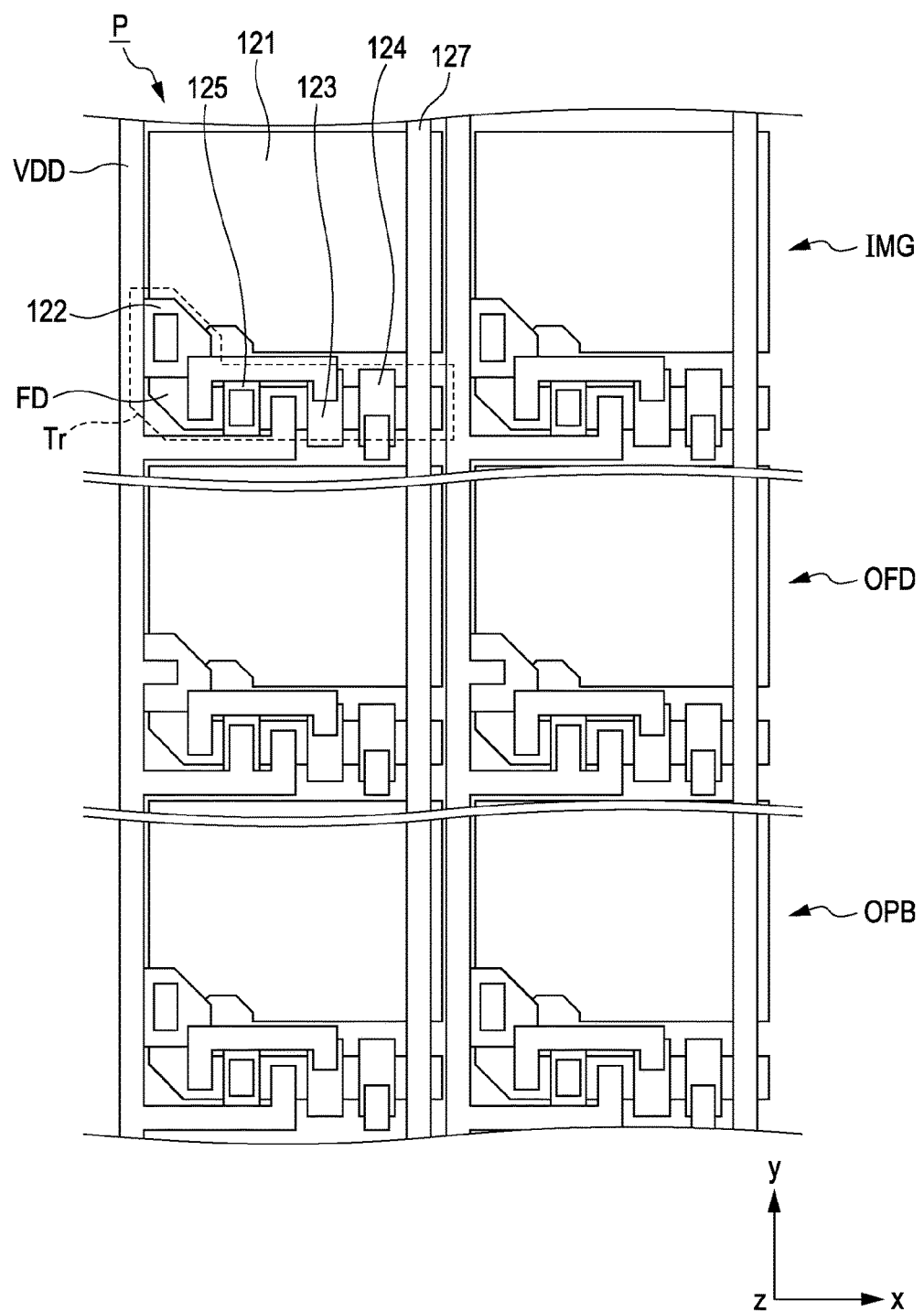
FIG. 37 is a diagram illustrating a main part of a solid-state imaging device according to embodiment 1 of the present invention.
Figure 38:
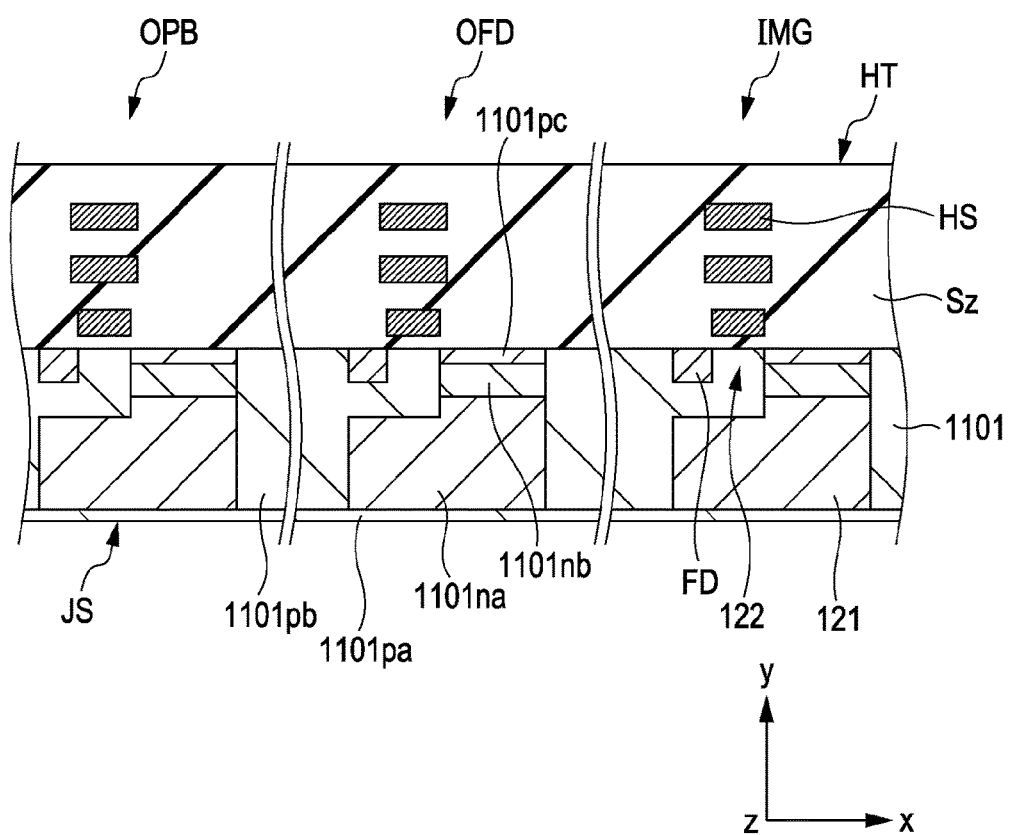
FIG. 38 is a diagram illustrating a main part of a solid-state imaging device according to embodiment 1 of the present invention.

By contrast, FIGS. 37 and 38 show the optical black area OPB and the charge discharging area OFD installed in the light shielding area BL in addition to the effective pixel area IMG. FIG. 37 shows the upper surface of the respective areas, and the relationship between the pixel P and the interconnection. Also, FIG. 38 shows the cross sections of the respective areas.

Figure 39:
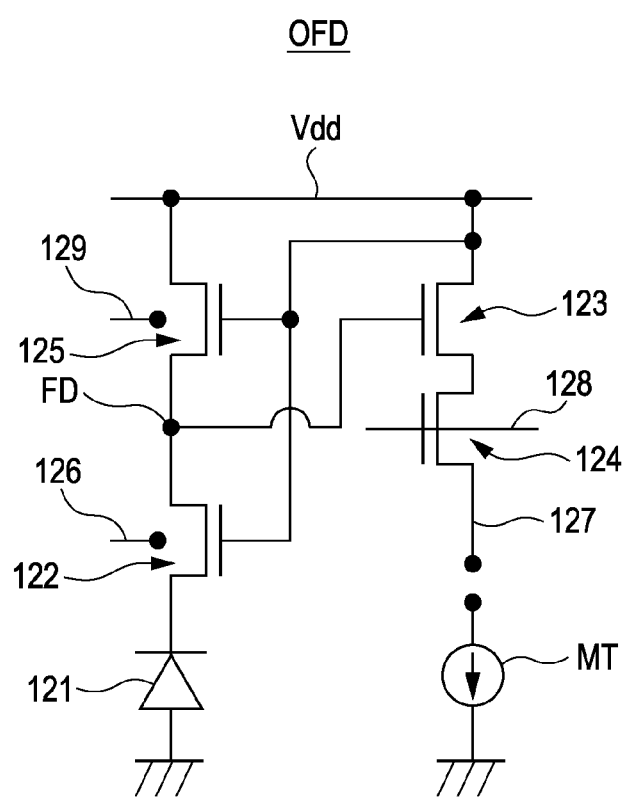
FIG. 39 is a diagram illustrating a main part of a solid-state imaging device according to embodiment 1 of the present invention.

In addition to this, FIG. 39 shows the circuit configuration of the pixel P installed in the charge discharging area OFD.

As illustrated in the respective drawings, the solid-state imaging device 101 includes a photodiode 121 and a pixel transistor Tr. Here, the pixel transistor Tr includes a transmission transistor 122, an amplification transistor 123, a selection transistor 124, and a reset transistor 125, and is configured to read the signal charges from the photodiode 121.

According to the solid-state imaging device 101 in this embodiment, as illustrated in FIG. 38, the pixel transistor Tr such as the transmission transistor 122 or the like is installed on the surface side of the substrate 1101, and the interconnection layer HT is installed on the surface side of the substrate 1101. Also, the rear surface side, which is the opposite side of the surface side, is configured to be used as the light sensing surface JS. That is, the solid-state imaging device 101 in this embodiment is the 4-Tr type rear surface illumination type CMOS image sensor.

The respective portions will be described in order.

(1) Regarding a Photodiode 121

In the solid-state imaging device 101, as illustrated in FIG. 34, a plurality of photodiodes 121 is arranged to correspond to a plurality of pixels P. The plurality of photodiodes 121 is installed to be in parallel to the horizontal direction x and the vertical direction y that is perpendicular to the horizontal direction x, respectively, in the image pickup surface (x-y surface).

The respective photodiodes 121 receive the incident light (object image), perform photoelectric conversion of the incident light, generate and accumulate signal charges.

As illustrated in FIG. 38, the photodiode 121, for example, is installed inside the silicon semiconductor substrate 1101. Specifically, the photodiode 121 includes n-type charge accumulation areas 1101na and 1101nb installed inside the p-type semiconductor areas 1101pa and 1101pb of the substrate 1101, and a high-concentration p-type semiconductor area 1101pc installed on the surface side of the substrate 1101. In this embodiment of the present invention, the respective photodiodes 121 are installed in the same manner in the effective pixel area IMG, the optical black area OPB, and the charge discharging area OFD. Also, the respective photodiode 121 is configured so that the accumulated signal charges are transmitted to the read drain FD by the transmission transistor 122.

(2) Regarding a Pixel Transistor Tr

In the solid-state imaging device 101, as illustrated in FIG. 34, the pixel transistors Tr are installed between the pluralities of photodiodes 121 in the image pickup surface (x-y surface). According to the respective pixel transistors Tr, active areas (not illustrated) are formed in the areas where the pixels P are separated from each other in the substrate 1101, and the respective gate electrodes, for example, are formed using polysilicon.

In FIG. 38, although only the transmission transistor 122 is illustrated in the pixel transistor Tr, even other transistors 123 to 125 are installed on the surface side of the substrate 1101 in the same manner as the transmission transistor 122.

(2-1) Transmission Transistor 122

In the pixel transistor Tr, a plurality of transmission transistors 122 is formed to correspond to a plurality of pixels P as shown in FIG. 34.

Here, in the transmission transistor 122, the gate is installed on the surface of the substrate 1101 via the gate insulating layer. In the transmission transistor 122, the gate is installed to neighbor the read drain FD (Floating Diffusion) that is installed on the surface of the substrate 1101 (see FIGS. 34 and 38).

Also, as illustrated in FIGS. 35 and 36, in the effective pixel area IMG, the transmission transistor 12 is configured to output the signal charges generated by the photodiode 121 to the gate of the amplification transistor 123 as an electric signal. Specifically, as a transmission signal is provided from the transmission line 126 to the gate, the transmission transistor 122 transmits the signal charges accumulated in the photodiode 121 to the read drain FD. The read drain FD converts the charges into a voltage and inputs the voltage to the gate of the amplification transistor 123.

Also, as illustrated in the lower end portion of FIG. 37, even in the optical black area OPB, the transmission transistor 122 is configured in the same manner as in the effective pixel region IMG. That is, as in the circuit configuration illustrated in FIG. 36, the transmission transistor 122 is configured to output the signal charges generated from the photodiode 121 to the gate of the amplification transistor 123 as the electric signal. However, as described above, in the optical black area OPB, a light shielding layer (not illustrated) is installed on the upper side, and the signal charges generated from the photodiode 121 are output as the reference signal of the black level. For example, the reference signal of the black level is used to control the black level when the signal processing circuit 144 corrects the signal output from the effective pixel.

By contrast, in the charge discharging area OFD, as illustrated in the intermediate portion of FIG. 37 and FIG. 39, the electric connection relationships between the respective portions differ in the effective pixel area IMG and in the optical black area OPB. Specifically, in the transmission transistor 122, unlike the effective pixel area IMG and the optical black area OPB, the gate of the transmission transistor 122 is electrically connected to a power potential supply line Vdd. Also, as illustrated in FIG. 39, the gate of the transmission transistor 122 and the transmission line 126 are disconnected from each other, and thus are not electrically connected to each other.

(2-2) Amplification Transistor 123

In the pixel transistor Tr, a plurality of amplification transistors 123, as illustrated in FIG. 34, is formed to correspond to a plurality of pixels P, respectively.

Here, the gate of the amplification transistor 123 is installed on the surface of the substrate 1101 via the gate insulating layer. This amplification transistor 123 is installed between the selection transistor 124 and the reset transistor 1125, which are installed on the surface of the substrate 1101 (see FIG. 34).

Also, as illustrated in FIGS. 35 and 36, in the effective pixel area IMG, the amplification transistor 123, in the read drain FD, is configured to amplify and output the electric signal which has been converted from the charge to the voltage. Specifically, the gate of the amplification transistor 123 is connected to the read drain FD. Also, the drain of the amplification transistor 123 is connected to the power potential supply line Vdd, and the source of the amplification transistor 123 is connected to the selection transistor 124. When the selection transistor 124 is selected to be in an on state, constant current is applied from a constant current source (not illustrated), and thus the amplification transistor 123 operates as a source follower. Accordingly, a selection signal is applied to the selection transistor 124, and in the read drain FD, the amplification transistor 123 amplifies the electric signal that has been converted from the charge into the voltage.

Also, as illustrated in the lower end portion of FIG. 37, even in the optical black area OPB, the amplification transistor 123 is configured in the same manner as in the effective pixel area IMG. That is, as the circuit configuration illustrated in FIG. 36, the amplification transistor 123, in the read drain FD, is configured to amplify and output the electric signal that has been converted from the charge into the voltage.

In the same manner, even in the charge discharging area OFD, the amplification transistor 123, as illustrated in the intermediate portion of FIG. 37 and FIG. 39, is configured in the same manner as in the effective pixel area IMG and the optical black area OPB.

(2-3) Selection Transistor 124

In the pixel transistor Tr, a plurality of selection transistors 124, as illustrated in FIG. 34, is formed to correspond to a plurality of pixels P, respectively.

Here, the gate of the selection transistor 124 is installed on the surface of the substrate 1101 via the gate insulating layer. This selection transistor 124 is installed neighboring the amplification transistor 123 that is installed on the surface of the substrate 1101 (see FIG. 34).

Also, as illustrated in FIGS. 35 and 36, in the effective pixel area IMG, the selection transistor 124 is configured to output the electric signal output by the amplification transistor 123 to the vertical signal line 127 when the selection signal is input. Specifically, as illustrated in FIG. 36, the gate of the selection transistor 124 is connected to the address line 128 to which the selection signal is applied. Also, when the selection signal is applied, the selection transistor 124 is in an on state, and outputs the output signal that is amplified by the amplification transistor 123 to the vertical signal line 127.

Also, as illustrated in the lower end portion of FIG. 37, even in the optical black area OPB, the selection transistor 124 is configured in the same manner as in the effective pixel area IMG. That is, when the selection signal is input, the selection transistor 124 is configured to output the electric signal output by the amplification transistor 123 to the vertical signal line 127.

In the same manner, even in the charge discharging area OFD, the selection transistor 124, as illustrated in the intermediate portion of FIG. 37 and FIG. 39, is configured in the same manner as in the effective pixel area IMG and the optical black area OPB. However, as illustrated in FIG. 39, the vertical signal line 127 that is connected to the selection transistor 124 is not electrically connected between the load MOS transistor MT. In this case, the load MOS transistor MT is installed as a device that constitutes the column circuit 114 as illustrated in FIG. 33.

(2-4) Reset Transistor 125

In the pixel transistor Tr, a plurality of reset transistors 125, as illustrated in FIG. 34, is formed to correspond to a plurality of pixels P, respectively.

Here, the gate of the reset transistor 125 is installed on the surface of the substrate 1101 via the gate insulating layer. This reset transistor 125 is installed neighboring the transmission transistor 122 that is installed on the surface of the substrate 1101 (see FIG. 34).

Also, as illustrated in FIGS. 35 and 36, in the effective pixel area IMG, the reset transistor 125 is configured to reset the gate potential of the amplification transistor 123. Specifically, as illustrated in FIG. 36, the gate of the reset transistor 125 is connected to the reset line 129 to which the reset signal is applied. Also, the drain of the reset transistor 125 is connected to the power potential supply line Vdd, and the source of the reset transistor 125 is connected to the read drain FD. Also, when the reset signal is applied from the reset line 129 to the gate of the reset transistor 125, the reset transistor 125 resets the gate potential of the amplification transistor 123 to the power potential through the read drain FD.

Also, as illustrated in the lower end portion of FIG. 37, even in the optical black area OPB, the reset transistor 125 is configured in the same manner as in the effective pixel area IMG. That is, the reset transistor 125 is configured to reset the gate potential of the amplification transistor 123.

By contrast, in the charge discharging area OFD, as illustrated in the intermediate portion of FIG. 37 and FIG. 39, the electric connection relationships between the respective portions differ in the effective pixel area IMG and in the optical black area OPB. Specifically, in the reset transistor 125, unlike the effective pixel area IMG and the optical black area OPB, the gate of the reset transistor 125 is electrically connected to a power potential supply line Vdd. Also, as illustrated in FIG. 39, the gate of the reset transistor 125 and the reset line 129 are disconnected from each other, and thus are not electrically connected to each other.

(3) Others

As illustrated in FIG. 38, on the surface of the substrate 1101, an interconnection layer HT is installed. In the interconnection layer HT, interconnections HS electrically connected to the respective devices are formed inside the insulating layer Sz. The respective interconnections HS are formed in lamination so that they function as the interconnections such as the transmission line 126, the address line 128, the vertical signal line 127, and the reset line 129 as illustrated in FIGS. 36 and 39.

In addition, in a portion that corresponds to the effective pixel area IMG in the rear surface side of the substrate 1101, optical members, such as color filters, micro lenses, and the like, are installed to correspond to the pixels P. Although not illustrated in the drawing, as the color filters, for example, filter layers of respective colors are arranged in a bayer array. Also, in the light shielding area BL in which the optical black area OPB and the charge discharging area OFD are installed, a light shielding layer (not illustrated) is installed.

(B) Manufacturing Method

The main parts of a method of manufacturing the solid-state imaging device 101 will be described. Here, with reference to FIG. 38 and the like, a method of manufacturing the solid-state imaging device 101 will be described.

First, by ion-injecting p-type impurity (e.g. boron) into the substrate 1101, p-type semiconductor areas 1101pa and 1101pb are installed in the substrate 1101. Here, the p-type semiconductor areas 1101pa and 1101pb are installed in the effective pixel area IMG, the optical black area OPB, and the charge discharging area OFD in the same manner as described above.

Next, by ion-injecting n-type impurity (e.g. phosphate) into the substrate 1101, n-type charge accumulation areas 1101na and 1101nb are installed in the substrate 1101. Further, a high-concentration p-type semiconductor area 1101pc is installed in a shallow portion of the surface of the substrate 1101. By doing this, a photodiode 121 is formed.

Also, by ion-injecting n-type impurity (e.g. phosphate) into the substrate 1101, a read drain (floating diffusion) FD and source/drain areas of respective transistors 122 to 125 are formed. Thereafter, gates of the respective transistors 122 to 125 are formed using the polysilicon.

The photodiode 121 and the respective transistors 122 to 125 are equally formed in the effective pixel area IMG, the optical black area OPB, and the charge discharging area OFD.

Next, the interconnection layer HT is installed. Here, as illustrated in FIGS. 37 and 39, the interconnections HS which are connected to the respective portions are differently formed in the effective pixel area IMG, the optical black area OPB, and the charge discharging area OFD, respectively. In this case, the interconnections HS, which form an interconnection layer HT, are formed using a metal material such as aluminum or the like. Also, the insulating layer Sz that forms the interconnection layer HT is formed using an silicon oxide layer.

Thereafter, to the upper surface of the interconnection layer HT, a support substrate (not illustrated) is attached. Also, after inverting the substrate 1101, a thin filming process is performed with respect to the substrate 1101. For example, by performing the CMP process through a thin filming process, a portion of the substrate 1101 is removed from the rear surface side. Also, on the rear surface side of the substrate 1101, a color filter (not illustrated), an on-chip lens (not illustrated), and the like, are installed. By doing this, the rear surface illumination type CMOS image sensor is completed.

(C) Operation

The operation of the solid-state imaging device 101 will be described.

Here, the operation in the charge discharging area OFD will be described.

In the charge discharging area OFD, a power supply voltage Vdd is applied to the gate of the transmission transistor 122 and the gate of the reset transistor 125. Accordingly, the transmission transistor 122 and the reset transistor 125 are turned on to form a channel. At this time, the selection transistor 124 operates in the same manner as the pixels P in other areas. Accordingly, in the charge discharging area OFD, the excessive charges leaking from the bulk can be compulsively discharged from the respective pixels P to the outside.

Specifically, as described above, the excessive charges can be discharged from the photodiode 121 to the power line Vdd through the read drain FD.

In addition, the same operation can be performed by applying a high fixed voltage, which is enough to discharge the excessive charges, to the gates of the transmission transistor 122 and the reset transistor 125.

Also, in the same manner, the same operation can be performed by applying a fixed voltage to the gate of the selection transistor 124.

(D) Summary

As described above, in this embodiment, the photodiode 121 that generates the signal charge by receiving light through the light sensing surface and the pixel transistor Tr that outputs the generated signal charge as an electric signal are installed in the pixel area PA of the substrate 1101. The pixel area PA includes the effective pixel area IMG, the upper side of the light sensing surface of the photodiode 121 is open in the effective pixel area IMG, and the effective pixels to which the incident light is incident are arranged as the pixels P. Also, around the effective pixel area, the light shielding area BL is installed, and on the upper side of the light sensing surface of the photodiode 121, the light shielding pixels, in which light shielding portions that shield the incident light are installed, are arranged as the pixels P. This light shielding area BL includes the optical black area OPB, and the optical black pixels, in which the pixel transistor Tr outputs the signal charges generated by the photodiode 121 as the reference signal of the black level, are arranged as their light shielding pixels.

In addition, in this embodiment, a charge discharging area OFD is further installed. This charge discharging area OFD is installed between the effective pixel area IMG and the optical black area OPB. Also, in the charge discharging area OFD, charge discharging pixels for discharging signal charges leaking from the effective pixel area IMG are arranged as the light shielding pixels.

Specifically, in the charge discharging area OFD, the gate of the transmission transistor 122 is not electrically connected to the transmission line through which the transmission signal is applied to the gate. Also, the potential at which the transmission transistor 122 is turned on is applied to the gate. With this, the gate of the reset transistor 125 is not electrically connected to the reset line 129 through which the reset signal is applied to the gate, and the potential at which the reset transistor 125 is turned on is applied to the gate. Also, the vertical signal line 127 to which the electric signal from the pixel transistor Tr is output and the load MOS transistor MT to which the vertical signal line 127 outputs the electric signal are not electrically connected to each other.

Accordingly, in this embodiment, the reference signal of the black level is prevented from being changed due to the leakage of the excessive charges in the bulk into the optical black area OPB.

In addition, in this embodiment, the charge discharging pixel, the optical black pixel, and the effective pixel are installed in the same conductivity type area (well) installed in the semiconductor substrate (see FIG. 38).

As described above, in the case of installing the charge discharging area OFD in another conductivity type well that is different from the well of the effective pixel area IMG, it is not easy to secure the continuity in process between them. Accordingly, the signal from the pixel has the discontinuity in this portion, and thus the image may be unbalanced in a portion that corresponds to the neighboring portion of the dummy pixel area.

However, in this embodiment, the charge discharging area OFD is formed in the same conductivity type well as that of the effective pixel area IMG and the optical black area OPB.

Due to this, in this embodiment, the above-described problems can be prevented from occurring.

Accordingly, in this embodiment, the image quality of the captured image can be improved. Specifically, the problem that the captured image becomes dark as a whole due to the change of the reference signal of the black level can be prevented.

2. Embodiment 2

(A) Device Configuration and the Like

Figure 40:
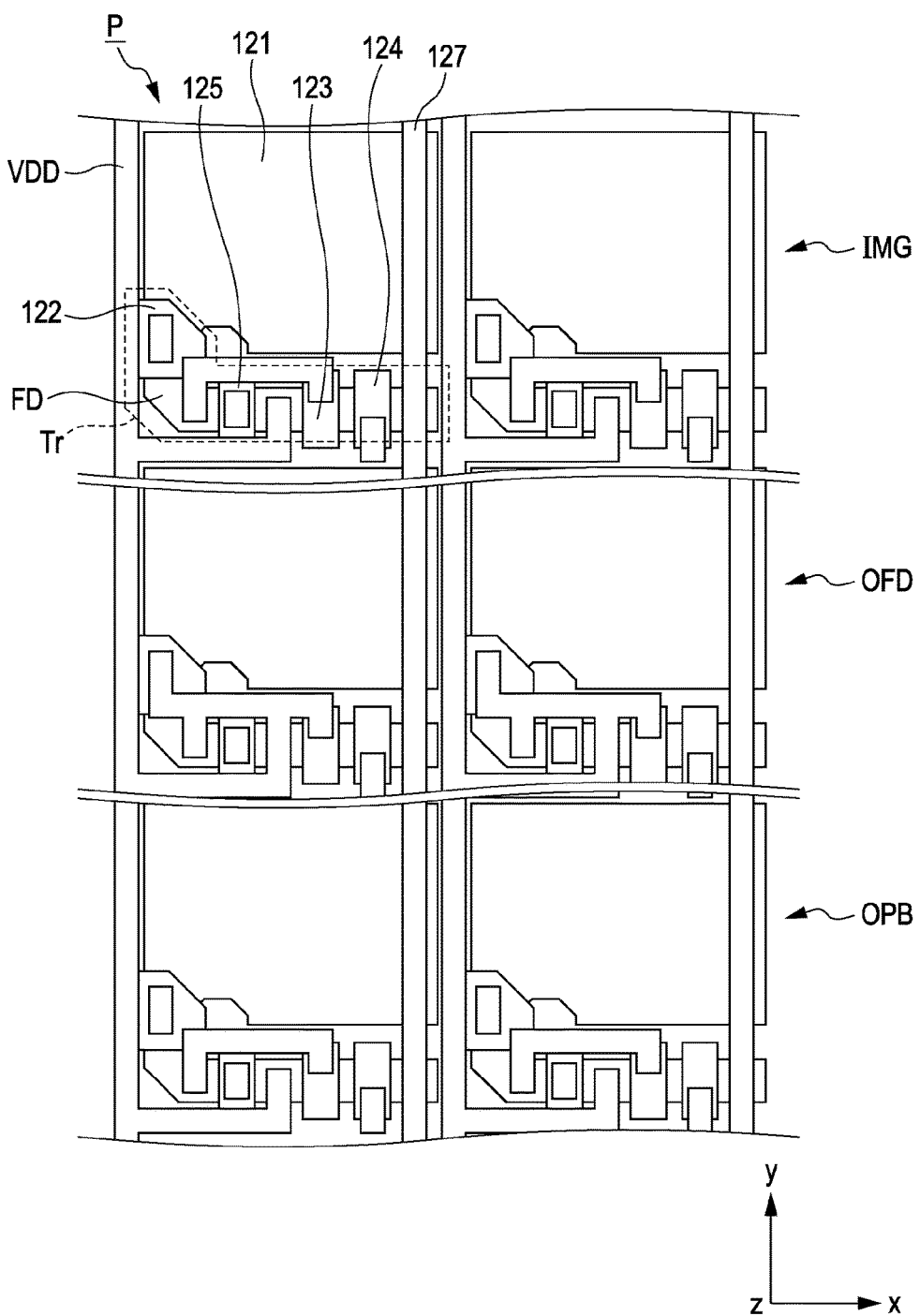
FIG. 40 is a diagram illustrating a main part of a solid-state imaging device according to embodiment 2 of the present invention.
Figure 41:
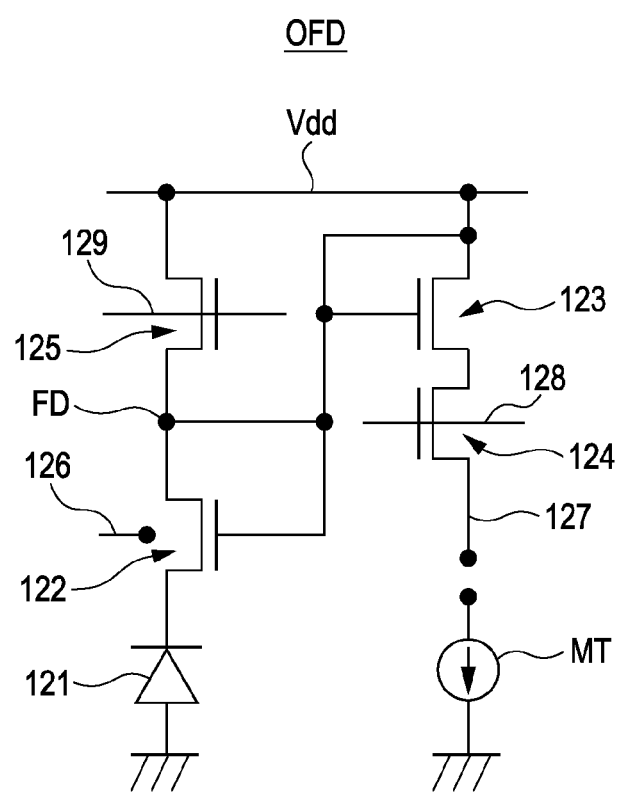
FIG. 41 is a diagram illustrating a main part of a solid-state imaging device according to embodiment 2 of the present invention.

FIGS. 40 and 41 are diagrams illustrating main portions of the solid-state imaging device according to embodiment 2 of the present invention.

Here, FIG. 40, in the same manner as in FIG. 37, shows the optical black area OPB and the charge discharging area OFD in addition to the effective pixel area IMG. Also, FIG. 41, in the same manner as in FIG. 39, shows the circuit configuration of the pixel P installed in the charge discharging area OFD.

As illustrated in FIGS. 40 and 41, in this embodiment, the configuration of the pixel P installed in the charge discharging area OFD is different from that in embodiment 1. Specifically, the connection relationship between interconnections connected to respective portions constituting the pixel transistor Tr is different from that in embodiment 1. Except for this, this embodiment is the same as embodiment 1. Accordingly, the description of duplicate portions will be omitted.

In the charge discharging area OFD, respective portions of the transmission transistor 122 are electrically connected in the same manner as in embodiment 1 as illustrated in FIGS. 40 and 41. That is, as illustrated in FIG. 41, the gate of the transmission transistor 122 is electrically connected to the power potential supply line Vdd. Also, as illustrated in FIG. 41, the gate of the transmission transistor 122 and the transmission line 126 are disconnected from each other, and thus are not electrically connected.

In the charge discharging area OFD, the electrical connection relationship between respective portions of the amplification transistor 123 is different from that in embodiment 1 as illustrated in FIGS. 40 and 41. Specifically, as illustrated in FIG. 41, the gate of amplification transistor 123 is electrically connected to the power potential supply line Vdd.

In the charge discharging area OFD, respective portions of the selection transistor 124 are electrically connected in the same manner as in embodiment 1 as illustrated in FIGS. 40 and 41. However, as illustrated in FIG. 41, the vertical signal line 127 connected to the selection transistor 124 is not electrically connected between the load MOS transistor MT.

As illustrated in FIGS. 40 and 41, the electrical connection relationship between respective portions of the reset transistor 125 is different from that in embodiment 1. Specifically, the reset transistor is installed to have the same connection relationship with another effective pixel area IMG and optical black area OPB.

(B) Operation

The operation of the solid-state imaging device in the charge discharging area OFD will be described.

In the charge discharging area OFD, for example, a power supply voltage Vdd is applied to the gate of the transmission transistor 122 and a diffusion layer that is used as the read drain FD in the pixel P of another area. At this time, the selection transistor 124 and the reset transistor 125 operate in the same manner as the pixels P in other areas. Accordingly, in the charge discharging area OFD, the excessive charges leaking from the bulk can be compulsively discharged from the respective pixels P to the outside.

In addition, the same operation can be performed by applying a high fixed voltage, which is enough to discharge the excessive charges, to the gate of the transmission transistor 122 and the diffusion layer that is used as the read drain FD in the pixels P in another area.

Also, in the same manner, the same operation can be performed by applying a fixed voltage to the gate of the selection transistor 124.

In this embodiment, the discharge of the excessive current can be performed more efficiently in comparison to the case in embodiment 1.

The reason is that the power supply voltage Vdd or a high fixed voltage, which is enough to discharge the excessive charges, can be applied to the read drain FD regardless of the threshold value of the reset transistor 125.

(C) Summary

As described above, in this embodiment, in the same manner as embodiment 1, the charge discharging area OFD is installed between the effective pixel area IMG and the optical black area OPB. Also, in the charge discharging area OFD, charge discharging pixels that discharge the signal charges leaking from the effective pixel area IMG are arranged as the light shielding pixels.

Specifically, in the charge discharging area OFD, the gate of the transmission transistor 122 is not electrically connected to the transmission line through which the transmission signal is applied to the gate. Also, the potential at which the transmission transistor 122 is turned on is applied to the gate of the transmission transistor 122 and the read drain FD. Also, the vertical signal line 127 to which the electric signal is output from the pixel transistor Tr and the load MOS transistor MT to which the vertical signal line 127 outputs the electric signal are not electrically connected to each other.

Accordingly, in this embodiment, the reference signal of the black level is prevented from being changed due to the leakage of the excessive charges in the bulk into the optical black area OPB.

Accordingly, in this embodiment, the image quality of the captured image can be improved.

3. Embodiment 3

(A) Device Configuration and the Like

FIGS. 42 to 46 are diagrams illustrating main portions of the solid-state imaging device according to embodiment 3 of the present invention.

Figure 42:
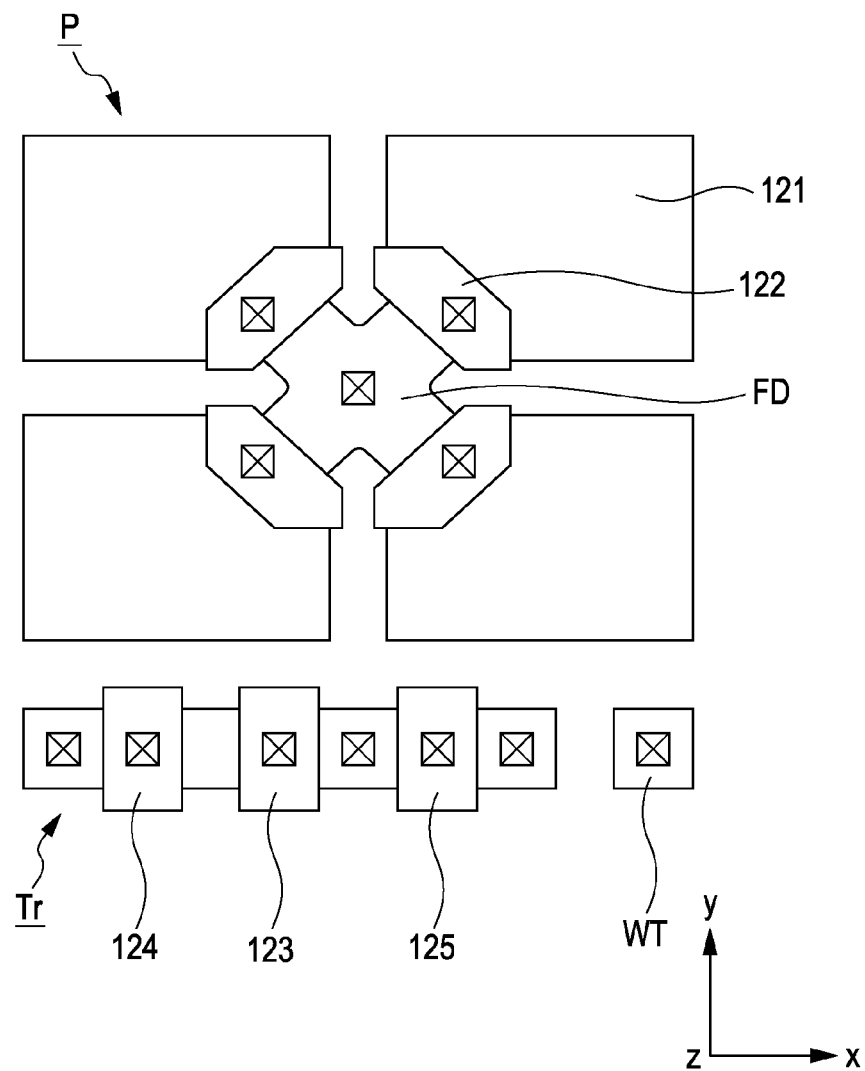
FIG. 42 is a diagram illustrating a main part of a solid-state imaging device according to embodiment 3 of the present invention.
Figure 43:
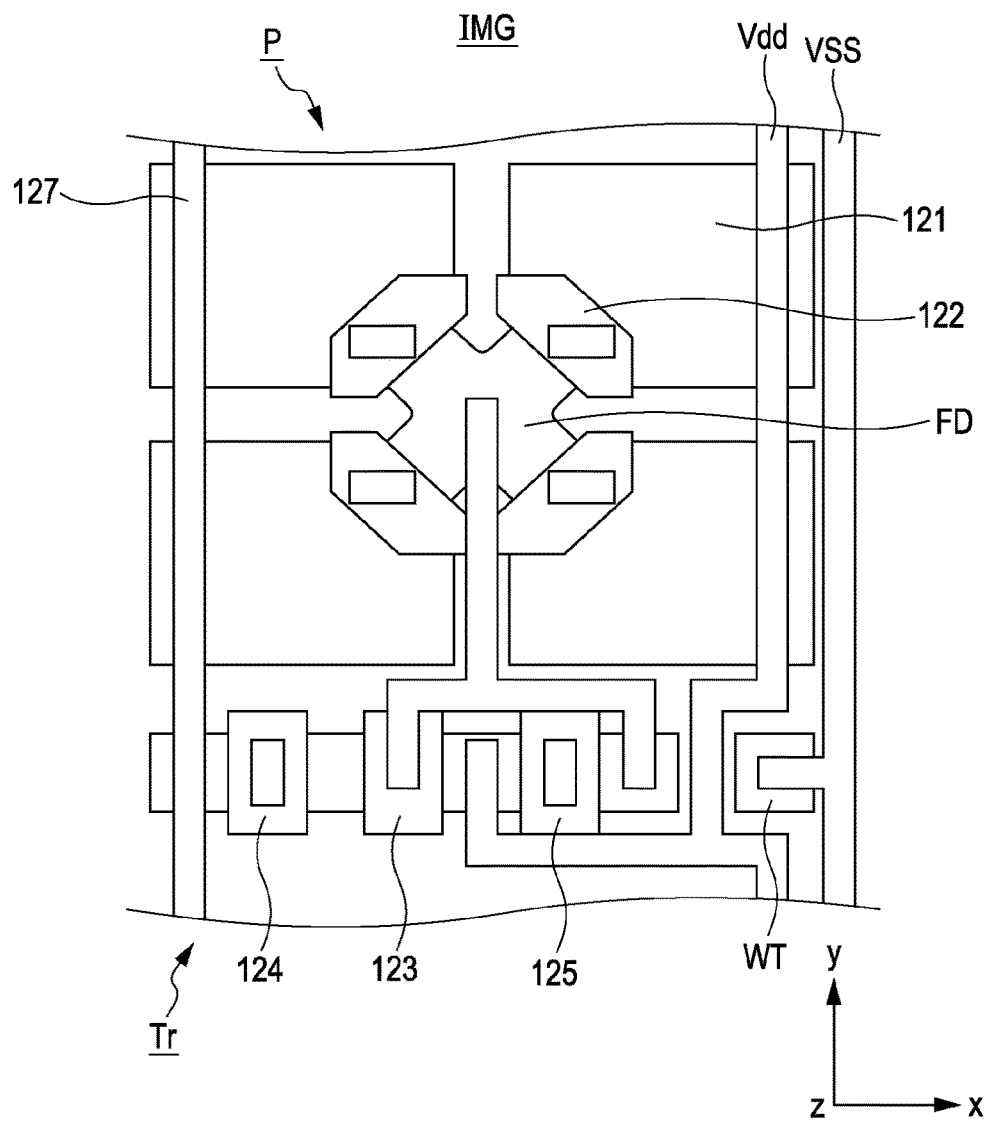
FIG. 43 is a diagram illustrating a main part of a solid-state imaging device according to embodiment 3 of the present invention.
Figure 44:
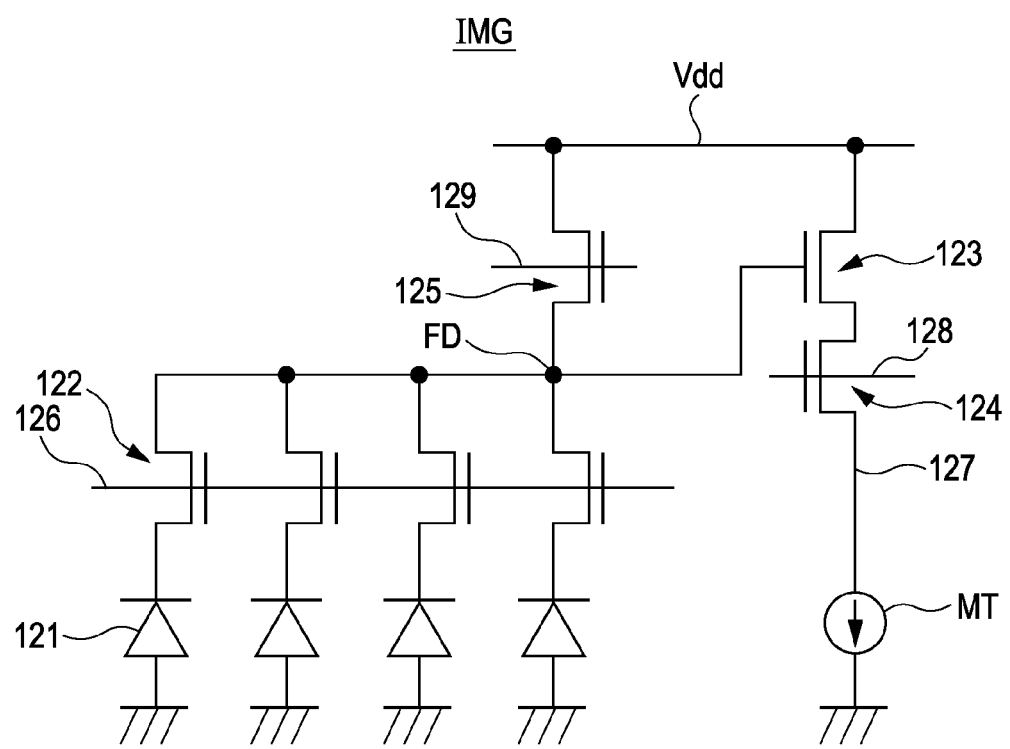
FIG. 44 is a diagram illustrating a main part of a solid-state imaging device according to embodiment 3 of the present invention.

Here, FIGS. 42 to 44 show the pixels P in the effective pixel area IMG. FIGS. 42 and 43 show the upper surface of the pixel area PA. FIG. 42 shows the pixel P (interconnection not illustrated), and FIG. 43 shows the relationship between the pixel P and the interconnection (hatched portion) in the effective pixel area IMG. Also, FIG. 44 shows the circuit configuration of the pixel P installed in the effective pixel area IMG.

Figure 45:
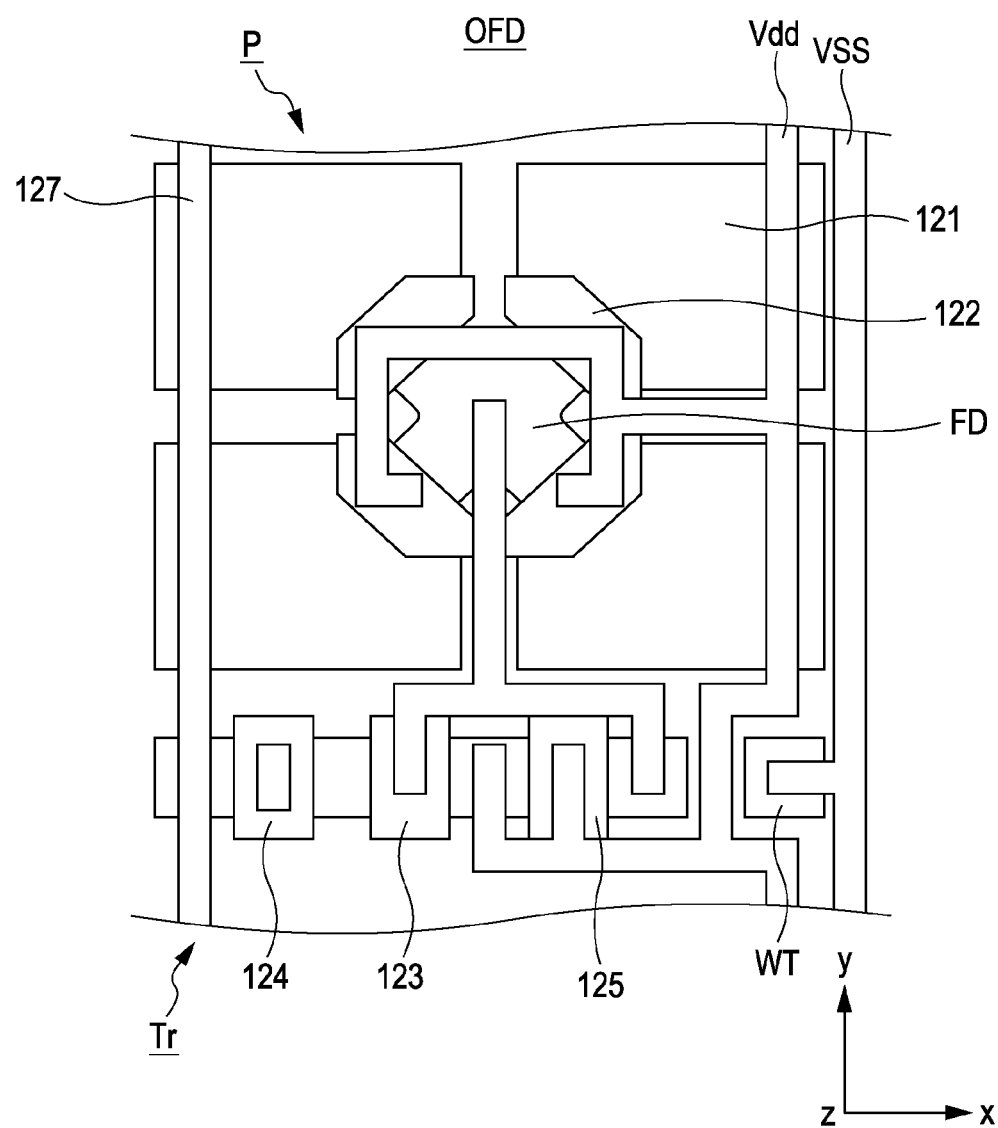
FIG. 45 is a diagram illustrating a main part of a solid-state imaging device according to embodiment 3 of the present invention.
Figure 46:
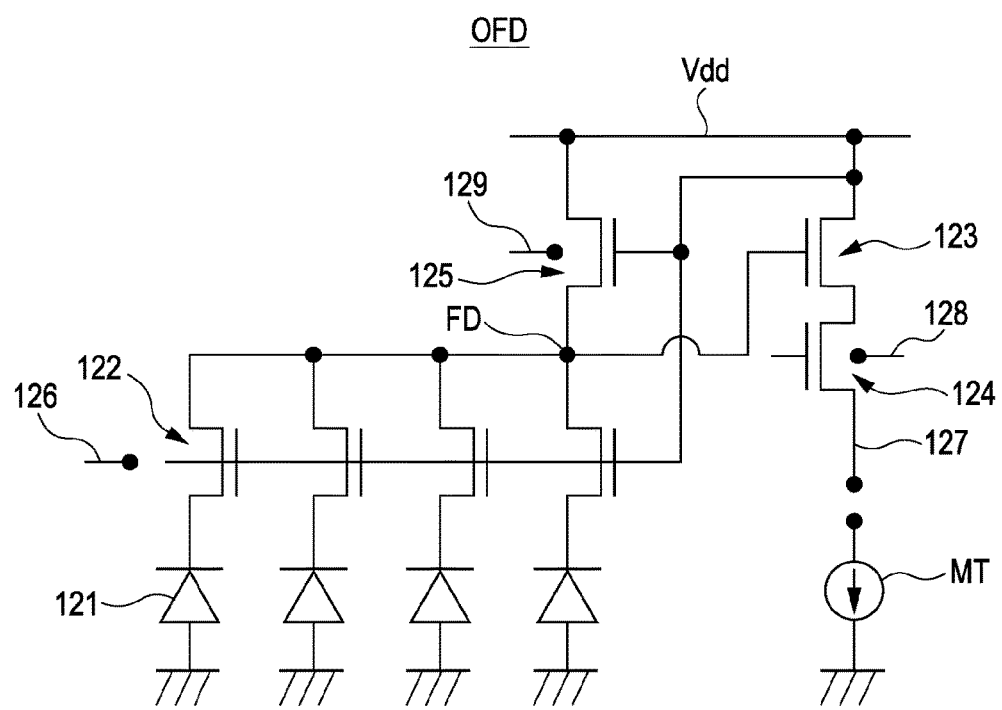
FIG. 46 is a diagram illustrating a main part of a solid-state imaging device according to embodiment 3 of the present invention.

By contrast, FIGS. 45 and 46 show the charge discharging area OFD. FIG. 45 shows the upper surface, and the relationship between the pixel P and the interconnection. Also, FIG. 46 shows the circuit configuration of the pixel P installed in the charge discharging area OFD.

As illustrated in FIGS. 42 to 46, in this embodiment, the configuration of the pixel P is different from that in embodiment 1. Specifically, although plural photodiodes 121 and transmission transistors 122 are installed to correspond to the pixels P, other transistors 123 to 125 that constitute the pixel transistor Tr are installed in one-to-one manner with respect to the plurality of photodiodes 121. That is, among the plurality of pixels P, other transistors 123 to 125 that constitute the pixel transistor Tr are configured to be shared. Except for this, this embodiment is the same as that in embodiment 1. Accordingly, the description of the duplicate portions will be omitted.

A plurality of photodiodes 121, as illustrated in FIG. 42, is arranged to correspond to a plurality of pixels P in the same manner as in embodiment 1.

The transmission transistors 122, as illustrated in FIG. 42, are installed to correspond to the respective photodiodes 121. However, in this embodiment, unlike embodiment 1, as illustrated in FIG. 42, a plurality of transmission transistors 122 is configured to read signal charges from the photodiodes 121 with respect to one read drain FD. Specifically, four transmission transistors 122 are arranged to surround one read drain FD.

Also, the amplification transistor 123, the selection transistor 124, and the reset transistor 125, as illustrated in FIG. 42, are installed with respect to the plurality of photodiodes 121. For example, the amplification transistor 123, the selection transistor 124, and the reset transistor 125 are installed with respect to one set composed of four photodiodes 121. The amplification transistor 123, the selection transistor 124, and the reset transistor 125, as illustrated in FIG. 42, are installed on the lower side of the set composed of four photodiodes 121 on the surface (x-y surface) of the substrate 110. Also, a well tap WT is installed on the lower side of the set composed of four photodiodes 121.

Except for the point that in the effective pixel area IMG, as illustrated in FIGS. 43 and 44, a plurality of transmission transistor 122 is configured to read the signal charges from the photodiodes 121 with respect to one read drain FD, this embodiment is the same as embodiment 1. Although not illustrated, the optical black area OPB is configured in the same manner as the effective pixel area IMG.

Except for the point that even in the charge discharging area OFD, as illustrated in FIGS. 45 and 46, a plurality of transmission transistors 122 is electrically connected to one read drain FD, this embodiment is the same as embodiment 1. That is, in the charge discharging area OFD, the electrical connection relationships of the respective portions differ the effective pixel area IMG and in the optical black area OPB.

Specifically, in the transmission transistor 122, unlike the effective pixel area IMG and in the optical black area OPB, the gate of the transmission transistor 122 is electrically connected to the power potential supply line Vdd. Also, the gate of the transmission transistor 122 and the transmission line 126 are disconnected from each other, and thus are not electrically connected.

Also, the vertical signal line 127 that is connected to the selection transistor 124 is not electrically connected between the load MOS transistor MT that is an output portion.

Further, the gate of the reset transistor 125, unlike in the effective pixel area IMG and in the optical black area OPB, is electrically connected to the power potential supply line Vdd. Also, the gate of the reset transistor 125 and the reset line 129 are disconnected from each other, and thus are not electrically connected.

By performing the same operation as in embodiment 1 in the charge discharging area OFD, the excessive charges leaking from the bulk can be compulsively discharged from the respective pixels P to the outside.

(B) Summary

As described above, in this embodiment, in the same manner as other embodiments, the charge discharging area OFD is installed between the effective pixel area IMG and the optical black area OPB. Also, in the charge discharging area OFD, charge discharging pixels that discharge the signal charges leaking from the effective pixel area IMG are arranged as the light shielding pixels.

In this embodiment, although the transmission transistors 122 are installed one by one with respect to the photodiodes 121, other transistors 123, 124, and 125 are installed one by one for the set of four photodiodes 121.

Accordingly, even in a minute pixel having a plurality of shared pixels, the reference signal of the black level is prevented from being changed due to the leakage of the excessive charges in the bulk into the optical black area OPB.

Accordingly, in this embodiment, the image quality of the captured image can be improved.

4. Embodiment 4

(A) Device Configuration and the Like

Figure 47:
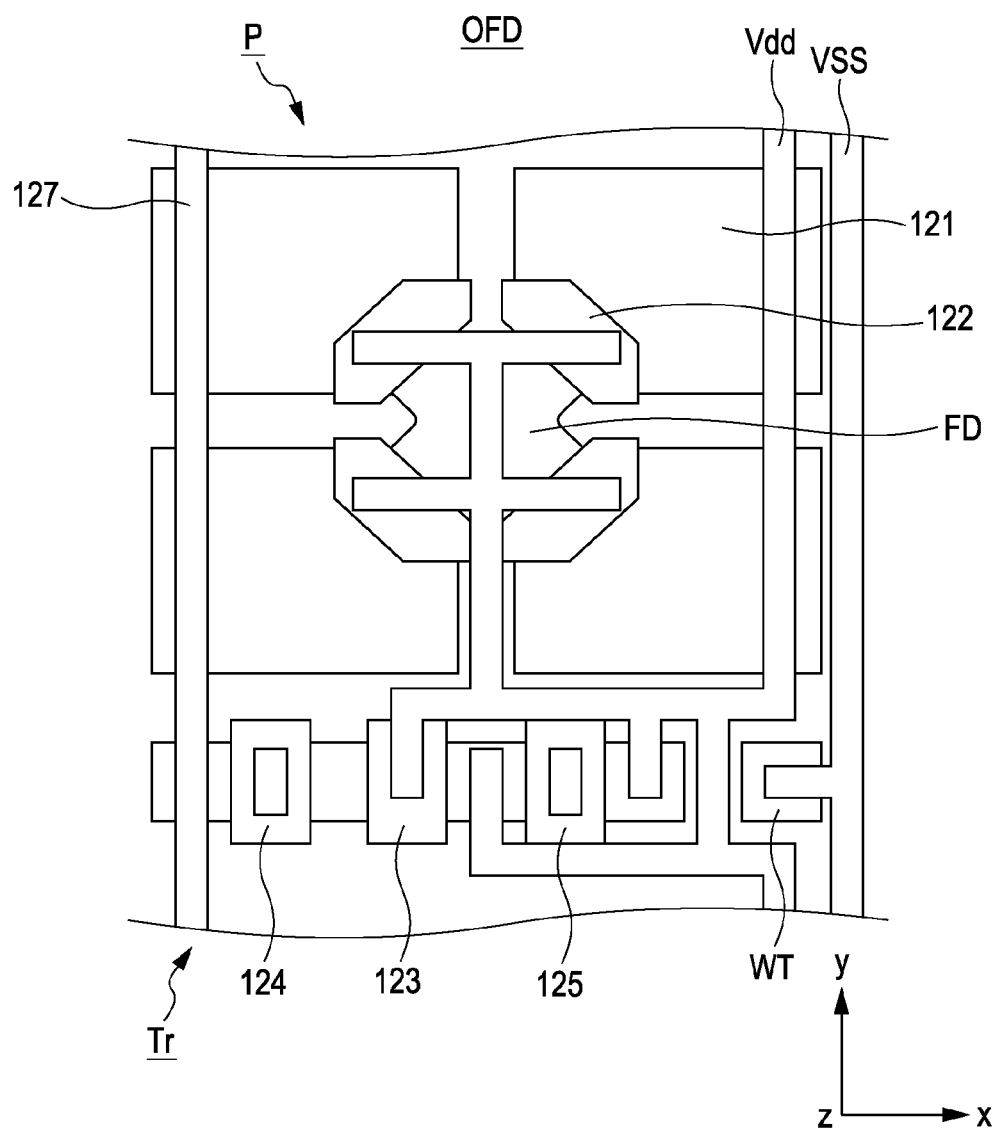
FIG. 47 is a diagram illustrating a main part of a solid-state imaging device according to embodiment 4 of the present invention.
Figure 48:
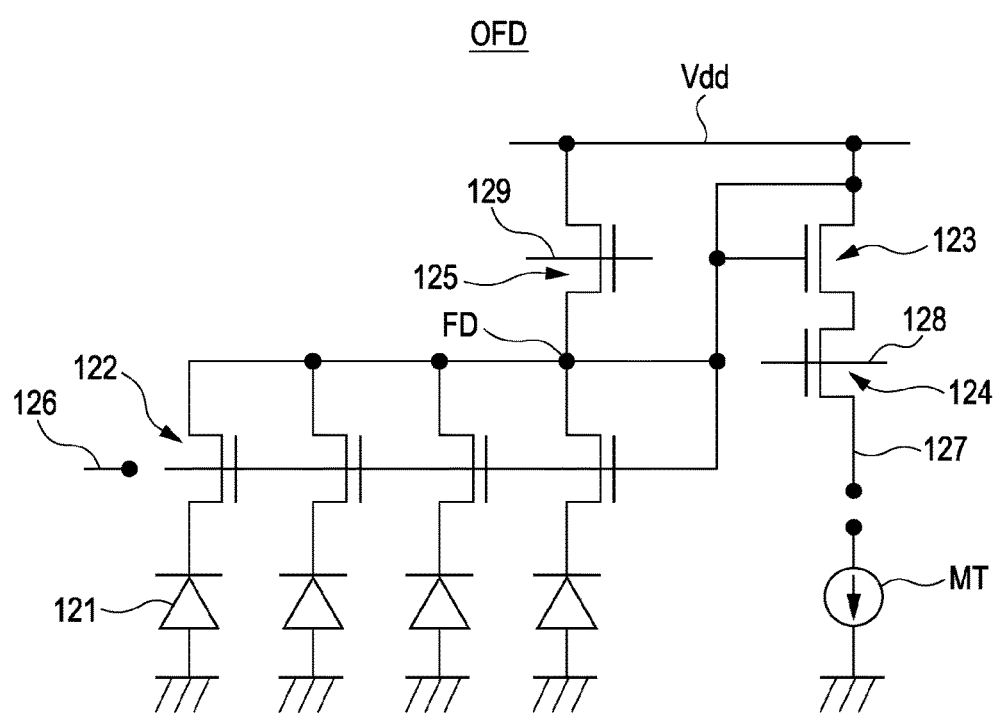
FIG. 48 is a diagram illustrating a main part of a solid-state imaging device according to embodiment 4 of the present invention.

FIGS. 47 and 48 are diagrams illustrating main portions of the solid-state imaging device according to embodiment 4 of the present invention.

Here, FIG. 47, in the same manner as in FIG. 45, shows the charge discharging area OFD. Also, FIG. 48, in the same manner as in FIG. 46, shows the circuit configuration of the pixel P installed in the charge discharging area OFD.

As illustrated in FIGS. 47 and 48, in this embodiment, the configuration of the pixel P installed in the charge discharging area OFD is different from that in embodiment 3. Specifically, the connection relationship between interconnections connected to respective portions constituting the pixel transistor Tr is different from that in embodiment 3.

Except for this, this embodiment is the same as embodiment 3. Accordingly, the description of duplicate portions will be omitted.

In the charge discharging area OFD, respective portions of the transmission transistor 122 are electrically connected in the same manner as in embodiment 3 as illustrated in FIGS. 47 and 48. That is, as illustrated in FIG. 48, the gate of the transmission transistor 122 is electrically connected to the power potential supply line Vdd. Also, as illustrated in FIG. 48, the gate of the transmission transistor 122 and the transmission line 126 are disconnected from each other, and thus are not electrically connected.

In the charge discharging area OFD, as illustrated in FIGS. 47 and 48, the electrical connection relationship between respective portions of the amplification transistor 123 is different from that in embodiment 3. Specifically, as illustrated in FIG. 48, the gate of amplification transistor 123 is electrically connected to the power potential supply line Vdd.

In the charge discharging area OFD, respective portions of the selection transistor 124 are electrically connected in the same manner as in embodiment 3 as illustrated in FIGS. 47 and 48. However, as illustrated in FIG. 48, the vertical signal line 127 connected to the selection transistor 124 is not electrically connected between the load MOS transistor MT.

As illustrated in FIGS. 47 and 48, the electrical connection relationship between respective portions of the reset transistor 125 is different from that in embodiment 3. Specifically, the reset transistor is installed to have the same connection relationship with another effective pixel area IMG and optical black area OPB.

By performing the same operation as in embodiment 2 in the charge discharging area OFD, the excessive charges leaking from the bulk can be compulsively discharged from the respective pixels P to the outside.

(B) Summary

As described above, in this embodiment, in the same manner as other embodiments, the charge discharging area OFD is installed between the effective pixel area IMG and the optical black area OPB. Also, in the charge discharging area OFD, charge discharging pixels that discharge the signal charges leaking from the effective pixel area IMG are arranged as the light shielding pixels.

In addition, in this embodiment, although the transmission transistors 122 are installed one by one with respect to the photodiodes, other transistors 123, 124, and 125 are installed one by one with respect to one set composed of four photodiodes 121.

Accordingly, even in a minute pixel having shared pixels, the reference signal of the black level is prevented from being changed due to the leakage of the excessive charges in the bulk into the optical black area OPB.

Accordingly, in this embodiment, the image quality of the captured image can be improved.

5. Embodiment 5

(A) Device Configuration and the Like

Figure 49:
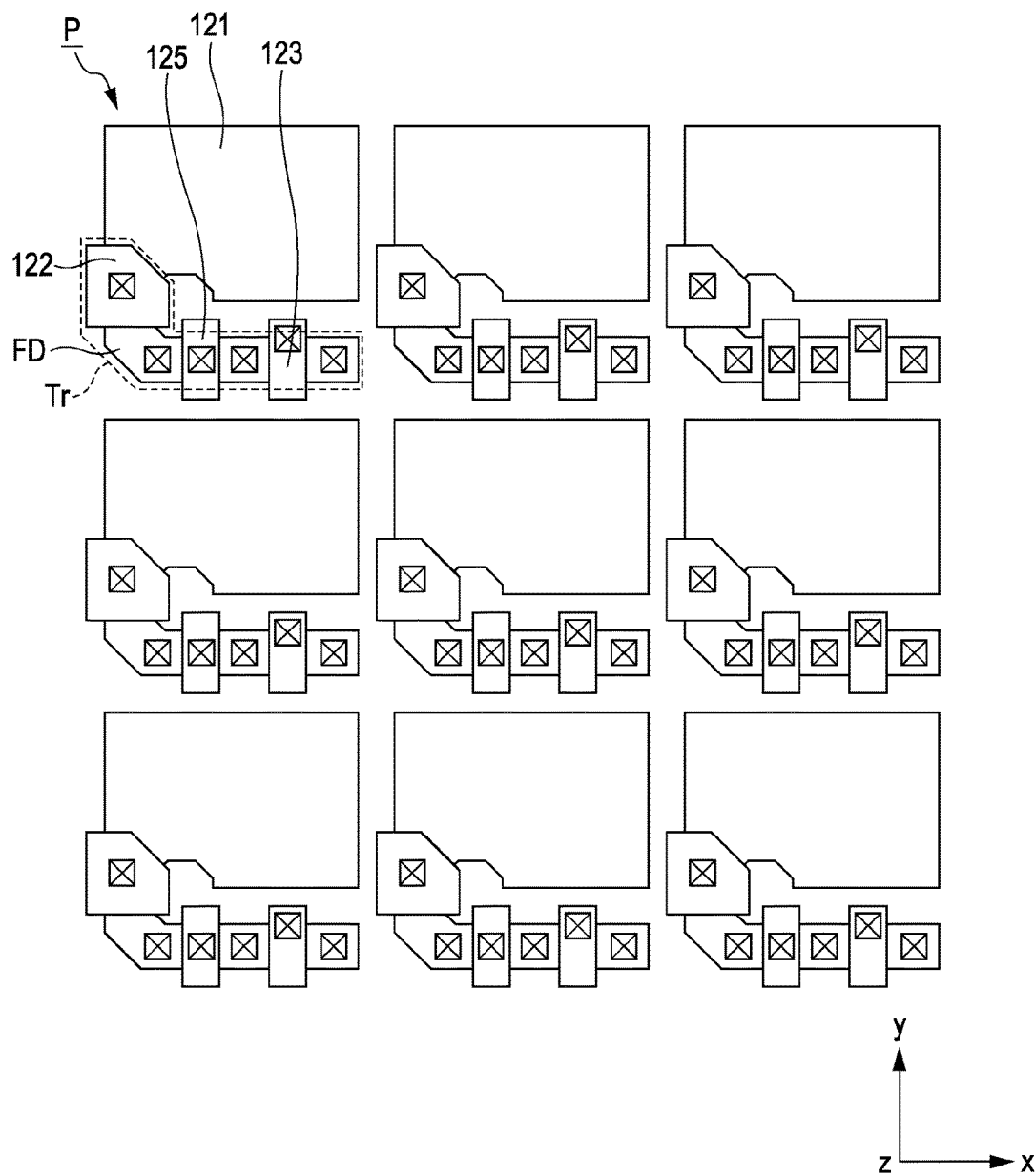
FIG. 49 is a diagram illustrating a main part of a solid-state imaging device according to embodiment 5 of the present invention.
Figure 53:
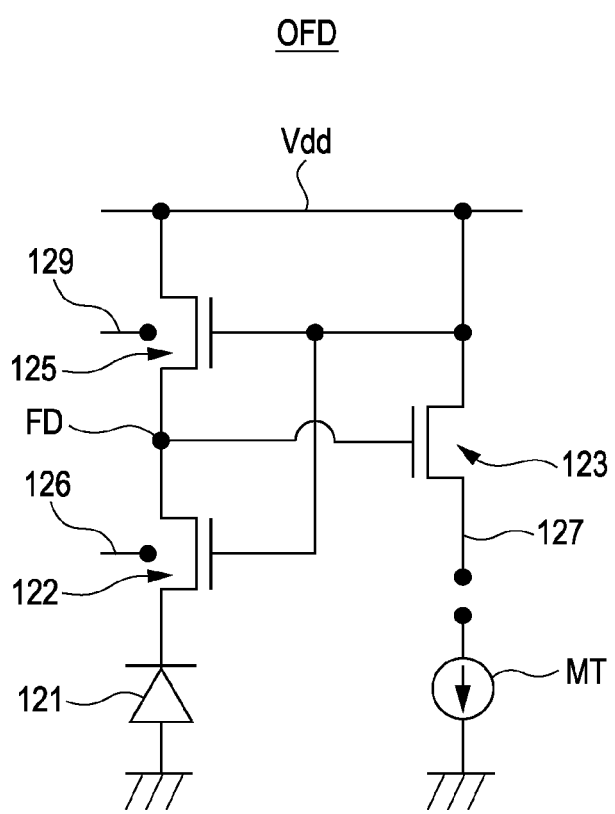
FIG. 53 is a diagram illustrating a main part of a solid-state imaging device according to embodiment 5 of the present invention.

FIGS. 49 and 53 are diagrams illustrating main portions of the solid-state imaging device according to embodiment 5 of the present invention.

Figure 50:
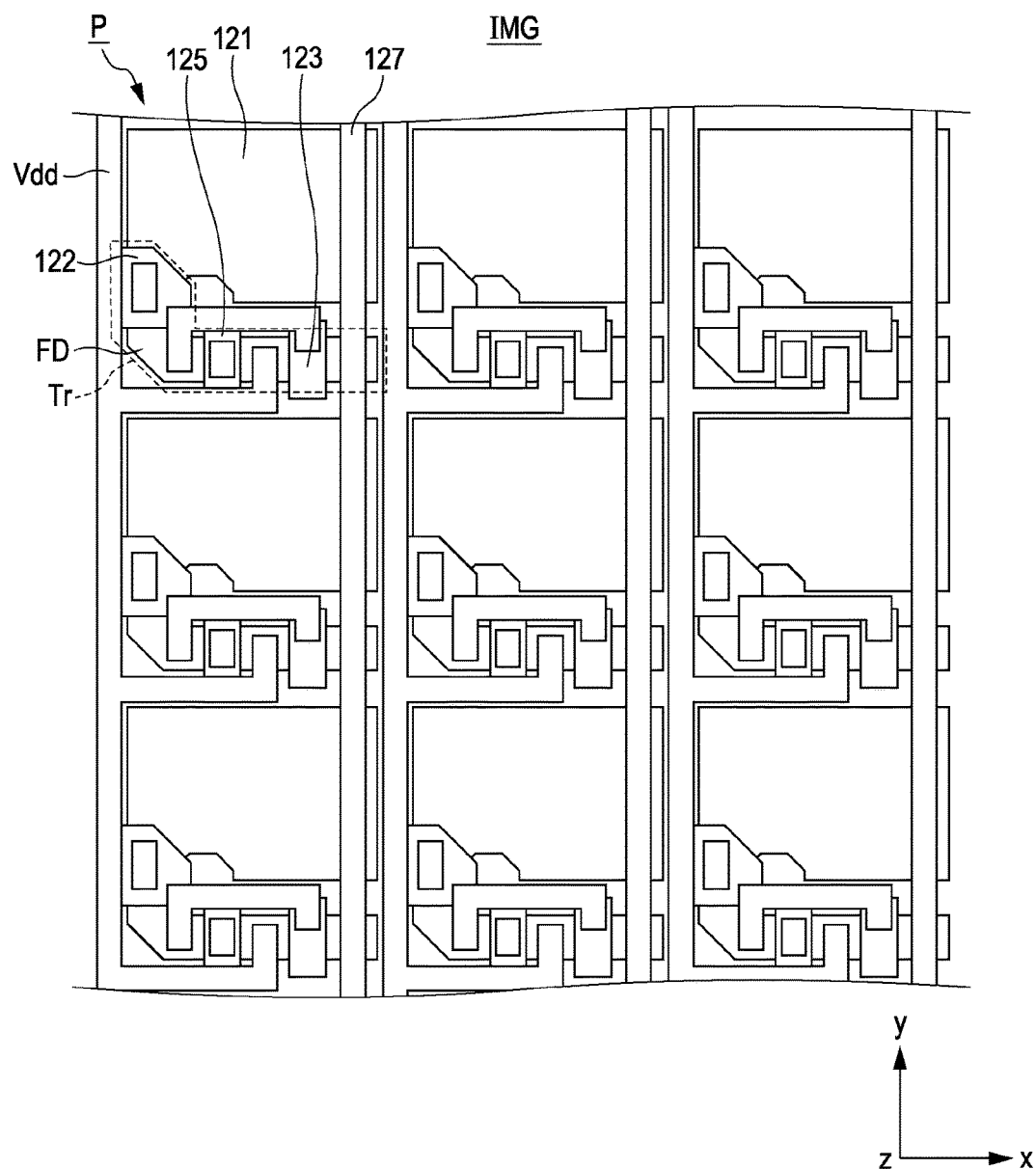
FIG. 50 is a diagram illustrating a main part of a solid-state imaging device according to embodiment 5 of the present invention.
Figure 51:
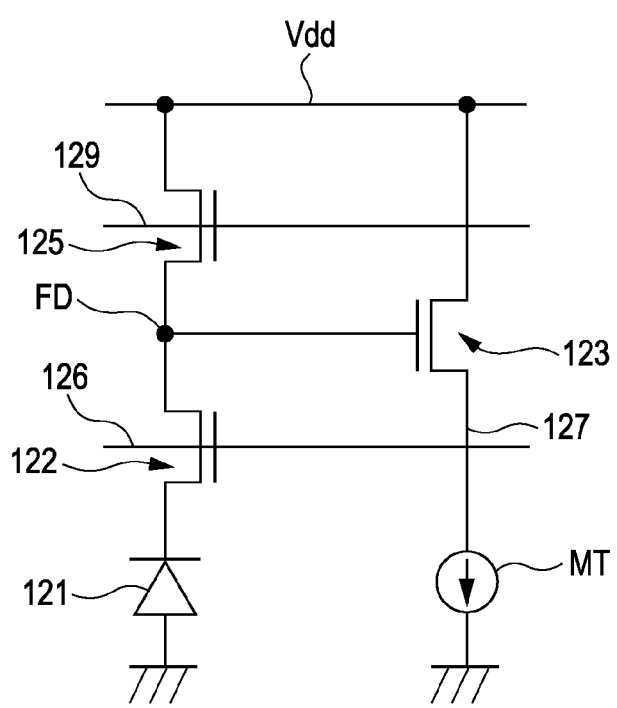
FIG. 51 is a diagram illustrating a main part of a solid-state imaging device according to embodiment 5 of the present invention.

Here, FIGS. 49 to 51 show the pixels P in the effective pixel area IMG. FIGS. 49 and 50 show the upper surface of the pixel area PA. FIG. 49 shows the pixel P (interconnection not illustrated), and FIG. 50 shows the relationship between the pixel P and the interconnection (hatched portion) in the effective pixel area IMG. Also, FIG. 51 shows the circuit configuration of the pixel P installed in the effective pixel area IMG.

Figure 52:
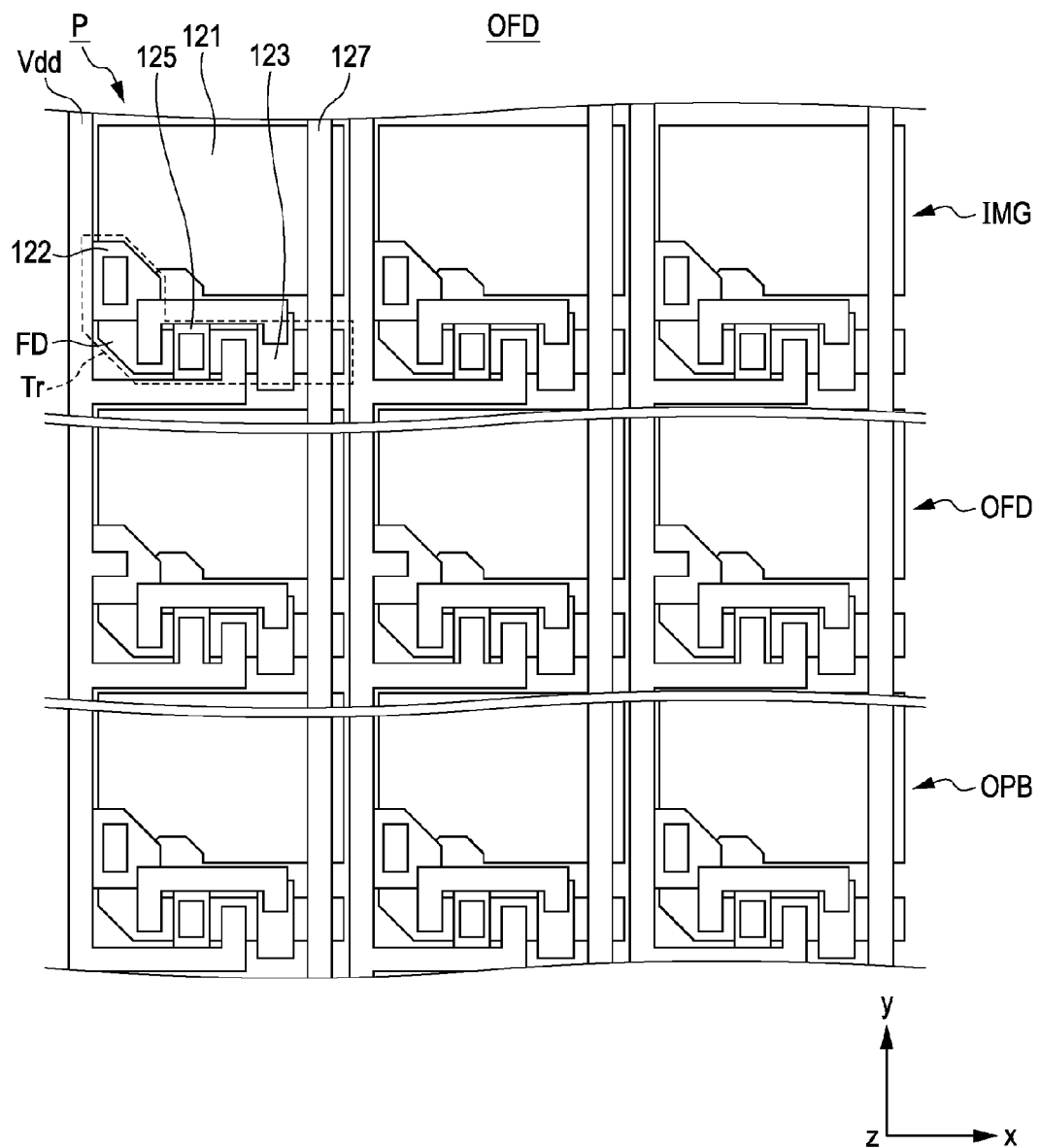
FIG. 52 is a diagram illustrating a main part of a solid-state imaging device according to embodiment 5 of the present invention.

By contrast, FIG. 52 shows the optical black area OPB and the charge discharging area OFD installed in the light shielding area BL in addition to the effective pixel area IMG. FIG. 52 shows the upper surface of the respective areas, and the relationship between the pixel P and the interconnection.

In addition to this, FIG. 53 shows the circuit configuration of the pixel P installed in the charge discharging area OFD.

As illustrated in the respective drawings, in this embodiment, the configuration of the pixel transistor Tr is different from that in embodiment 1. Except for this, this embodiment is the same as embodiment 1, and the description of the duplicate portion will be omitted.

As illustrated in the respective drawings, the solid-state imaging device 101, in the same manner as in embodiment 1, includes a photodiode 121 and a pixel transistor Tr. The pixel transistor Tr includes a transmission transistor 122, an amplification transistor 123, and a reset transistor 125, and is configured to read signal charges from the photodiode 121.

However, in this embodiment, a selection transistor 124 is not included in the pixel transistor Tr. That is, the solid-state imaging device 101 in this embodiment is not 4Tr type, but is "the back-side illumination CMOS image sensor" of a 3Tr type.

In the pixel transistor Tr, a plurality of transmission transistors 122, as illustrated in FIG. 49, in the same manner as in embodiment 1, is formed to correspond to a plurality of pixels P.

Here, the gate of the transmission transistor 122 is installed neighboring the read drain (floating diffusion) FD (see FIG. 49).

Also, as illustrated in FIGS. 50 and 51, in the effective pixel area IMG, the transmission transistor 122 is configured to output the signal charges generated from the photodiode 121 to the gate of the amplification transistor 123 as an electric signal.

Also, as illustrated in the lower end portion of FIG. 52, even in the optical black area OPB, the transmission transistor 122 is configured in the same manner as in the effective pixel area IMG.

By contrast, in the charge discharging area OFD, as illustrated in the intermediate portion of FIG. 52 and FIG. 53, the electric connection relationships between the respective portions differ the effective pixel area IMG and in the optical black area OPB. Specifically, in the transmission transistor 122, unlike the effective pixel area IMG and the optical black area OPB, the gate of the transmission transistor 122 is electrically connected to a power potential supply line Vdd. Also, as illustrated in FIG. 52, the gate of the transmission transistor 122 and the transmission line 126 are disconnected from each other, and thus are not electrically connected to each other.

In the pixel transistor Tr, a plurality of amplification transistors 123, as illustrated in FIG. 49, is formed to correspond to a plurality of pixels P, respectively, in the same manner as in embodiment 1.

Here, the amplification transistor 123 is installed neighboring the reset transistor 125 (see FIG. 49).

Also, as illustrated in FIGS. 50 and 51, in the effective pixel area IMG, the amplification transistor 123, in the read drain FD, is configured to amplify and output the electric signal which has been converted from the charges into the voltage.

Also, as shown in the lower end portion of FIG. 52, even in the optical black area OPB, the amplification transistor 123 is configured in the same manner as in the effective pixel area IMG.

In the same manner, even in the charge discharging area OFD, the amplification transistor 123, as illustrated in the intermediate portion of FIG. 52 and FIG. 53, is configured in the same manner as the effective pixel area IMG and the optical black area OPB. However, as illustrated in FIG. 53, the vertical signal line 127 connected to the amplification transistor 123 is not electrically connected between the load MOS transistor MT and the vertical signal line 127.

In the pixel transistor Tr, a plurality of reset transistor 125, as illustrated in FIG. 49, in the same manner as in embodiment 1, is formed to correspond to a plurality of pixels P.

Here, the reset transistor 125 is installed neighboring the transmission transistor 122 (see FIG. 49).

Also, as illustrated in FIGS. 50 and 51, in the effective pixel area IMG, the reset transistor 125 is configured to reset the gate potential of the amplification transistor 123.

Also, as shown in the lower end portion of FIG. 52, even in the optical black area OPB, the reset transistor 125 is configured in the same manner as the effective pixel area IMG.

By contrast, in the charge discharging area OFD, as illustrated in the intermediate portion of FIG. 52 and FIG. 53, the electric connection relationships between the respective portions differ in the effective pixel area IMG and in the optical black area OPB. Specifically, in the reset transistor 125, unlike the effective pixel area IMG and the optical black area OPB, the gate of the reset transistor 125 is electrically connected to a power potential supply line Vdd. Also, as illustrated in FIG. 53, the gate of the reset transistor 125 and the reset line 129 are disconnected from each other, and thus are not electrically connected to each other.

(B) Operation

The operation of the solid-state imaging device in the charge discharging area OFD will be described.

In the charge discharging area OFD, for example, a power supply voltage Vdd is applied to the gate of the transmission transistor 122 and the gate of the reset transistor 125. Accordingly, in the charge discharging area OFD, the excessive charges leaking from the bulk can be compulsively discharged from the respective pixels P to the outside.

In addition to this, the same operation can be performed by applying a high fixed voltage, which is enough to discharge the excessive charges, to the gates of the transmission transistor 122 and the reset transistor 125.

Since this embodiment is of 3Tr type, the pixel P can be minutely formed in comparison to that in embodiment 1, and in the same manner as in embodiment 1, the excessive charges can be effectively discharged.

(C) Summary

As described above, in this embodiment, in the same manner as other embodiments, the charge discharging area OFD is installed between the effective pixel area IMG and the optical black area OPB. Also, in the charge discharging area OFD, charge discharging pixels that discharge the signal charges leaking from the effective pixel area IMG are arranged as the light shielding pixels.

Specifically, in the charge discharging area OFD, the gate of the transmission transistor 122 is not electrically connected to the transmission line 126, but the potential at which the transmission transistor 122 is turned on is applied to the gate of the transmission transistor 122. Also, the gate of the reset transistor 125 is not electrically connected to the reset line 129, but the potential at which the reset transistor 125 is turned on is applied to the gate of the reset transistor 125. Also, the vertical signal line 127 to which the electric signal from the pixel transistor Tr is output and the load MOS transistor MT to which the vertical signal line 127 outputs the electric signal are not electrically connected to each other.

Accordingly, in this embodiment, the reference signal of the black level can be prevented from being changed due to the leakage of the excessive charges in the bulk into the optical black area OPB.

Accordingly, in this embodiment, the image quality of the captured image can be improved.

6. Embodiment 6

(A) Device Configuration and the Like

Figure 54:
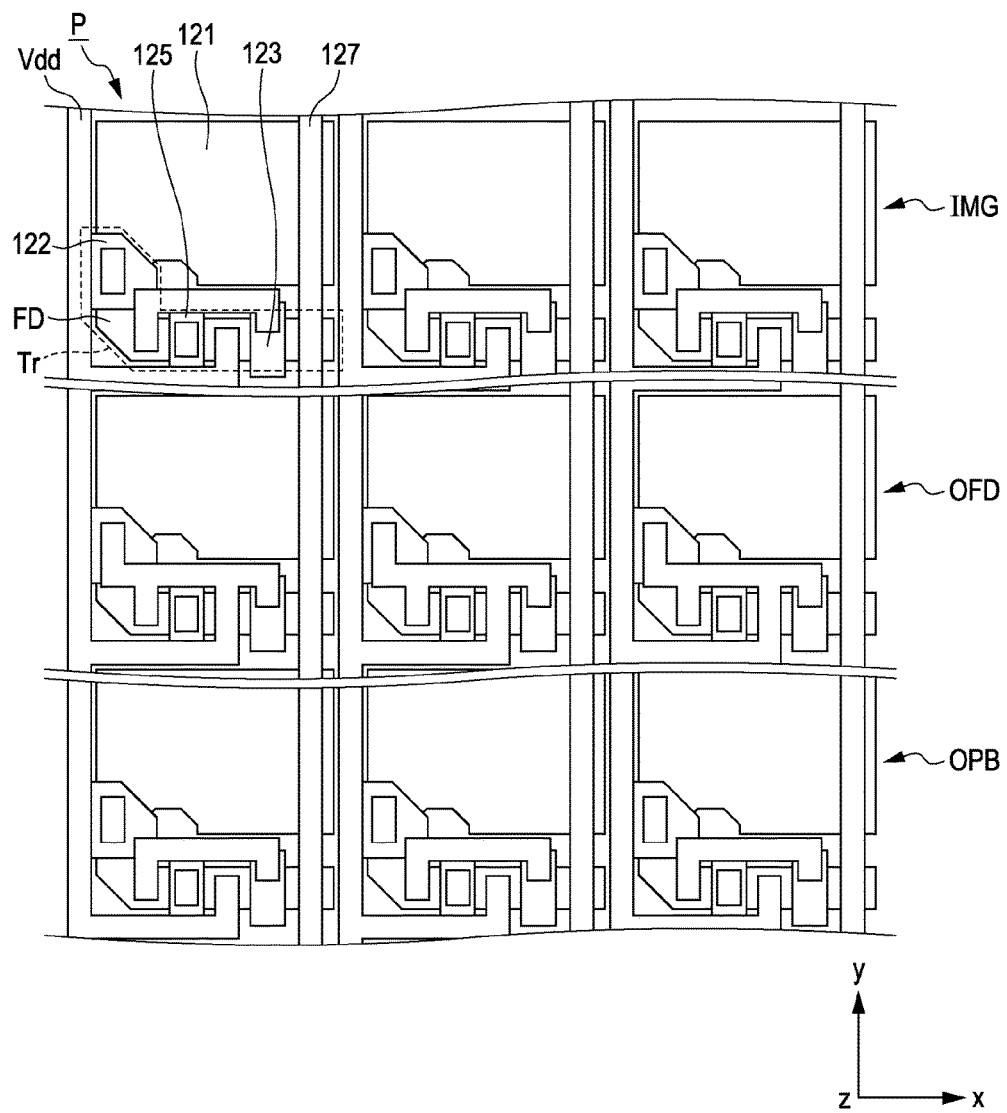
FIG. 54 is a diagram illustrating a main part of a solid-state imaging device according to embodiment 6 of the present invention.
Figure 55:
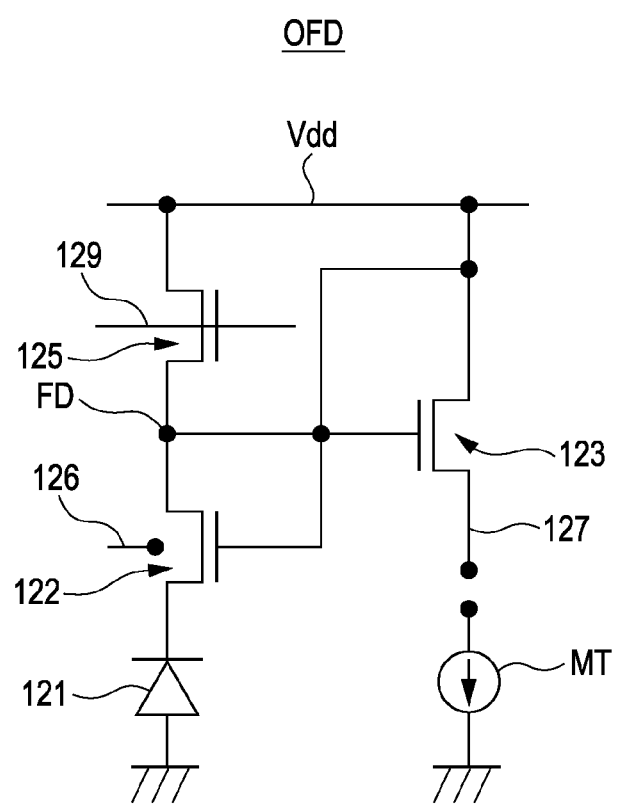
FIG. 55 is a diagram illustrating a main part of a solid-state imaging device according to embodiment 6 of the present invention.

FIGS. 54 and 55 are diagrams illustrating main portions of the solid-state imaging device according to embodiment 6 of the present invention.

Here, FIG. 54, in the same manner as in FIG. 52, shows the optical black area OPB and the charge discharging area OFD in addition to the effective pixel area IMG. Also, FIG. 55, in the same manner as in FIG. 53, shows the circuit configuration of the pixel P installed in the charge discharging area OFD.

As illustrated in FIGS. 54 and 55, in this embodiment, the configuration of the pixel P installed in the charge discharging area OFD is different from that in embodiment 5. Specifically, the connection relationship between interconnections connected to respective portions constituting the pixel transistor Tr is different from that in embodiment 5. Except for this, this embodiment is the same as embodiment 5. Accordingly, the description of duplicate portions will be omitted.

In the charge discharging area OFD, respective portions of the transmission transistor 122 are electrically connected in the same manner as in embodiment 5 as illustrated in FIGS. 54 and 55. That is, as illustrated in FIG. 55, the gate of the transmission transistor 122 is electrically connected to the power potential supply line Vdd. Also, as illustrated in FIG. 55, the gate of the transmission transistor 122 and the transmission line 126 are disconnected from each other, and thus are not electrically connected.

In the charge discharging area OFD, as illustrated in FIGS. 54 and 55, the electrical connection relationship between respective portions of the amplification transistor 123 is different from that in embodiment 5. Specifically, as illustrated in FIG. 55, the gate of the amplification transistor 123 is electrically connected to the power potential supply line Vdd. However, as illustrated in FIG. 55, the vertical signal line 127 that is connected to the amplification transistor 123 is not electrically connected between the load MOS transistor MT and the vertical signal line 127.

As illustrated in FIGS. 54 and 55, the electrical connection relationship between respective portions of the reset transistor 125 is different from that in embodiment 5. Specifically, the reset transistor is installed to have the same connection relationship with another effective pixel area IMG and optical black area OPB.

That is, the solid-state imaging device in this embodiment is the same as that in embodiment 2 except that the solid-state imaging device in this embodiment is not of 4Tr type, but is of 3Tr.

(B) Operation

The operation of the solid-state imaging device in the charge discharging area OFD will be described.

In the charge discharging area OFD, for example, a power supply voltage Vdd is applied to the gate of the transmission transistor 122 and a diffusion layer that is used as the read drain FD in the pixel P of another area. Accordingly, in the charge discharging area OFD, the excessive charges leaking from the bulk can be compulsively discharged from the respective pixels P to the outside.

In addition to this, the same operation can be performed by applying a high fixed voltage, which is enough to discharge the excessive charges, to the gate of the transmission transistor 122 and the diffusion layer that is used as the read drain FD in the pixels P in another area.

In this embodiment, the discharge of the excessive current can be performed more efficiently in comparison to the case in embodiment 5.

(C) Summary

As described above, in this embodiment, in the same manner as embodiment 1, the charge discharging area OFD is installed between the effective pixel area IMG and the optical black area OPB. Also, in the charge discharging area OFD, charge discharging pixels that discharge the signal charges leaking from the effective pixel area IMG are arranged as the light shielding pixels.

Specifically, in the charge discharging area OFD, the gate of the transmission transistor 122 is not electrically connected to the transmission line 126. Also, the potential at which the transmission transistor 122 is turned on is applied to the gate of the transmission transistor 122 and the read drain FD that is an output portion. Also, the vertical signal line 127 to which the electric signal from the pixel transistor Tr is output and the load MOS transistor MT to which the vertical signal line 127 outputs the electric signal are not electrically connected to each other.

Accordingly, in this embodiment, the reference signal of the black level is prevented from being changed due to the leakage of the excessive charges in the bulk into the optical black area OPB.

Accordingly, in this embodiment, the image quality of the captured image can be improved.

7. Embodiment 7

(A) Device Configuration and the Like

FIGS. 56 to 60 are diagrams illustrating main portions of the solid-state imaging device according to embodiment 7 of the present invention.

Figure 56:
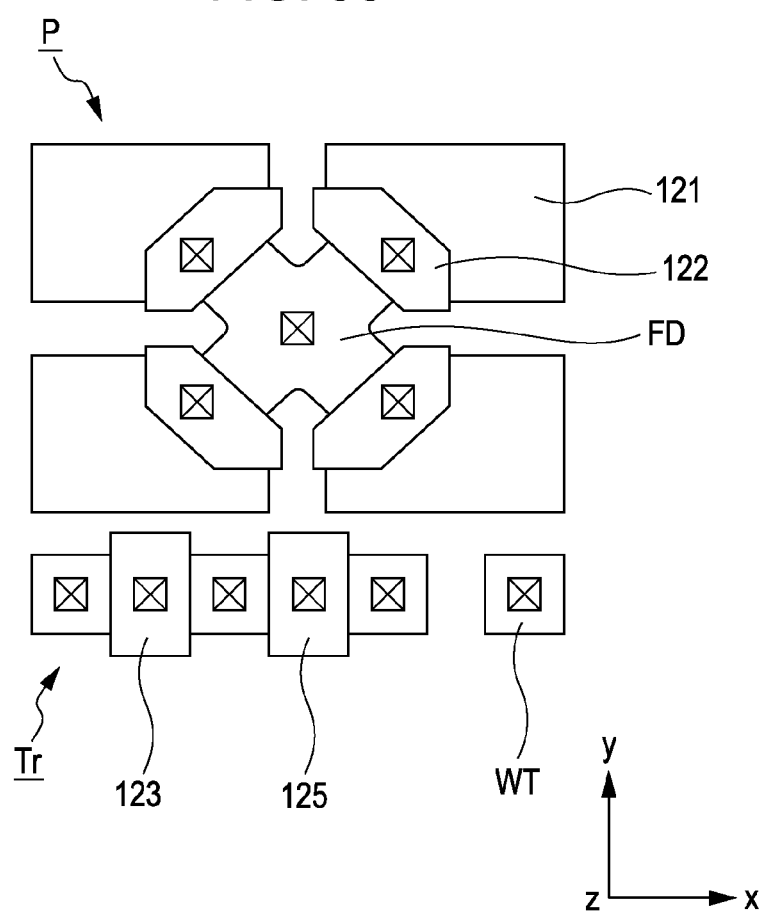
FIG. 56 is a diagram illustrating a main part of a solid-state imaging device according to embodiment 7 of the present invention.
Figure 57:
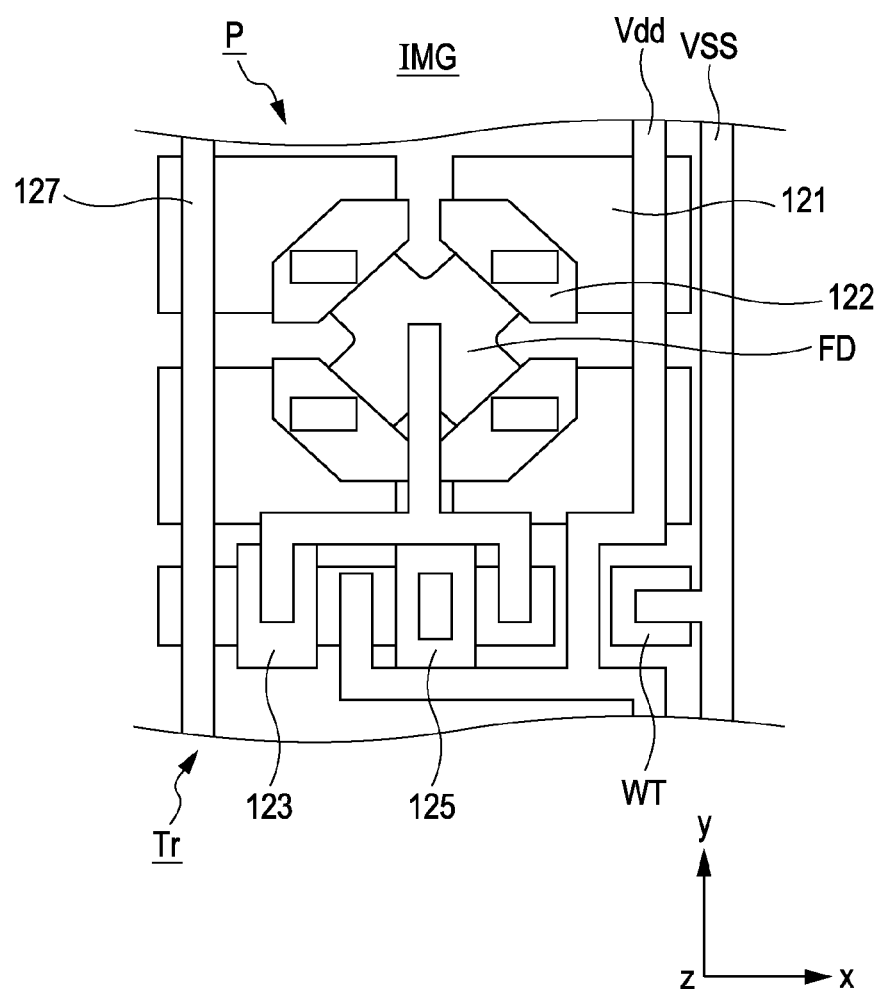
FIG. 57 is a diagram illustrating a main part of a solid-state imaging device according to embodiment 7 of the present invention.
Figure 58:
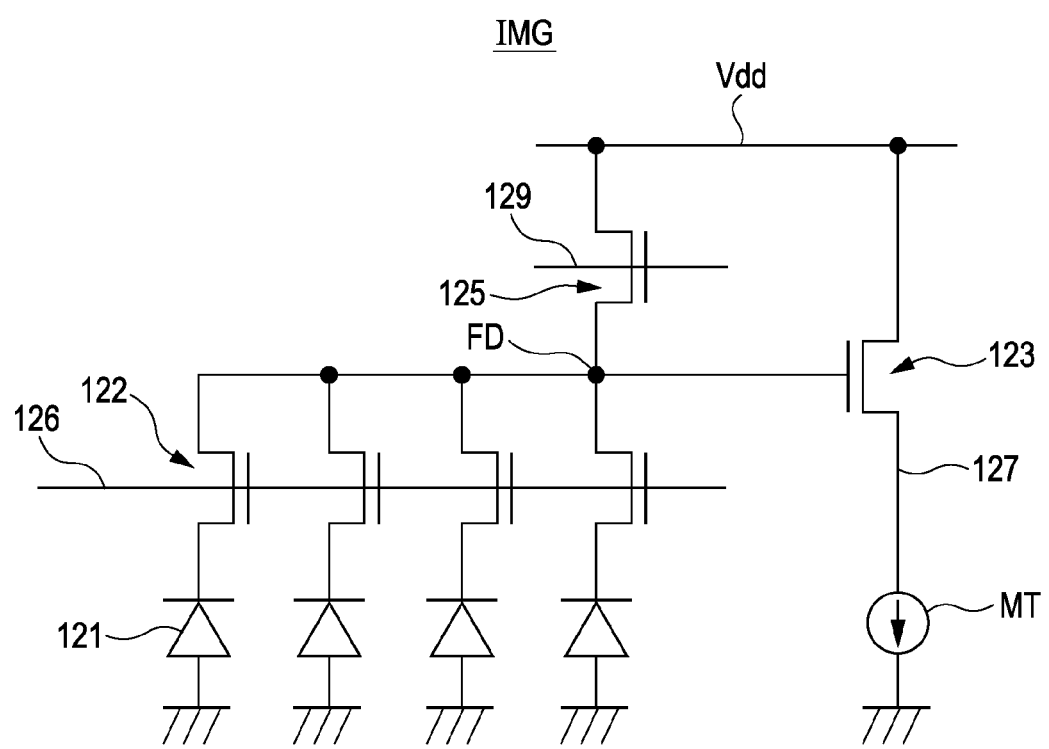
FIG. 58 is a diagram illustrating a main part of a solid-state imaging device according to embodiment 7 of the present invention.

Here, FIGS. 56 to 58 show the pixels P in the effective pixel area IMG. FIGS. 56 and 57 show the upper surface of the pixel area PA. FIG. 56 shows the pixel P (interconnection not illustrated), and FIG. 57 shows the relationship between the pixel P and the interconnection (hatched portion) in the effective pixel area IMG. Also, FIG. 58 shows the circuit configuration of the pixel P installed in the effective pixel area IMG.

Figure 59:
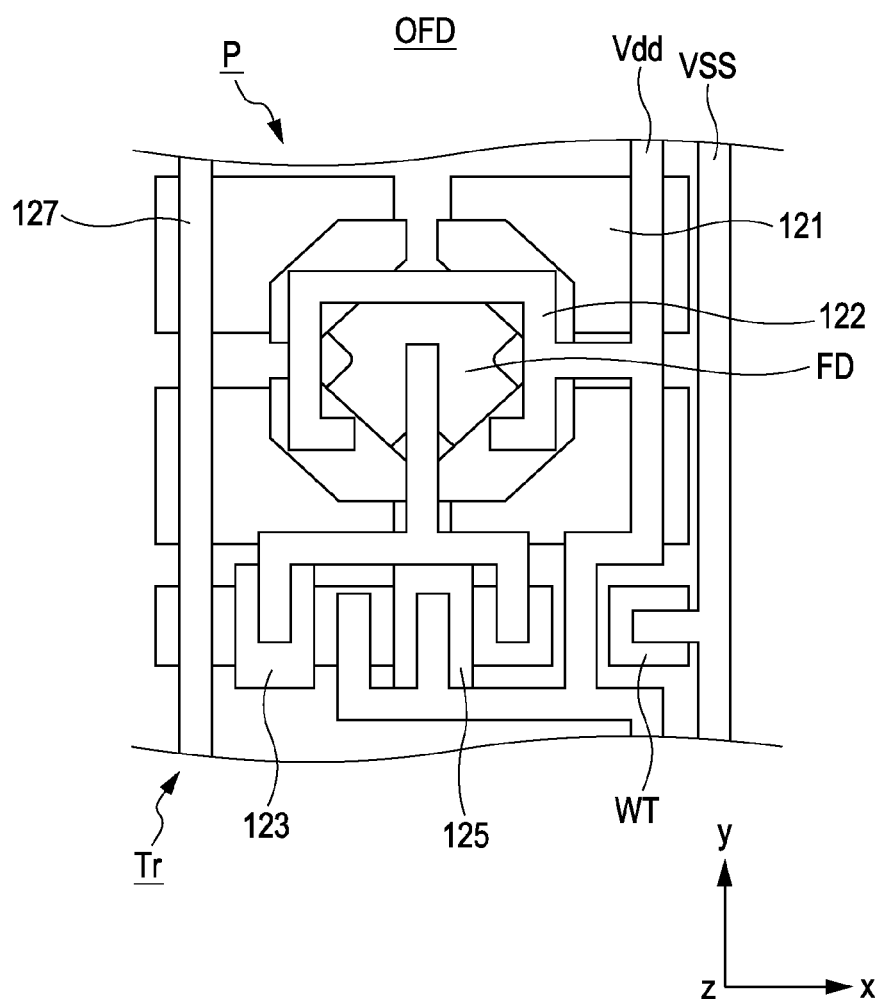
FIG. 59 is a diagram illustrating a main part of a solid-state imaging device according to embodiment 7 of the present invention.
Figure 60:
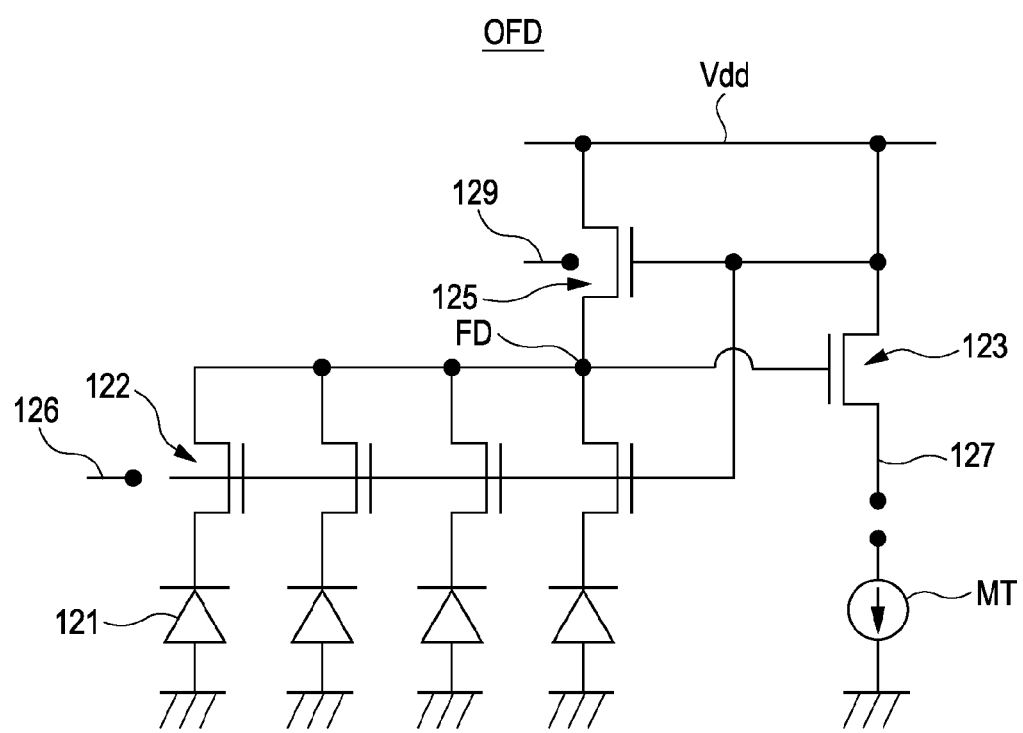
FIG. 60 is a diagram illustrating a main part of a solid-state imaging device according to embodiment 7 of the present invention.

By contrast, FIGS. 59 and 60 show the charge discharging area OFD. FIG. 59 shows the upper surface, and the relationship between the pixel P and the interconnection. Also, FIG. 60 shows the circuit configuration of the pixel P installed in the charge discharging area OFD.

As illustrated in FIGS. 56 to 60, in this embodiment, the configuration of the pixel P is different from that in embodiment 5. Specifically, although plural photodiodes 121 and transmission transistors 122 are installed to correspond to the pixels P, other transistors 123 and 125, which constitute the pixel transistor Tr, are installed one by one with respect to the plurality of photodiodes 121. That is, among the plurality of pixels P, other transistors 123 and 125 that constitute the pixel transistor Tr are configured to be shared. Except for this, this embodiment is the same as that in embodiment 5. Accordingly, the description of the duplicate portions will be omitted.

A plurality of photodiodes 121, as illustrated in FIG. 56, is arranged to correspond to a plurality of pixels P in the same manner as in embodiment 5.

The transmission transistors 122, as illustrated in FIG. 56, are installed to correspond to the respective photodiodes 121. However, in this embodiment, unlike embodiment 1, as illustrated in FIG. 56, a plurality of transmission transistors 122 is configured to read signal charges from the photodiodes 121 with respect to one read drain FD. Specifically, four transmission transistors 122 are arranged to surround one read drain FD.

Also, the amplification transistor 123 and the reset transistor 125, as illustrated in FIG. 56, are installed with respect to the plurality of photodiodes 121. For example, the amplification transistor 123 and the reset transistor 125 are installed with respect to one set composed of four photodiodes 121. The amplification transistor 123 and the reset transistor 125, as illustrated in FIG. 56, are installed on the lower side of the set composed of four photodiodes 121 on the surface (x-y surface) of the substrate 110. Also, a well tap WT is installed on the lower side of the set composed of four photodiodes 121.

Except for the point that in the effective pixel area IMG, as illustrated in FIGS. 57 and 58, a plurality of transmission transistor 122 is configured to read the signal charges from the photodiodes 121 with respect to one read drain FD, this embodiment is the same as embodiment 1. Although not illustrated, the optical black area OPB is configured in the same manner as the effective pixel area IMG.

Except for the point that even in the charge discharging area OFD, as illustrated in FIGS. 59 and 60, a plurality of transmission transistors 122 is electrically connected to one read drain FD, this embodiment is the same as embodiment 5. That is, in the charge discharging area OFD, the electrical connection relationships of the respective portions differ in the effective pixel area IMG and in the optical black area OPB.

Specifically, in the transmission transistor 122, unlike the effective pixel area IMG and in the optical black area OPB, the gate of the transmission transistor 122 is electrically connected to the power potential supply line Vdd. Also, the gate of the transmission transistor 122 and the transmission line 126 are disconnected from each other, and thus are not electrically connected.

Also, the vertical signal line 127 that is connected to the amplification transistor 123 is not electrically connected between the load MOS transistor MT that is an output portion.

Further, the gate of the reset transistor 125, unlike the effective pixel area IMG and in the optical black area OPB, is electrically connected to the power potential supply line Vdd. Also, the gate of the reset transistor 125 and the reset line 129 are disconnected from each other, and thus are not electrically connected.

That is, the solid-state imaging device in this embodiment is the same as that in embodiment 3 except that the solid-state imaging device in this embodiment is not of 4Tr type, but is of 3Tr type.

By performing the same operation as in embodiment 5 in the charge discharging area OFD, the excessive charges leaking from the bulk can be compulsively discharged from the respective pixels P to the outside.

(B) Summary

As described above, in this embodiment, in the same manner as other embodiments, the charge discharging area OFD is installed between the effective pixel area IMG and the optical black area OPB. Also, in the charge discharging area OFD, charge discharging pixels that discharge the signal charges leaking from the effective pixel area IMG are arranged as the light shielding pixels.

In this embodiment, although the transmission transistors 122 are installed one by one with respect to the photodiodes 121, other transistors 123, 124, and 125 are installed one by one with respect to one set composed of four photodiodes 121.

Accordingly, even in a minute pixel having the shared pixels, the reference signal of the black level is prevented from being changed due to the leakage of the excessive charges in the bulk into the optical black area OPB.

Accordingly, in this embodiment, the image quality of the captured image can be improved.

8. Embodiment 8

(A) Device Configuration and the Like

Figure 61:
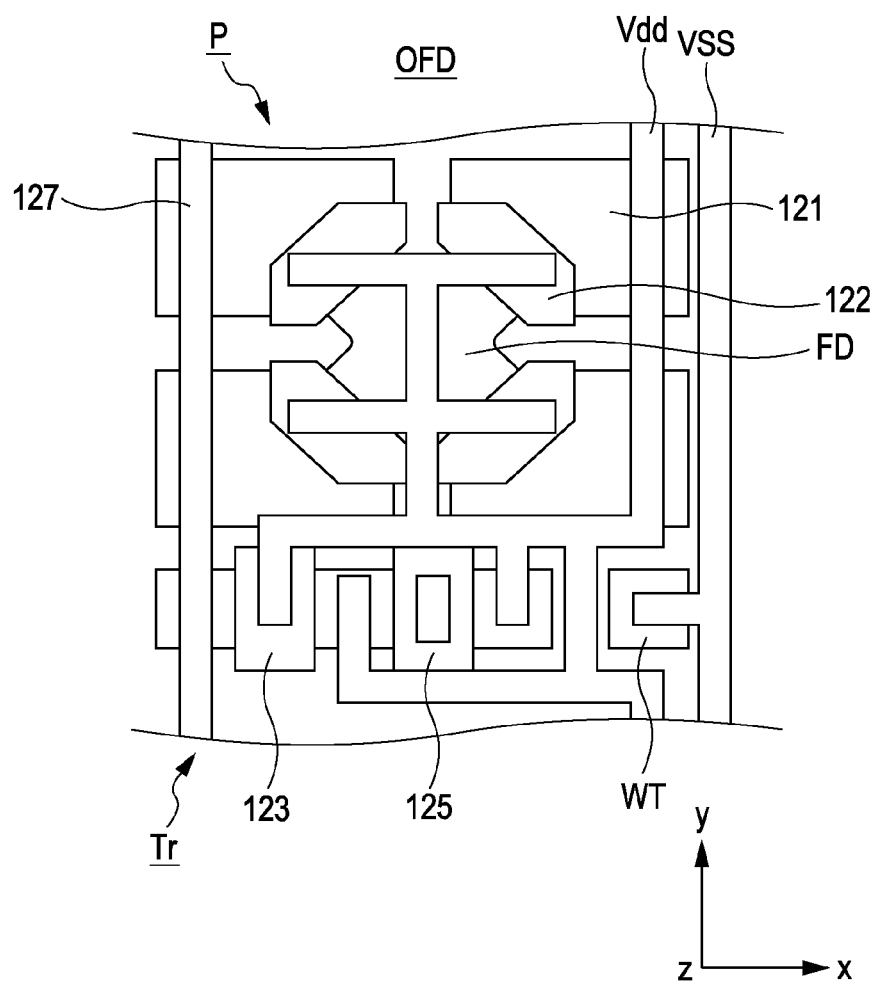
FIG. 61 is a diagram illustrating a main part of a solid-state imaging device according to embodiment 8 of the present invention.
Figure 62:
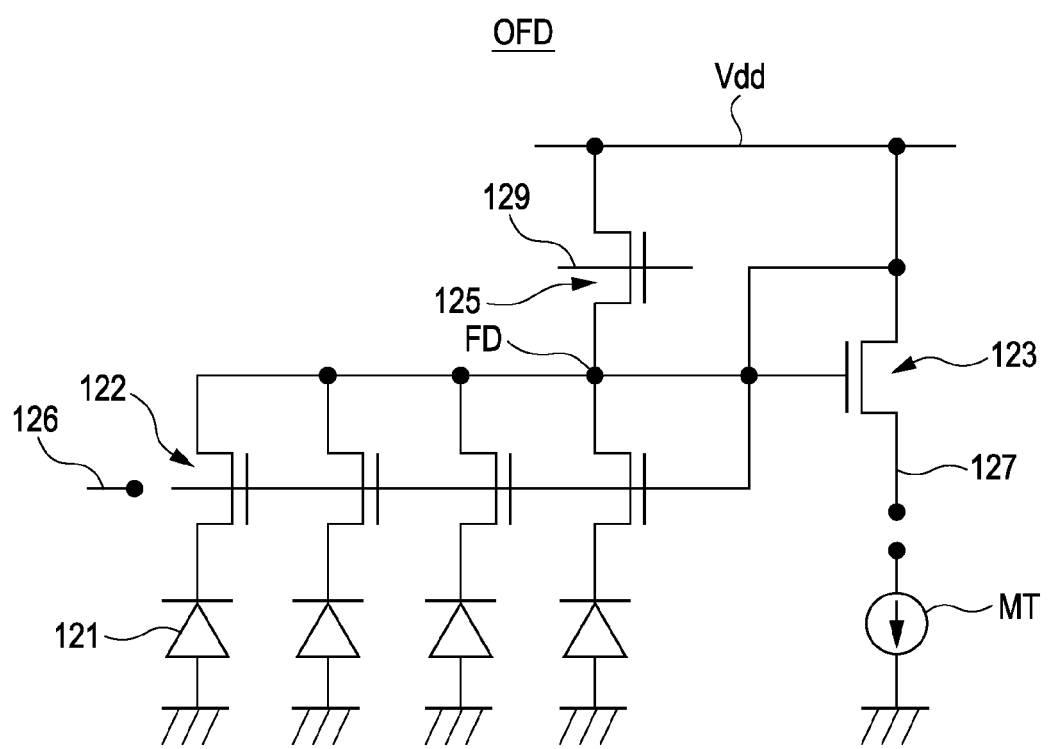
FIG. 62 is a diagram illustrating a main part of a solid-state imaging device according to embodiment 8 of the present invention.

FIGS. 61 and 62 are diagrams illustrating main portions of the solid-state imaging device according to embodiment 8 of the present invention.

Here, FIG. 61, in the same manner as in FIG. 59, shows the charge discharging area OFD. Also, FIG. 62, in the same manner as in FIG. 60, shows the circuit configuration of the pixel P installed in the charge discharging area OFD.

As illustrated in FIGS. 61 and 62, in this embodiment, the configuration of the pixel P installed in the charge discharging area OFD is different from that in embodiment 7. Specifically, the connection relationship between interconnections connected to respective portions constituting the pixel transistor Tr is different from that in embodiment 7. Except for this, this embodiment is the same as embodiment 7. Accordingly, the description of duplicate portions will be omitted.

In the charge discharging area OFD, respective portions of the transmission transistor 122 are electrically connected in the same manner as in embodiment 7 as illustrated in FIGS. 61 and 62. That is, as illustrated in FIG. 62, the gate of the transmission transistor 122 is electrically connected to the power potential supply line Vdd. Also, the gate of the transmission transistor 122 and the transmission line 126 are disconnected from each other, and thus are not electrically connected.

In the charge discharging area OFD, as illustrated in FIGS. 61 and 62, the electrical connection relationship between respective portions of the amplification transistor 123 is different from that in embodiment 7. Specifically, as illustrated in FIG. 62, the gate of the amplification transistor 123 is electrically connected to the power potential supply line Vdd. Further, as illustrated in FIG. 62, the vertical signal line 127 connected to the amplification transistor 123 is not electrically connected between the load MOS transistor MT.

As illustrated in FIGS. 61 and 62, the electrical connection relationship between respective portions of the reset transistor 125 is different from that in embodiment 7. Specifically, the reset transistor is installed to have the same connection relationship with another effective pixel area IMG and optical black area OPB.

By performing the same operation as in embodiment 6 in the charge discharging area OFD, the excessive charges leaking from the bulk can be compulsively discharged from the respective pixels P to the outside.

(C) Summary

As described above, in this embodiment, in the same manner as other embodiments, the charge discharging area OFD is installed between the effective pixel area IMG and the optical black area OPB. Also, in the charge discharging area OFD, charge discharging pixels that discharge the signal charges leaking from the effective pixel area IMG are arranged as the light shielding pixels.

In this embodiment, although the transmission transistors 122 are installed one by one with respect to the photodiodes 121, other transistors 123, 124, and 125 are installed one by one with respect to one set composed of four photodiodes 121.

Accordingly, even in a minute pixel having a plurality of shared pixels, the reference signal of the black level is prevented from being changed due to the leakage of the excessive charges in the bulk into the optical black area OPB.

Accordingly, in this embodiment, the image quality of the captured image can be improved.

9. Modifications

The present invention is not limited to the embodiments as described above, but diverse modifications can be adopted.

(9-1. Modification 1)

In the embodiments 1 to 4 as described above, it has been described that the compulsory discharge of the excessive charges is performed by making the selection transistor 124 in the charge discharging area OFD in an on state through driving of the selection transistor in the same manner as the pixel P in another area. However, the present invention is not limited thereto.

For example, a ground (GND) or greatly low potential may be made to be applied to the gate of the selection transistor 124 in the area. In this case, since the selection transistor 124 is not turned on and thus a channel is not formed, it may be possible to electrically connect the selection transistor 124 and the vertical signal line 127 to each other. That is, it is not necessary to disconnect the selection transistor and the vertical signal line 127 from each other. Accordingly, regardless of the existence/nonexistence of the charge discharging area OFD, the load of the vertical signal line 127 is not changed.

Accordingly, it is possible to make the load of the vertical signal line 127 equal regardless of the existence/nonexistence of the charge discharging area OFD, and thus the above-described advantages can be further obtained.

The signal discontinuity from a pixel around the charge discharging area OFD can be further suppressed.

(9-2. Modification 2)

In the embodiments 5 to 8 as described above, in the charge discharging area OFD, the read drain FD and the gate of the amplification transistor 123 are electrically connected together. However, the present invention is not limited thereto.

Here, the read drain FD and the gate of the amplification transistor 123 are separated from each other, and for example, a ground (GND) or greatly low potential may be applied thereto. In this case, since the amplification transistor 123 is not in an on state and thus a channel is not formed, it is possible to electrically connect the amplification transistor 123 and the vertical signal line 127 to each other. That is, it is not necessary to disconnect the amplification transistor 123 and the vertical signal line 127 from each other.

Accordingly, it is possible to further lower the layout difference between the effective pixel area IMG.

Accordingly, the same advantage as that in the modified example 1 can be obtained.

(9-3. Modification 3)

In the embodiments 1 to 8 as described above, it has been described that the compulsory discharge of the excessive discharges is performed by making the transmission transistor in an on state by applying a power supply voltage Vdd to the gate of the transmission transistor 122 in the charge discharging area OFD. However, the present invention is not limited thereto.

For example, the transmission transistor 122 may be configured to function as a depletion transistor, and thus when the gate voltage is not applied, a channel exist and a drain current flows. Accordingly, it may be possible to lower the layout difference between the effective pixel area IMG.

Accordingly, the same advantages as in Modifications 1 can be obtained.

Further, for example, by directly applying the power supply voltage Vdd to the photodiode, the compulsory discharge of the excessive charges becomes possible.

(9-4. Others)

Although "the rear surface illumination type" has been described in the above-described embodiments, the present invention is not limited thereto. In the case of the "surface illumination type", it is also applicable. That is, pixel transistors may be formed on the surface side of the semiconductor substrate, and on the corresponding surface side, the incident light may be incident to the light sensing surfaces of the effective pixels. In particular, in the "surface illumination type", if the p-type substrate is used when a negative charge (electron) is processed, or if the n-type substrate is used when the positive charge (hole) is processed, the substrate does not function as overflow drain.

That is, in this case, in the semiconductor substrate, an impurity area that functions as an overflow drain has not been installed on the back surface that is opposite to the position where the photodiode is installed. In this case, by applying the present invention, the problem occurrence caused by this can be effectively prevented.

At this time, in the above described embodiment, the solid-state imaging device 101 corresponds to the solid-state imaging device according to the present invention. Also, in the above-described embodiment, the photodiode 121 corresponds to the photoelectric conversion unit according to the present invention. Also, in the above-described embodiment, the amplification transistor 123 corresponds to the amplification transistor according to the present invention. Also, in the above-described embodiment, the transmission transistor 122 corresponds to the transmission transistor according to the present invention. Also, in the above-described embodiment, the selection transistor 124 corresponds to the selection transistor according to the present invention. Also, in the above-described embodiment, the reset transistor 125 corresponds to the reset transistor according to the present invention. Also, in the above-described embodiment, the vertical signal line 127 corresponds to the signal line according to the present invention. Also, in the above-described embodiment, the camera 140 corresponds to the electronic device according to the present invention. Also, in the above-described embodiment, the substrate 1101 corresponds to the semiconductor substrate according to the present invention. Also, in the above-described embodiment, the light shielding area BL corresponds to the light shielding area according to the present invention. Also, in the above-described embodiment, the read drain FD corresponds to the floating diffusion according to the present invention. Also, in the above-described embodiment, the effective pixel area IMG corresponds to the effective pixel area according to the present invention. Also, in the above-described embodiment, the light sensing surface JS corresponds to the light sensing surface according to the present invention. Also, in the above-described embodiment, the charge discharging area OFD corresponds to the charge discharging area according to the present invention. Also, in the above-described embodiment, the optical black area OPB corresponds to the optical black area according to the present invention. Also, in the above-described embodiment, the pixel P corresponds to the pixel according to the present invention. Also, in the above-described embodiment, the pixel area PA corresponds to the pixel area according to the present invention. Also, in the above-described embodiment, pixel transistor Tr corresponds to the pixel transistor according to the present invention.

It should be understood by those skilled in the art that various modifications, combinations, sub-combinations and alterations may occur depending on design requirements and other factors insofar as they are within the scope of the appended claims or the equivalents thereof.

What is claimed is:

1. A solid-state imaging device, comprising:
a pixel area including a plurality of photoelectric conversion units in a semiconductor substrate; and
a plurality of pixel transistors disposed in the semiconductor substrate, one of the plurality of pixel transistors coupled to at least one of the plurality of photoelectric conversion units in the semiconductor substrate;
wherein the pixel area includes an effective pixel area including an effective pixel having a light sensing surface, and a light-shielding area disposed adjacent to the effective pixel area and including a light-shielding pixel having a light-shielding unit;
wherein the light-shielding area further includes a charge discharging area including a charge discharging pixel that discharges an excessive charge leaking from the effective pixel area, and an optical black area including an optical black pixel, wherein at least one of the plurality of the pixel transistors outputs a signal based on a charge generated by one of the plurality of the photoelectric conversion units as a reference signal of a black level,
wherein the charge discharging area is disposed between the effective pixel area and the optical black area,
wherein the plurality of the pixel transistors in the charge discharging area comprise a transfer transistor and a reset transistor, and a gate of the reset transistor is electrically connected to a power supply line such that the transfer transistor and the reset transistor are turned on.

2. The solid-state imaging device according to claim 1, wherein the charge discharging pixel, the optical black pixel, and the effective pixel are in a same conductivity type well on the semiconductor substrate.

3. The solid-state imaging device according to claim 2, wherein charge discharging area pixel transistors include the transfer transistor, an amplification transistor, a selection transistor, and the reset transistor;
wherein in the charge discharging area, a gate of the transfer transistor is not electrically connected to a transmission line carrying a transmitted signal;
wherein the gate of the reset transistor is not electrically connected to a reset line carrying a reset signal; and wherein a signal line on which the signal is output is not electrically connected to a semiconductor device in which the signal is output from the signal line.

4. The solid-state imaging device according to claim 3, wherein transfer transistors of the charge discharging area pixel transistors are installed one by one with respect to each of the photoelectric conversion units; and wherein the amplification transistor, the selection transistor, and the reset transistor are installed one by one with respect to a set that includes multiple photoelectric conversion units of the plurality of photoelectric conversion units.

5. The solid-state imaging device according to claim 2, wherein charge discharging area pixel transistors include the transfer transistor, an amplification transistor, a selection transistor, and the reset transistor; and
   wherein the transfer transistor and the reset transistor form a channel, and the selection transistor operates in a same manner as the effective pixel and the optical black pixel.

6. The solid-state imaging device according to claim 5, wherein transfer transistors of the plurality of pixel transistors are installed one by one with respect to each of the photoelectric conversion units; and wherein the amplification transistor, the selection transistor, and the reset transistor are installed one by one with respect to a set that includes multiple photoelectric conversion units of the plurality of photoelectric conversion units.

7. The solid-state imaging device according to claim 2, wherein the pixel transistors include the transfer transistor, an amplification transistor, and the reset transistor;
   wherein in the charge discharging area, a gate of the transfer transistor is not electrically connected to a transmission line carrying a transmitted signal;
   wherein the gate of the reset transistor is not electrically connected to a reset line carrying a reset signal; and
   wherein a signal line on which the signal is output is not electrically connected to a semiconductor device in which the signal is output from the signal line.

8. The solid-state imaging device according to claim 7, wherein transfer transistors of the pixel transistors are installed one by one with respect to each of the photoelectric conversion units, and the amplification transistor and the reset transistor are installed one by one with respect to a set that includes multiple photoelectric conversion units of the plurality of photoelectric conversion units.

9. The solid-state imaging device according to claim 2, wherein the pixel transistors include the transfer transistor, an amplification transistor, a selection transistor, and the reset transistor;
   wherein in the charge discharging area, a gate of the transfer transistor is not electrically connected to a transmission line carrying a transmitted signal;
   wherein the transfer transistor and the reset transistor form a channel, and the selection transistor operates in a same manner as the effective pixel and the optical black pixel; and
   wherein a signal line on which the signal is output is not electrically connected to a semiconductor device in which the signal is output from the signal line.

10. An electronic device, comprising:
   a pixel area including a plurality of photoelectric conversion units in a semiconductor substrate; and
   a plurality of pixel transistors disposed in the semiconductor substrate, one of the plurality of pixel transistors coupled to at least one of the plurality of photoelectric conversion units in the semiconductor substrate;
   wherein the pixel area includes an effective pixel area including an effective pixel having a light sensing surface, and a light-shielding area disposed adjacent to the effective pixel area and including a light-shielding pixel having a light-shielding unit;
   wherein the light-shielding area further includes a charge discharging area including a charge discharging pixel that discharges an excessive charge leaking from the effective pixel area, and an optical black area including an optical black pixel, wherein at least one of the plurality of the pixel transistors outputs a signal based on a charge generated by one of the plurality of the photoelectric conversion units as a reference signal of a black level,
   wherein the charge discharging area is disposed between the effective pixel area and the optical black area,
   wherein the plurality of the pixel transistors in the charge discharging area comprise a transfer transistor and a reset transistor, and a gate of the reset transistor is electrically connected to a power supply line such that the transfer transistor and the reset transistor are turned on.

11. The electronic device according to claim 10, wherein the charge discharging pixel, the optical black pixel, and the effective pixel are in a same conductivity type well on the semiconductor substrate.

12. The electronic device according to claim 11, wherein charge discharging area pixel transistors include the transfer transistor, an amplification transistor, a selection transistor, and the reset transistor;
   wherein in the charge discharging area, a gate of the transfer transistor is not electrically connected to a transmission line carrying a transmitted signal;
   wherein the gate of the reset transistor is not electrically connected to a reset line carrying a reset signal; and
   wherein a signal line on which the signal is output is not electrically connected to a semiconductor device in which the signal is output from the signal line.

13. The electronic device according to claim 12, wherein transfer transistors of the charge discharging area pixel transistors are installed one by one with respect to each of the photoelectric conversion units; and wherein the amplification transistor, the selection transistor, and the reset transistor are installed one by one with respect to a set that includes multiple photoelectric conversion units of the plurality of photoelectric conversion units.

14. The electronic device according to claim 11, wherein charge discharging area pixel transistors include the transfer transistor, an amplification transistor, a selection transistor, and the reset transistor; and
   wherein the transfer transistor and the reset transistor form a channel, and the selection transistor operates in a same manner as the effective pixel and the optical black pixel.

15. The electronic device according to claim 14, wherein transfer transistors of the plurality of pixel transistors are installed one by one with respect to each of the photoelectric conversion units; and the amplification transistor, the selection transistor, and the reset transistor are installed one by one with respect to a set that includes multiple photoelectric conversion units of the plurality of photoelectric conversion units.

16. The electronic device according to claim 11, wherein the pixel transistors include the transfer transistor, an amplification transistor, and the reset transistor;

wherein in the charge discharging area, a gate of the transfer transistor is not electrically connected to a transmission line carrying a transmitted signal;

wherein the gate of the reset transistor is not electrically connected to a reset line carrying a reset signal; and wherein a signal line on which the signal is output is not electrically connected to a semiconductor device in which the signal is output from the signal line.

17. The electronic device according to claim 16, wherein transfer transistors of the pixel transistors are installed one by one with respect to each of the photoelectric conversion units, and the amplification transistor and the reset transistor are installed one by one with respect to a set that includes multiple photoelectric conversion units of photoelectric conversion units.

18. The electronic device according to claim 11, wherein the pixel transistors include the transfer transistor, an amplification transistor, a selection transistor, and the reset transistor;

wherein in the charge discharging area, a gate of the transfer transistor is not electrically connected to a transmission line carrying a transmitted signal;

wherein the transfer transistor and the reset transistor form a channel, and the selection transistor operates in a same manner as the effective pixel and the optical black pixel; and wherein a signal line on which the signal is output is not electrically connected to a semiconductor device in which the signal is output from the signal line.

19. A method, comprising:

forming a pixel area including a plurality of photoelectric conversion units in a semiconductor substrate; and forming a plurality of pixel transistors disposed in the semiconductor substrate, one of the plurality of pixel transistors coupled to at least one of the plurality of photoelectric conversion units in the semiconductor substrate;

wherein the pixel area includes an effective pixel area including an effective pixel having a light sensing surface, and a light-shielding area disposed adjacent to the effective pixel area and including a light-shielding pixel having a light-shielding unit;

wherein the light-shielding area further includes a charge discharging area including a charge discharging pixel that discharges an excessive charge leaking from the effective pixel area, and an optical black area including an optical black pixel, wherein at least one of the plurality of the pixel transistors outputs a signal based on a charge generated by one of the plurality of the photoelectric conversion units as a reference signal of a black level, wherein the charge discharging area is disposed between the effective pixel area and the optical black area, wherein the plurality of the pixel transistors in the charge discharging area comprise a transfer transistor and a reset transistor, and a gate of the reset transistor is electrically connected to a power supply line such that the transfer transistor and the reset transistor are turned on.

20. The method according to claim 19, further comprising forming the charge discharging pixel, the optical black pixel, and the effective pixel in a same conductivity type well on the semiconductor substrate.

* * * * *